United States Patent [19]

Berlekamp

[11] 4,162,480

[45] Jul. 24, 1979

[54] GALOIS FIELD COMPUTER

[75] Inventor: Elwyn R. Berlekamp, Berkeley, Calif.

[73] Assignee: Cyclotomics, Inc., Berkeley, Calif.

[21] Appl. No.: 763,513

[22] Filed: Jan. 28, 1977

[51] Int. Cl.[2] .................. G06F 11/12

[52] U.S. Cl. .................. 340/146.1 AL; 364/200

[58] Field of Search .................. 340/146.1 AL; 364/200, 364/900, 757, 717; 365/239, 240

[56] References Cited

U.S. PATENT DOCUMENTS

| | | | |
|---|---|---|---|
| 3,533,067 | 10/1970 | Zierler et al. | 340/146.1 AL |
| 3,648,236 | 3/1972 | Burton | 340/146.1 AL |
| 3,771,126 | 11/1973 | Apple, Jr. | 340/146.1 AL |
| 3,781,791 | 12/1973 | Sullivan | 340/146.1 AL |
| 3,818,442 | 6/1974 | Solomon | 340/146.1 AL |
| 3,930,239 | 12/1975 | Salters et al. | 365/240 |
| 3,949,380 | 4/1976 | Barbour et al. | 364/200 |
| 3,996,565 | 12/1976 | Nakao et al. | 324/200 |
| 4,037,093 | 7/1977 | Gregg et al. | 364/757 |

*Primary Examiner*—Charles E. Atkinson
*Attorney, Agent, or Firm*—Edward H. Berkowitz

[57] ABSTRACT

Errors are corrected in a cyclic encoded data stream, consisting of sequential groups of data bits and check bits, by means of a novel digital computer. The computer employs a stored program and is organized into three distinct substructures, each having an independent internal addressable memory and all capable of synchronous concurrent operation. An arithmetic unit substructure including a data memory implements finite field arithmetic operations upon received data.

The arithmetic unit includes a Galois field manipulative subunit for producing finite field products and sums over the field $GF(2^5)$ from operands selected from three registers which derive data from the memory of the arithmetic unit, another register, or the result of a currently executed Galois field operation. The preferred embodiment is especially suitable for correcting data encoded in the Reed-Solomon (31,15) code.

An address generator realizes address modification in the Galois field $GF(2^7)$, whereby consecutive addresses in data memory are characterized by a shift register sequence. The address generator includes a counter memory array and an equality test facility. Counter memory words of the address generator may selectably retain either the modified or non-modified address. A control unit substructure includes a control memory for storage and execution of the instruction sequence, branching logic for determining the transfer of control in response to logical functions of up to 16 logical variables, and select means and gating means for execution of instructions in all three substructures. Provision for data dependent arithmetic function selection, not employed for decoding the (31,15) Reed Solomon Code, permits the operation of the apparatus to yield solutions at high speed to simultaneous linear binary equations.

17 Claims, 16 Drawing Figures

GALOIS FIELD COMPUTER

FIELD OF THE INVENTION

This invention relates to apparatus for correcting multiple errors in cyclic encoded data streams composed of sequential sets of data bits followed by respective sets of encoded check bits.

BACKGROUND OF THE INVENTION

Information transmitted over a communication channel is generally received as a combination of the original information and a noise component. Integrity of the information content is substantially entirely preserved when the signal to noise ratio of the system is large. Accordingly, refinements in design and realization of the appropriate hardware can increase the probability or error-free transmission, theoretically, up to the limits imposed by the channel itself. In order to minimize the effect of intrinsic channel limitations, various techniques are employed which ultimately require a compromise between bandwidth and information transfer rate. Various limitations imposed on the channel bandwidth, information rate, and the degree of complexity of receiving and transmitting apparatus contribute to a probable error rate.

Although redundancy is a common element among these techniques, mere repetition exacts a heavy penalty in transmission rate. For example, a single repetition reduces the information rate 50% and a second repetition (to implement majority logic) reduces the information rate by 61⅓%. Other means for insuring message integrity have employed sophisticated coding techniques which permit the detection, location, and correction of errors. Among the desiderata of these coding techniques are high information rate and a capability of correcting multiple errors within any given codeword of transmitted data.

In this context a codeword results from encoding operations performed upon the elements of the original data comprising k bits to yield an encoded word ("codeword") of information having k information bits and r check bits. The encoded redundancy in the form of r check bits is then available during the decoding operations to detect and correct errors in the codeword (including all k+r bits) up to some limit or merely to detect errors up to some larger limit.

Many such codes, having distinct mathematical properties, have been studied and mathematically efficient decoding procedures have been devised, but reduction to practice with concomitant efficiency requires a special purpose computer. For example, certain classes of codes are founded on association of each information element of a codeword with an element of a Galois field.

Very briefly, the Galois field is a finite field, the elements of which may be represented as polynomials in a particular primitive field element, with coefficients in the prime subfield. The locations of errors and the true value of the erroneous information elements are determined after constructing certain polynomials defined on the Galois field and finding the roots of these polynomials. A decoder is therefore required which has the capability of performing Galois field arithmetic.

Of the error correcting codes, a particular class of such codes, separately described by Bose, Chaudhuri and Hocquenhem (thus "BCH" codes), are capable of multiple error correction. A special case of such codes are the Reed-Solomon (RS) Codes with respect to which the present invention will be described.

One approach to the problem of sufficiently high speed error correction of BCH encoded data was described in terms of an algorithm published in my text "Algebraic Coding Theory" (McGraw-Hill, 1968). Prior art employment of the aforesaid algorithm has utilized in one instance a general purpose digital computer controlling an essentially peripheral arithmetic unit implementing Galois field manipulation. Certain prior art arithmetic units have used large stored tables to implement inversions appearing in decoding procedures.

Other prior art Galois field arithmetic units employ iterative multiplications for inversions, thereby avoiding heavy penalties in hardware and calculation time, which are associated with division operations. Finite field multiplication manipulation can lead to inversion because in a Galois field, as for example, the field $GF(2^5)$, $$beta^{31}=beta^0=1.$$

Consequently $$beta^{30}=beta^{-1}$$

Thus, given a quantity beta, a straightforward prior art method of obtaining its inverse, $beta^{-1}$ is defined by performing $2^m-2$ (here 30) repetitions of a Galois field multiplication upon the Galois field representation of beta in the Galois field GF $(2^m)$.

Prior art computers have conventionally employed memory addressing techniques based on an arithmetically sequential organization of information. Addressing is physically implemented by developing an effective address which may be the result of conventional arithmetic operations. Address modification is conventionally effected in hardware which performs an addition or decremention of a base address. Consequently, circuitry implementing this conventional form of address modification incorporates adder circuits to arithmetically increment or decrement an address with a resulting delay for signal propagation corresponding to the arithmetic carry operation between adjacent bit positions of a working register wherein the result is developed.

OBJECTS OF THE INVENTION

Accordingly, one principal object of the invention is provision of a novel computer for implementing Galois field arithmetic and algebra. The computer has fewer components, fewer data paths, and higher speed than a general purpose digital computer employed for this purpose.

It is a feature of this invention to divide the structure of the invention intor three distinct sub-structures and to allocate operations such that arithmetic operations upon data are implemented in an arithmetic unit substructure, memory addressing for such arithmetric unit being separately effected in an address generator substructure, and each said substructure is controlled by a control unit substructure, whereby said substructures are capable of synchronous concurrent operation.

It is also a feature of this invention to provde addressable memories within each of the aforementioned substructures, each of which addressable memories is specialized to the purpose of the respective substructure wherein said memory is situated.

It is also a feature of the invention to provide means for addressing an array of memory elements according to a shift register sequence whereby address arithmetic may be implemented without incurring penalties in propagation delays and additional circuit components.

It is also a feature of the present invention to provide apparatus for implementing Galois field arithmetic operations, including means to more efficiently perform the divisionless inversion of a quantity to obtain its reciprocal.

It is again a feature of the present invention to provide a Galois field arithmetic unit having a register which may be selectively reset to the square of the current content of said register or which said register may be reset to the product of the current content of said register with the quantity alpha, where alpha is a root of the primitive factor of the Galois field.

Another feature of the invention is the provision of a programmed sequence of instructions whereby said computer, having the features above set forth, is operable to correct any combination of 2t erasures and s errors, in a RS (31,15) codeword, such that $(2t+s)\leqq 16$, wherein said codeword comprises digital data encoded in the Reed-Solomon (31,16) code.

It is again a further feature to provide means for said arithmetic unit to alter the definition of the function to be executed by said Galois field arithmetic unit in response to the content of a register, wherein the register content is an independent variable upon which said function operates.

Another feature of the invention is the provision of a sequence of control of said computer whereby said computer having the features above set forth is capable of solving two, three, four or five simultaneous linear binary equations among respectively, two, three, four or five variables.

DETAILED DESCRIPTION OF THE PREFERRED EMBODIMENT

Figure 1:
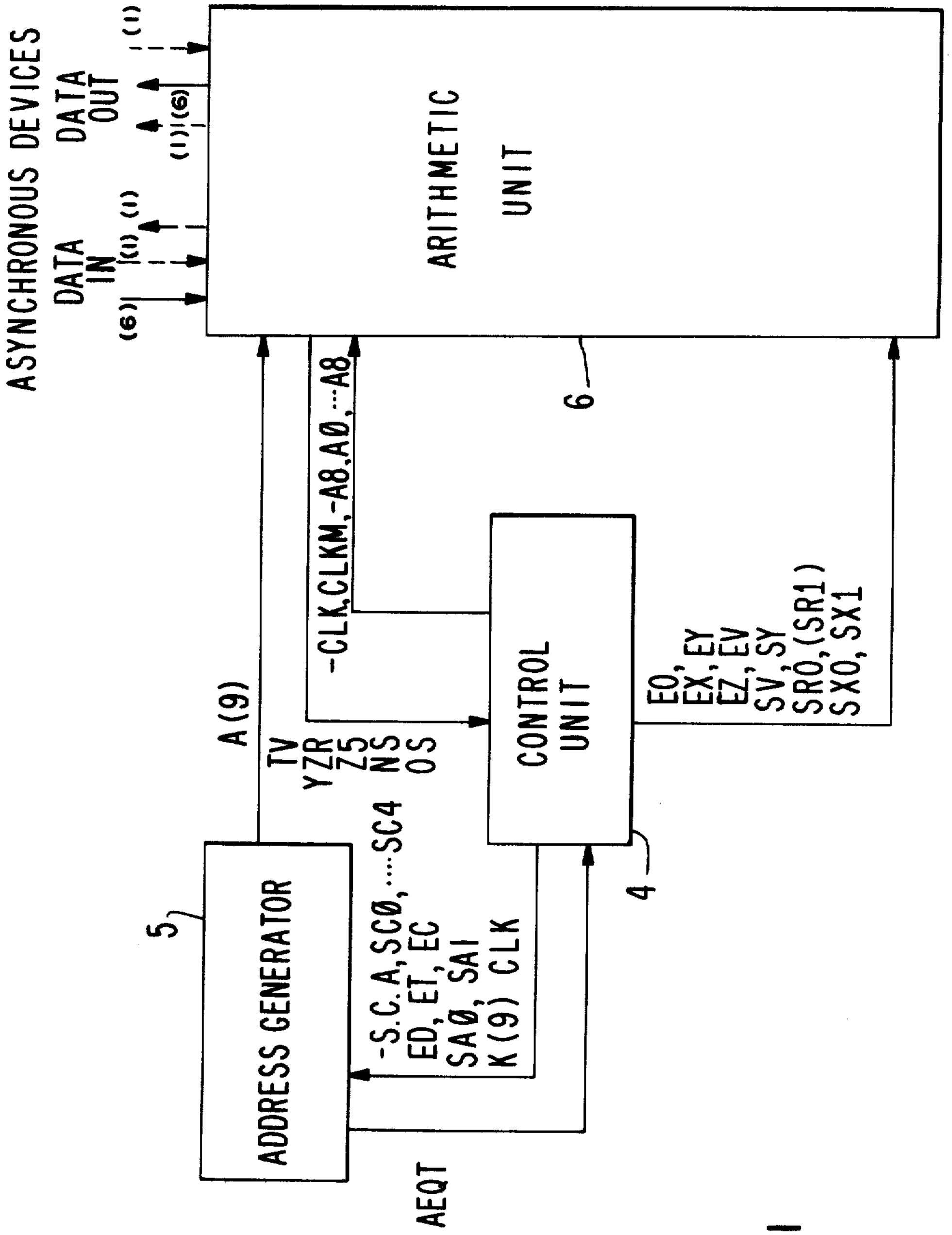
FIG. 1 is a block diagram of apparatus organized according to a preferred aspect of the invention.

The discussion of apparatus is gest prefaced by a review of the salient aspects of coding theory, applicable to nonbinary BCH codes in general and to RS codes in particular. As a general reference, my text cited above, "Algebraic Coding Theory", (hereafter, Berlekamp, 1968) is recommended. In a binary realization, such a code may be regarded as having three principal positive integer parameters, n, m, and t, where n is the total length in m-bit characters of a word of encoded information and $n=2^m-1$ and t is the error correcting capability of the code. Assuming no more than mt redundant characters or check characters such a codeword is capable of providing sufficient informational redundancy to detect and correct any set of less than t independent errors and erasures within the codeword of encoded information, or to detect (without correction) any set of 2t independent errors and erasures. An erasure may be defined as an error of known location within the received codeword.

The properties of an algebraic finite field may be summarized briefly. For the purposes of the present invention, a field may be informally defined as a set of elements including the null element, 0, and the unit element, 1, upon which are defined operations of addition, multiplication and division. Addition and multiplication are associative and commutative and multiplication is distributive with respect to addition. Every element of the field has a unique negative such that the negative of a given element summed with that given element itself yields the null or 0. Further, evey nonzero element has a unique reciprocal such that the product of such an element with its reciprocal yields the unit element, 1. The elements comprising the field may be considered symbolic representations of binary or ternary or q-ary numbers. The description of the invention will be understood best in terms of a field of characteristic two.

The general finite field is called the Galois field and is specified by two parameters; a prime p, and an integer m, whereby GF $(p^m)$ describes a unique finite field (the Galois field of order $p^m$) having $p^m$ elements. In such a field all operations between elements comprising the field yield results which are again elements of the field. For example, the operation of addition carried out an elements of the finite field is defined, modulo 2, according to relations which do not admit of a "carry". Thus, the binary addition tables are: $0+1=1+0=1$ and $0+0=1+1=0$. Arithmetically, this is a "carry-less" addition, sometimes referred to as half addition and more commonly denoted as the exclusive-or (XOR). It is apparent that absence of a carry thereby limits the magnitude of the resulting sum to the finite field.

The mathematical basis of Reed-Solomon codes and decoding thereof, as discussed in greater detail in Chapter 10 of *Algebraic Coding Theory* is as follows:

Let $\alpha$ be a primitive element in $GF(2^m)$. The code's generator polynomial is defined by $$g(x) = \prod_{i=1}^{d-1} (x - \alpha^i) \quad \text{Equ. 1}$$

where d is the code's designed distance.

The block length of the Reed-Solomon code is $n=2^m-1$. The codewords consist of all polynomials of degrees$<$n which are multiples of g(x).

Let C(x) be the transmitted codeword, $$C(x) = \sum_{i=0}^{n-1} C_i x^i .$$

If the channel noise adds to this codeword the error pattern $$E(x) = \sum_{i=0}^{n-1} E_i x^i ,$$

then the received word is $$R(x) = \sum_{i=0}^{n-1} R_i x^i = C(x) + E(x) . \quad \text{Equ. 2}$$

The syndrome characters are defined by $$S_i = E(\alpha^i) \quad \text{Equ. 3}$$

Since C(x) is a multiple of g(x) it follows that for i=1, 2,. . ., d−1, $C(\alpha^i)=0$, whence $$S_i = R(\alpha^i) \quad i=1, 2,\ldots d-1 \quad \text{Equ. 4}$$

The generating function of the S's may be defined by $$S(x) = \sum_{i=1}^{\infty} S_i z^i \quad \text{Equ. 5}$$

In order to correct the erros, the decoder may find the corresponding error locations and error values. If $$E(x) = \sum_{i=0}^{n-1} E_i x^i ,$$

then the jth error location may be defined as $$X_j = \alpha^{e_j}$$

where the $e_j$ are the unique integers such that $$E_0 = E_1 = \ldots = E_{e_j+1-1} = 0$$

$$E_{e_j} \neq 0$$

$$E_{e_j+1} = E_{e_j+2} = \ldots = E_{e_j+1} - 1 \neq 0$$

Erasure locations may be similarly associated with field elements and the corresponding values of errata may be defined as $$Y_j = E_{e_j}$$

To determine the unknown X's and Y's, it is useful to define these polynomials error locator polynomial $$\sigma(z) = \pi (1 - X_i z) \quad \text{Equ. 6}$$
$$X_i = \text{error locations}$$

erasure locator polynomial $$\lambda(z) = \pi (1 - X_i z) \quad \text{Equ. 7}$$
$$X_i = \text{erasure locations}$$

errata locator polynomial $$\rho(z) = \sigma(z) \cdot \lambda(z) \quad \text{Equ. 8}$$

errata evaluator polynomial $$\omega(z) = \sum_{\text{errata}} z X_i Y_i \prod_{j \neq i} (1 - X_j z) \quad \text{Equ. 9}$$

To find the X's and Y'x the decoder first multiplies S(z) by λ(z) to obtain the *modified syndrome generating function*

$$T(z) = S(z) \cdot \lambda(z) \quad \text{Equ. 10}$$

The unknown errata evaluator polynomial and the unknown error locator polynomial are related by the *key equation,*

$$T(z)\ \sigma(z) \equiv \omega(z) \bmod z^d \quad \text{Equ. 11}$$

Given T(z), low-degree solutions of σ(z) and ω(z) may be found by solving this key equation using the iterative algorithm presented in *Algebraic Coding Theory,* and later described more succinctly by Sugiyama, et. al., A Method For Solving Key Equations for Decoding Gappa Codes, *Information & Control,* Vol. 27 No. 1, January 1975, pp 87–99.

After the coefficients of σ(z) are known, the decoder may evaluate the polynomials σ(1), $\sigma(\alpha^{-1})$, $\sigma(\alpha^{-2})$, $\sigma(\alpha^{-3})$, . . .

$$\sigma(\alpha^{-i}) = \sum_{j=0}^{\deg \sigma} \sigma_j \alpha^{-ij} \quad \text{Equ. 12}$$

If $\sigma(\alpha^{-i}) \neq 0$, then the received character at location $\alpha^i$ is presumed correct (unless erased). If $\sigma(\alpha^{-i})=0$ or if $\lambda(\alpha^{-i})=0$, then $\alpha^i$ is an errata location, and the received character at that position should be corrected by the value given in Eq. (10.14) of *Algebraic Coding Theory:*

$$Y_i = \frac{\omega(X_i^{-1})}{\prod_{j \neq i} (1 - X_j X_i^{-1})} \quad \text{Equ. 12}$$

Having briefly described the mathematical basis of error correction, a preferred embodiment of the present invention next follows. The ensuing description is addressed both to one skilled in the art of digital computer design and to one skilled in the art of programming. The former artisan may be specifically characterized as having familiarity with the organization of digital computers generally and with the implementation of digital logic from commercially available electronic components. The latter artisan will be familiar with programming at the level of machine dependent languages and instruction codes of microprogrammable processing units.

A. Hardware

Referring now to FIG. 1, there is illustrated an organizational diagram relating the control unit 4, address generator 5 and arithmetic unit 6. These functional units are capable of independent concurrent operations. A number of control signals and data paths are here indicated.

Figure 2:
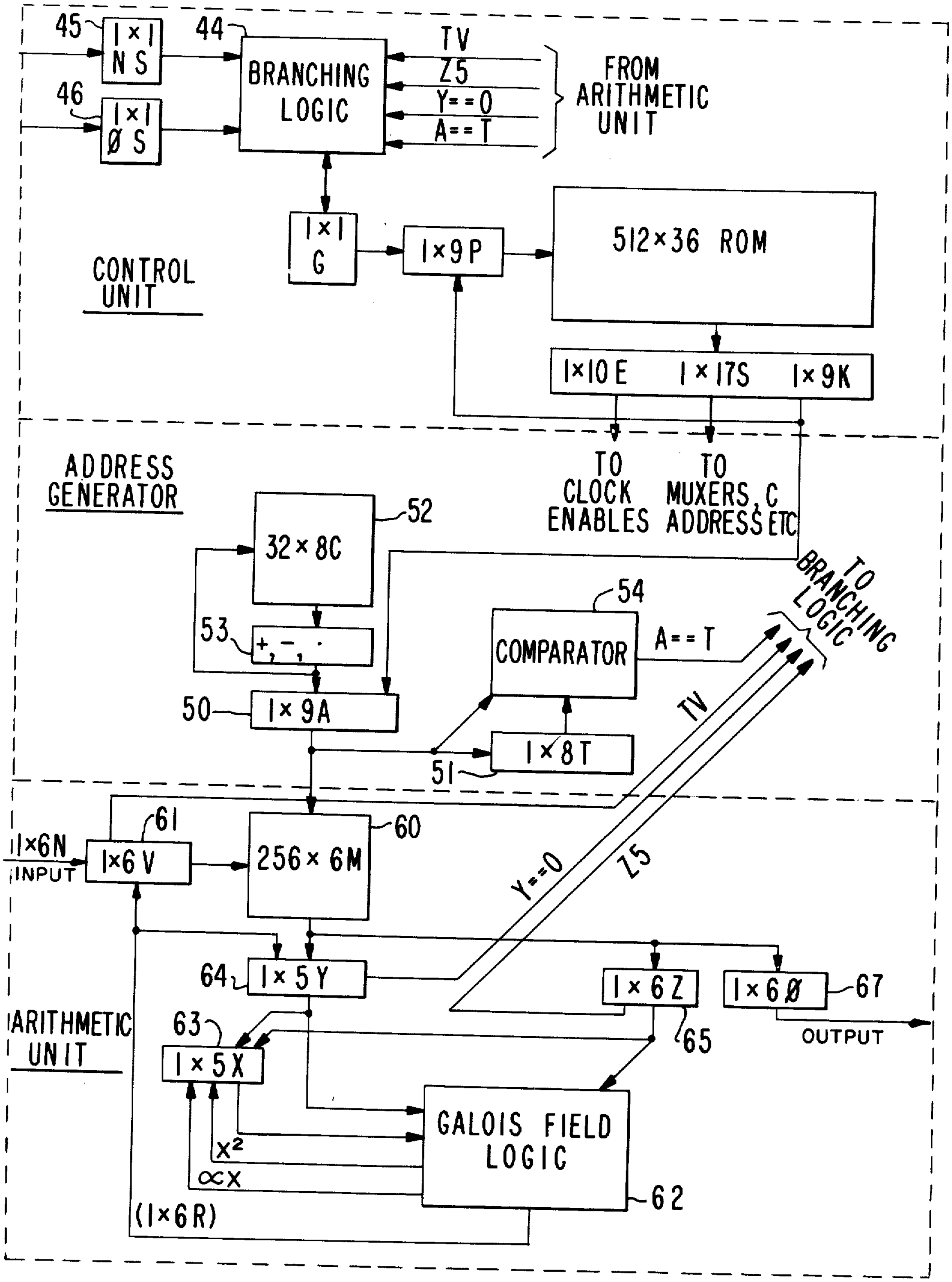
FIG. 2 is a more detailed block diagram of apparatus built according to a preferred aspect of the invention.
Figure 2A:
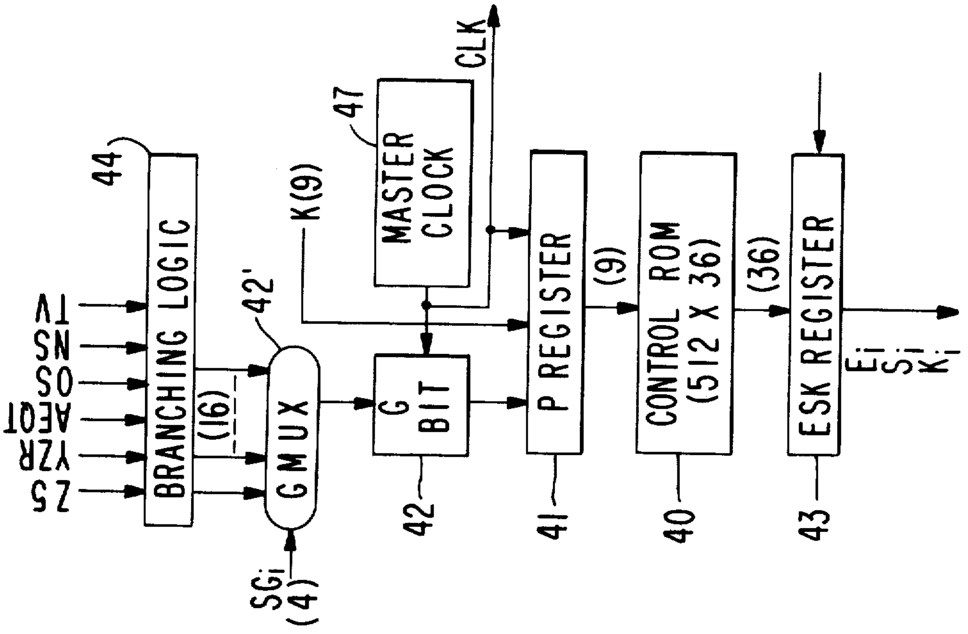
FIG. 2A is a yet more detailed block diagram of a control unit employed in such apparatus.

Turning now to FIGS. 2 and 2A, control unit 4 includes a control memory 40 of 512 words, each 36 bits in length. This control memory is advantageously realized from read only constituents (ROM). Addressing of this memory is accomplished in conventional fashion from a program counter, or P register 41, 9 bits in length, which increments, or alternatively resets the P register to a new value in accord with the value of the single bit G register 42, as further described below. The content of the word fetched from control memory 50 is transferred to the 36 bit ESK register 43.

The control unit also contains a master clock 47 providing periodic signals CLK (and -CLK) for synchronizing the operation of various components as discussed at greater length below.

Throughout this description the registers and their value or their contents will often be referenced by reciting the letter labeling the register. In order to resolve any possible ambiguity, the hardware realization of the register will be denoted by letter label and numeric descriptor. In general, however, the reader is cautioned that the identical component may be referenced by multiple labels for the convenience afforded in various sections of the specification, i.e. hardware description, program description, etc. Notational limitations are imposed by the requirements of programming languages as well as by the need of avoiding ambiguity. Thus a particular component may be referenced as "data memory", "M memory", "M", "60", and "arithmetic unit memory".

Figure 2C:
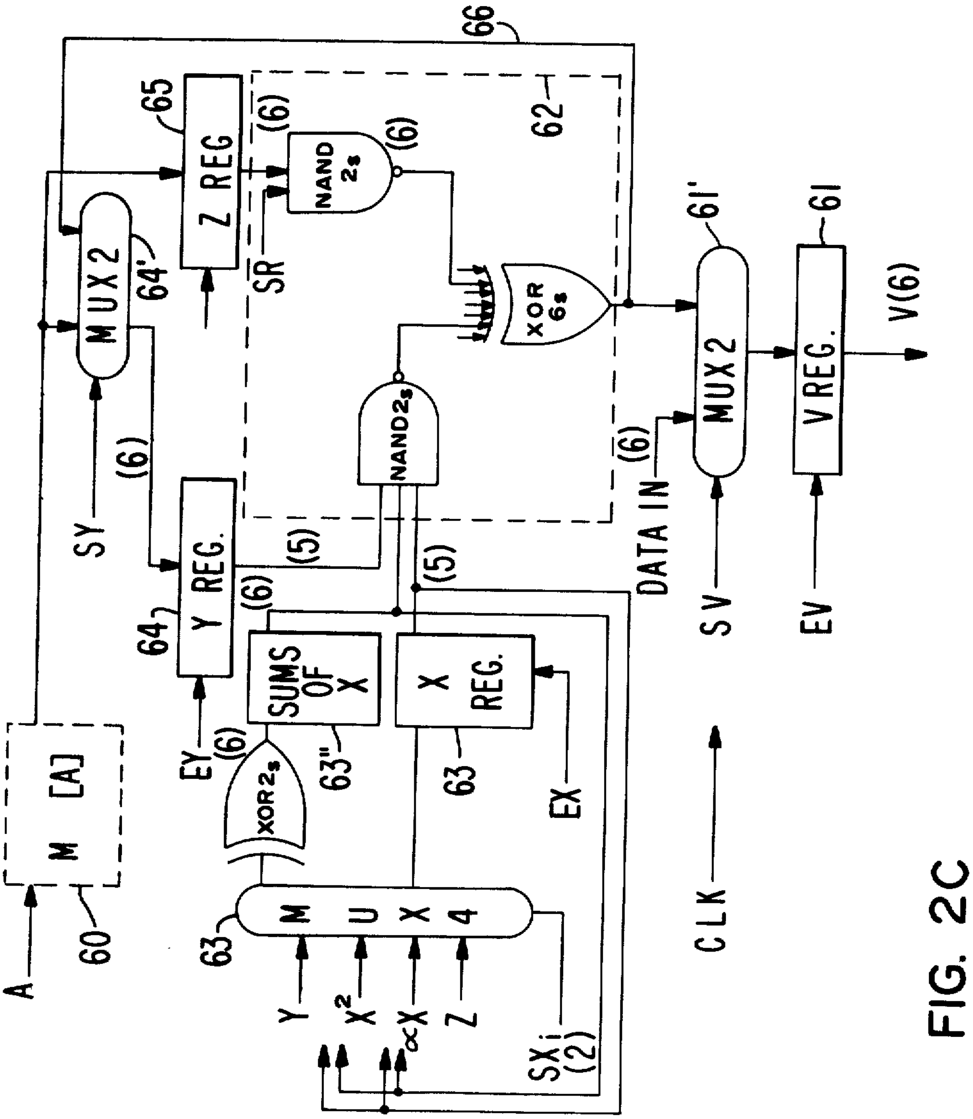
FIG. 2C is a yet more detailed block diagram of an arithmetic unit employed in such apparatus.
Figure 2B:
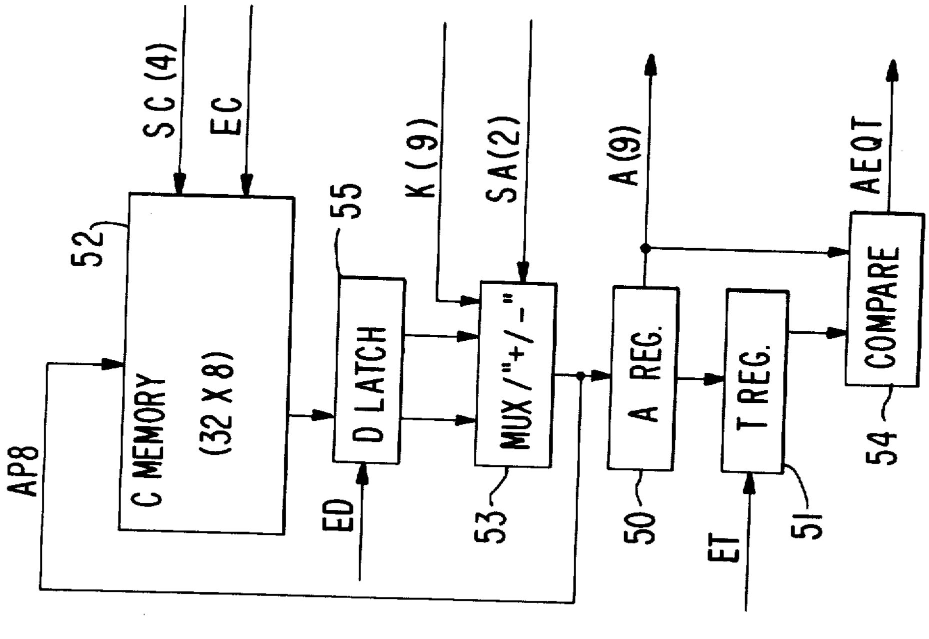
FIG. 2B is a yet more detailed block diagram of an address generator employed in such apparatus.

FIG. 2B supplements FIG. 2 for discussion of the address generator. The address generator 5 contains two principal registers: the address register 50 (or A register), 9 bits in length and the test register 51 (or T register), 8 bits in length. The output from address generator 5 includes an 8 bit number, A, residing in the 8 least significant bits of the 9 bit A register 50 and a separate single bit AEQT, which is active upon the detection of the condition of equality for the contents of A register 50 and T register 51. The principal funtion of A register 50 is to supply address information for accessing another memory located as described below in arithmetic unit 6. The address generator includes a memory 52, or C memory, realized from a set of shift register counters (hence "Counter Memory"), from which words may be fetched for loading the A register 50. The C memory 52 comprises 32 words of 8 bits each, only one of which words can be active during any single cycle of the master clock of the invention. The content of any word fetched from C memory 52 may be modified by the C-modifier 53, which can increment, decrement or leave unmodified the contents of the currently selected word of C memory 52.

Incrementation and decrementation here refer to operations carried out in the Galois field ($2^7$) on the content of a selected word of C memory 52. Accordingly, C word modifier 53 represents the combinatorial logic for implementing these operations in GF($2^7$). The truth table completely describing this logic is here deferred to follow the more complete description of functional instructions of the address generator 5. Qualitatively, incrementation may be viewed as advancing a pointer in the clockwise direction around a circular path of length $2^7-1$, and decrementation may be regarded as backing up the pointer along the same path. Thus the operations are mutually inverse and when equally applied, the status quo is restored.

Any of the above referenced modifier options may be selected for loading the A register 50. Also available is a fourth modifier option for loading A register 50 from a constant, K, generated externally to the address generator. In addition to loading the A register 50, the modified word may be rewritten into the C memory 52 during the second half of the clock cycle.

The T register 51 is selectively initialized by control unit command from the lower 8 bits of A register 50. The current value of A is compared with the value of T in comparator 54 which supplies a signal AEQT to control unit 5 to indicate either the condition of equality, A==T, or non-equality, A!=T.

Figure 3:
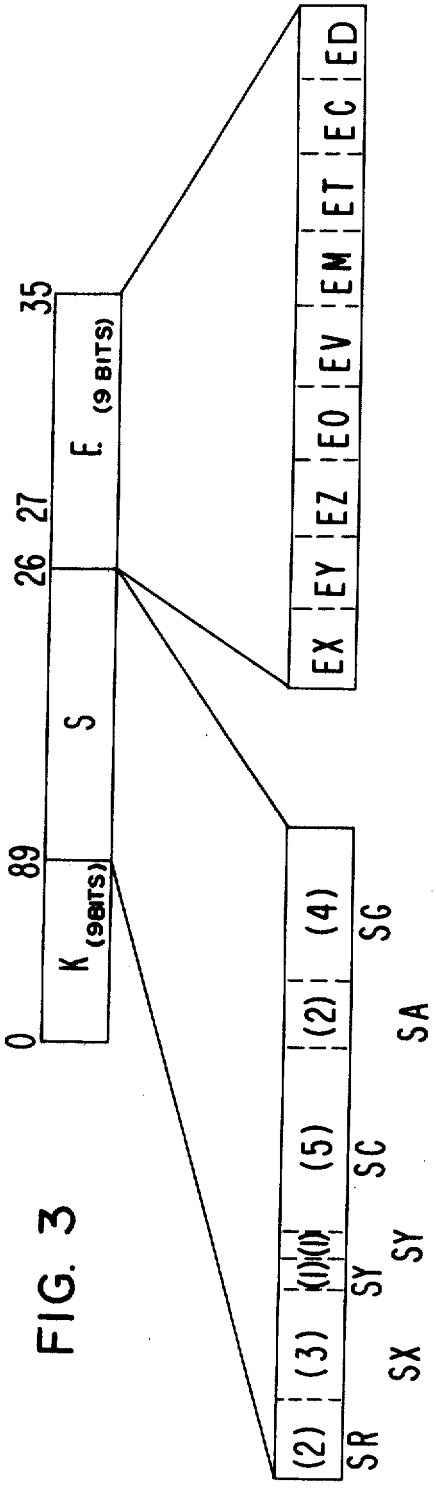
FIG. 3 is an illustration of the format of the ESK control word employed in such apparatus.

The control unit 4 is more fully described in FIG. 2A. The ESK register 43 of the control unit 4 is illustrated in FIG. 3. This latter register derives its name from the subfields of the ESK control word as further illustrated in FIG. 3: a 9 bit subfield, K, provides numeric constant information which may be employed by either of the P register 41 or the address generator 5 as hereafter described; a subfield, E, of 9 bits supplying enabling signals to the various registers and memory writing functions as hereinafter further described, and an 18 bit subfield S, further subdivided as described below for the selection of various multiplexor options, or to determine the course of branching. The allocation of functions for groups of S bits within the subfield will appear more clearly after the apparatus is more fully described.

Reference will occasionally be made to the D latch 55 which is located intermediate C memory 52 and C word modifier 53 in information flow. The D latch 55 permits rapid re-write back into C memory 52, via path AP, without propagating the information content of the selected C word, $C_j$ over an unduly long path.

Returning now to FIG. 2, and 2A, a one-bit signal G or "GOTO" bit controls the P register 41 in the following sense: at the end of the current clock cycle the P register 41 is either arithmetically incremented or alternatively reset to the value of the K subfield of the current content of ESK register 43. The value of G is determined in turn as the result of logical operations among signals effected by an aggregate of circuits denoted by branching logic 44. Any one of sixteen logical conditions may be tested during a cycle and the result of such testing loaded into the G bit at the end of that cycle (cycle i). A "true" condition for the G bit causes loading of the P register 41 from the value of the k subfield of the control word present in ESK register 43 at the end of cycle i+1. During the next cycle (cycle i+2) another word is transferred to the ESK register, such word having been pre-fetched during the prior cycle using the then current P register content to specify the address in control memory 40. In the other words, the control memory 40 is fully overlapped between the memory fetch operation and the transfer to the memory output. At the completion of cycle i+2 and concurrent initiation of cycle i+3, the content of address K, as specified during cycle i is present at the output of control memory 40 and strobed into ESK register 43. Thus, there is a deferral of two cycles between a transition of the G bit to its true state and the commencement of execution of the instruction located at the destination of the "GOTO".

FIG. 2 and 2C are referenced for discussion of arithmetic unit 6. The arithmetic unit 6 employs a random access memory 60 also called data memory, or simply M, of 256 words, each 6 bits in length. The input path to the data memory 60 proceeds through the memory driver register 61, or V register. Addressing of the data memory 60 is accomplished from the A register 50 as previously described. In addition to the addressing modes for accomplishing deposit and retrieval of information from data memory 60, bit A8 of A register 50 (the 9th bit of A) has the function of selecting an immediate address mode whereby the 6 bit constant (A5. . .A0) is available at the output bus of data memory 60, bypassing the memory itself. Thus, selected 6 bit operands may be supplied to those arithmetic registers described below which communicate with data memory 60 through the output bus of that memory.

Input to the arithmetic unit 6 from the data memory 60 output bus (M5-M0) is available as well as the result (R4-R0) of previous finite field arithmetic operations. A multiplexer 64' selects which of words M or R is to be captured by the Y register 64. This register and the Z register 65 may be selected to provide data to the combinatorial logic 62 which implements the arithmetic operations. The X register 63 drives the combinatorics as well, but gets its input not directly from the data memory 60, but from Y register 64, Z register 65 or the combinatorial logic 62. The latter includes a multiplier, which is simple a set of XOR and NAND gates, driven by X, Y, and partial sums of X contained in an extension 63'' of X register 63. Such networks are well known in the art. It also drives a summation network (adder) by which R bus 66 sums content of Z register 65 when selected. The summation outputs (R bus 66) are made available for selection by the V register 61 (which subsequently returns the result to memory) or to Y register 64.

The X register 63 is a five bit register which has a multiplexer 63' associated with it providing one of four possible input types for each X register bit. The input is selected during a cycle by control bits SX1 and SX0 (Select X) as further described. Preferred options for input to X are: Y, X*X, alpha*X, or Z, where alpha is the primitive element of GF($2^5$). The X register 63 captures the result of any cycle at the end of a cycle unless its control bit, !EX, inhibits the clocking of the X register. Sums of pairs of bits of X which are needed by the multiplier are also held in an extension of the X register 63''. These partial sums are used to generate X*X for example.

Although the Z register 65 is six bits wide, only the lower five bits drive the arithmetic unit. The signal YZR detects the all zero state of the low order five bits of Y. This condition is available for input to the G bit multiplexer 42'. A further select bit, SR, will enable the Z register input to the summer when set as described below.

The X register 63 and its extension 63' drive the NAND gate portion of the multipler network. The multiplier is preferably grouped as four sets of five NAND gates and one set of six NOR gates, each set of NAND gates enabled by a unique bit of the Y register, Y4 to Y0. The outputs of the NAND gates in turn drive a parity tree used as an XOR summation network, one tree or summer for each bit of the result bus.

At the end of a cycle, new data is strobed into every register enabled by its respective control bit. The new data propagates through the partial products, multiplier, and summer of combinational logic 62 during the following cycle and thus determines the next available data for V and Y via the R bus. Note that the Z register may selectively be included in the summation as determined by the state of the SRO control bit.

The specification of the Galois field combinatorial logic is most compactly represented by the truth table set forth in Table I below. The format of this truth table is conventional; inasmuch as the operands associated therewith are elements of GF($2^5$), the set of symbolic names of the 32 elements form an alphabet such that each element is compactly represented by a single character. The cross-definition of the symbolic character to its binary equivalent is appended in the form of the left hand vertical column of 5 bit binary characters. Thus a period denotes the all zero word. =00000. Similarly, the unit element of the field is denoted by !=00001. Alpha, the primitive element of the field is denoted by the symbol &. In this way use of the symbol "1" is avoided, because in some circumstances it might be taken to mean & and in other circumstances it might be taken to mean!. However, the elements alpha$^2$, alpha$^3$, . . . are denoted by 2,3. . . 8,9,A,B,. . . U. In other words, the 32 symbols in GF($2^5$), are represented by the character set containing the 21 letters A to U, the eight digits 2-9, and the additional characters ".", "!," and "&".

TABLE I

The Product X*Y for $GF(2^5)$

MULTIPLICATION TABLE FOR $GF(2^5)$

| | . | ! | & | 2 | 3 | 4 | 5 | 6 | 7 | 8 | 9 | A | B | C | D | E | F | G | H | I | J | K | L | M | N | O | P | Q | R | S | T | U |
|---|---|---|---|---|---|---|---|---|---|---|---|---|---|---|---|---|---|---|---|---|---|---|---|---|---|---|---|---|---|---|---|---|
| 00000 = . | . | . | . | . | . | . | . | . | . | . | . | . | . | . | . | . | . | . | . | . | . | . | . | . | . | . | . | . | . | . | . | . |
| 00001 = ! | . | ! | & | 2 | 3 | 4 | 5 | 6 | 7 | 8 | 9 | A | B | C | D | E | F | G | H | I | J | K | L | M | N | O | P | Q | R | S | T | U |
| 00010 = & | . | & | 2 | 3 | 4 | 5 | 6 | 7 | 8 | 9 | A | B | C | D | E | F | G | H | I | J | K | L | M | N | O | P | Q | R | S | T | U | ! |
| 00100 = 2 | . | 2 | 3 | 4 | 5 | 6 | 7 | 8 | 9 | A | B | C | D | E | F | G | H | I | J | K | L | M | N | O | P | Q | R | S | T | U | ! | & |
| 01000 = 3 | . | 3 | 4 | 5 | 6 | 7 | 8 | 9 | A | B | C | D | E | F | G | H | I | J | K | L | M | N | O | P | Q | R | S | T | U | ! | $ | 2 |
| 10000 = 4 | . | 4 | 5 | 6 | 7 | 8 | 9 | A | B | C | D | E | F | G | H | I | J | K | L | M | N | O | P | Q | R | S | T | U | ! | & | 2 | 3 |
| 00101 = 5 | . | 5 | 6 | 7 | 8 | 9 | A | B | C | D | E | F | G | H | I | J | K | L | M | N | O | P | Q | R | S | T | U | ! | & | 2 | 3 | 4 |
| 01010 = 6 | . | 6 | 7 | 8 | 9 | A | B | C | D | E | F | G | H | I | J | K | L | M | N | O | P | Q | R | S | T | U | ! | & | 2 | 3 | 4 | 5 |
| 10100 = 7 | . | 7 | 8 | 9 | A | B | C | D | E | F | G | H | I | J | K | L | M | N | O | P | Q | R | S | T | U | ! | & | 2 | 3 | 4 | 5 | 6 |
| 01101 = 8 | . | 8 | 9 | A | B | C | D | E | F | G | H | I | J | K | L | M | N | O | P | Q | R | S | T | U | ! | & | 2 | 3 | 4 | 5 | 6 | 7 |
| 11010 = 9 | . | 9 | A | B | C | D | E | F | G | H | I | J | K | L | M | N | O | P | Q | R | S | T | U | ! | & | 2 | 3 | 4 | 5 | 6 | 7 | 8 |
| 10001 = A | . | A | B | C | D | E | F | G | H | I | J | K | L | M | N | O | P | Q | R | S | T | U | ! | & | 2 | 3 | 4 | 5 | 6 | 7 | 8 | 9 |
| 00111 = B | . | B | C | D | E | F | G | H | I | J | K | L | M | N | O | P | Q | R | S | T | U | ! | & | 2 | 3 | 4 | 5 | 6 | 7 | 8 | 9 | A |
| 01110 = C | . | C | D | E | F | G | H | I | J | K | L | M | N | O | P | Q | R | S | T | U | ! | & | 2 | 3 | 4 | 5 | 6 | 7 | 8 | 9 | A | B |
| 11100 = D | . | D | E | F | G | H | I | J | K | L | M | N | O | P | Q | R | S | T | U | ! | & | 2 | 3 | 4 | 5 | 6 | 7 | 8 | 9 | A | B | C |
| 11101 = E | . | E | F | G | H | I | J | K | L | M | N | O | P | Q | R | S | T | U | ! | & | 2 | 3 | 4 | 5 | 6 | 7 | 8 | 9 | A | B | C | D |
| 11111 = F | . | F | G | H | I | J | K | L | M | N | O | P | Q | R | S | T | U | ! | & | 2 | 3 | 4 | 5 | 6 | 7 | 8 | 9 | A | B | C | D | E |
| 11011 = G | . | G | H | I | J | K | L | M | N | O | P | Q | R | S | T | U | ! | & | 2 | 3 | 4 | 5 | 6 | 7 | 8 | 9 | A | B | C | D | E | F |
| 10011 = H | . | H | I | J | K | L | M | N | O | P | Q | R | S | T | U | ! | & | 2 | 3 | 4 | 5 | 6 | 7 | 8 | 9 | A | B | C | D | E | F | G |
| 00011 = I | . | I | J | K | L | M | N | O | P | Q | R | S | T | U | ! | & | 2 | 3 | 4 | 5 | 6 | 7 | 8 | 9 | A | B | C | D | E | F | G | H |
| 00110 = J | . | J | K | L | M | N | O | P | Q | R | S | T | U | ! | & | 2 | 3 | 4 | 5 | 6 | 7 | 8 | 9 | A | B | C | D | E | F | G | H | I |
| 01100 = K | . | K | L | M | N | O | P | Q | R | S | T | U | ! | & | 2 | 3 | 4 | 5 | 6 | 7 | 8 | 9 | A | B | C | D | E | F | G | H | I | J |
| 11000 = L | . | L | M | N | O | P | Q | R | S | T | U | ! | & | 2 | 3 | 4 | 5 | 6 | 7 | 8 | 9 | A | B | C | D | E | F | G | H | I | J | K |
| 10101 = M | . | M | N | O | P | Q | R | S | T | U | ! | & | 2 | 3 | 4 | 5 | 6 | 7 | 8 | 9 | A | B | C | D | E | F | G | H | I | J | K | L |
| 01111 = N | . | N | O | P | Q | R | S | T | U | ! | & | 2 | 3 | 4 | 5 | 6 | 7 | 8 | 9 | A | B | C | D | E | F | G | H | I | J | K | L | M |
| 11110 = O | . | O | P | Q | R | S | T | U | ! | & | 2 | 3 | 4 | 5 | 6 | 7 | 8 | 9 | A | B | C | D | E | F | G | H | I | J | K | L | M | N |
| 11001 = P | . | P | Q | R | S | T | U | ! | & | 2 | 3 | 4 | 5 | 6 | 7 | 8 | 9 | A | | C | D | E | F | G | H | I | J | K | L | M | N | O |
| 10111 = Q | . | Q | R | S | T | U | ! | & | 2 | 3 | 4 | 5 | 6 | 7 | 8 | 9 | A | B | C | D | E | F | G | H | I | J | K | L | M | N | O | P |
| 01011 = R | . | R | S | T | U | ! | & | 2 | 3 | 4 | 5 | 6 | 7 | 8 | 9 | A | B | C | D | E | F | G | H | I | J | K | L | M | N | O | P | Q |
| 10110 = S | . | S | T | U | ! | & | 2 | 3 | 4 | 5 | 6 | 7 | 8 | 9 | A | B | C | D | E | F | G | H | I | J | K | L | M | N | O | P | Q | R |
| 01001 = T | . | T | U | ! | & | 2 | 3 | 4 | 5 | 6 | 7 | 8 | 9 | A | B | C | D | E | F | G | H | I | J | K | L | M | N | O | P | Q | R | S |
| 10010 = U | . | U | ! | & | 2 | 3 | 4 | 5 | 6 | 7 | 8 | 9 | A | B | C | D | E | F | G | H | I | J | K | L | M | N | O | P | Q | R | S | T |

The above truth table expresses the operation of multiplication in GF($2^5$). The exclusive OR (XOR) operation, well known in the art, may be similarly expressed. The Galois field logic 62 implements the operation X*Y according to the rules expressed by table I and also the operation X*Y+Z, where "+" is the XOR of the product (X*Y) with the GF($2^5$) variable Z.

The result of finite field arithmetic operations appear at the output of the Galois field combinatorial logic 62 in the form of a pseudo register 66 called the R register, or R bus. As distinct from the real registers, R bus 66 is merely an aggregate of 6 conductors which carry the voltage levels expressing the digital result of a Galois field operation to the gating logic for the Y register 63 and V register 61. The information on R bus 66 is thus transitory, available at a point during the clock cycle when it may be gated to Y register 64 or V register 61.

An addressed word M [A] of the data memory 60, also may be selected as a data source of the output, or O register 67, also 6 bits in length. Thus input data streams enter the data memory 60 by V register 61 and corrected data are available to the data sink by O register 67.

Three logic signals are employed for communication from arithmetic unit 6 to control unit 4 for decoding purposes. The branching logic 44 of control unit 4 treats these signals as logical variables determining the content of the "GOTO" but which in turn controls the branching from sequential execution of instructions stored in controm memory 40. The three signals originating in arithmetic unit 6 include a signal indicative of the zero content of the Y register 63, a signal Z5, derived from the erasure bit of Z register 64 and the signal TV derived from V4. Z5 is the erasure bit through which erased data words are labeled, while TV can produce a signal dependent upon content of an individual bit of the V register.

Figure 4:
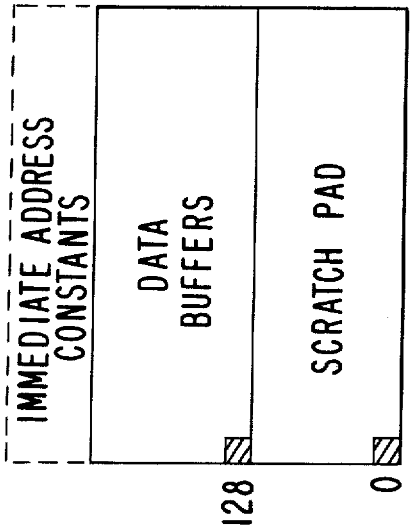
FIG. 4 is a block diagram of memory allocation within the data memory of the arithmetic unit of such apparatus.
Figure 5:
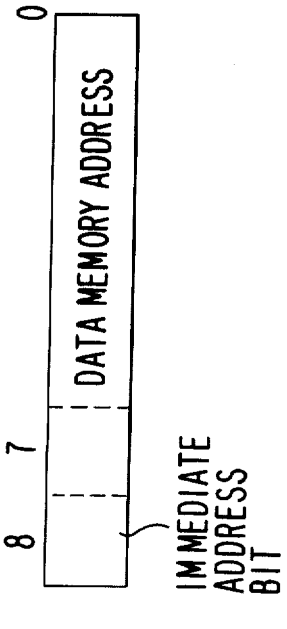
FIG. 5 is an illustration of the format of address information created by the address generator of such apparatus.

The organization of data memory 60 is clarified by reference to FIGS. 4 and 5. It will be noted that the output developed by the address generator 5 is directed toward addressing the data memory 60 of the arithmetic unit. The A register word format is shown in FIG. 5. Clearly, the 256 word data memory 60 is directly addressed by 8 bits; consequently the 9th or most significant bit of A register 50 (that is, A8) is superfluous to direct addressing.

The asseration of this bit enables an "immediate address" mode whereby the content of the 6 bits A0–A5 are gated directly to the output bus of data memory 60, thereby providing $2^6$ constants directly to the Y,Z, and O registers of the arithmetic unit. These constants are shown schematically in FIG. 4 as an annex to the data memory. The 8th bit, A7 of A register 50, effectively divides the 256 word data memory into upper and lower 128 addresses as described by FIG. 4. Addresses 1 to 127 are freely utilized for scratch pad purposes. Upper memory addresses 129-255 are employed for input-output (I/O) buffers. Addresses 000 and 128 are not used by the system in operation.

The operation of the C work modifier 53 is best understood with a brief explanation of the address arithmetic. The addresses developed by the address generator 5 are used to address data memory 60 according to the general scheme of FIG. 4. The upper 127 locations of data memory 60 are designed to be used as input/output buffers. These locations are sequentiall ordered according to the canonical representation of the powers of gamma in the Galois field GF($2^7$), where gamma$^7$=-gamma+1. Thus,

| | |
|---|---|
| gamma$^1$ | =0000010 |
| gamma$^2$ | =0000100 |
| gamma$^3$ | =0001000 |
| gamma$^4$ | =00010000 |
| gamma$^5$ | =0100000 |
| gamma$^6$ | =1000000 |
| gamma$^7$ | =0000011 |
| . . . | . . . |
| gamma$^{126}$ | =1000001 |
| gamma$^{127}$ | =0000001 |

The only arithmetic operations ever performed on addresses referring to locations in the i/o buffer are the ±± operations which convert gamma$^i$ into gamma$^{i\pm1}$. These operations act on the 127 nonzero seven bit words and run them through a cycle of length 127. For this reason, it is useful both to refer to the 7th bit representation of these numbers corresponding to the actual content of A register 50, and also to the rational integers corresponding to logarithms, base gamma, of these entities considered as elements of GF($2^7$).

A complete functional description of the C word modifier 53 and a definition of the operations of incrementation and decrementation are provided by the truth table given in Table II. The data read from C memory 52 resides in the D latch 55, which latch may be regarded as the operand upon which the C word modifier 53 operates. Table II gives the value of D ± 1 corresponding to the $2^7$ values which can be assumed by the lower 7 bits, D6 . . . D0. The correspondence is given separately for the hexadecimal content of the lower 7 bits of D expressed together with the leading bit D7. The latter bit appears separately as the most significant character. Correspondence is also given for D±1 expressed as a logarithm base gamma of the same data interpreted as a polynomial in gamma.

Bit D7 (thus A7) is unaffected by the incrementation/decrementation operations. This insures that any combination of increments and decrements of an address referring to the i/o buffer will still refer to the i/o buffer and any combination of increments and decrements of an address referring to the scratch storage will still give an address which refers to the scratch storage.

The addresses 00000000 and 10000000 are unusual in that they are also unchanged by incrementing or decrementing. These locations of data memory are used only for diagnostic purposes.

Having described the major components and their mutual relationships, attention is again invited to the structures of the ESK control word illustrated in FIG. 3. Tables III and IV respectively indicate the allocation of enable (E) bits and select (S) bits.

TABLE II

TRUTH TABLE FOR C WORD MODIFIER

| D | | D + 1 | | D − 1 | |
|---|---|---|---|---|---|
| hex | log | hex | log | hex | log |
| 000 | ∞ | 000 | ∞ | 000 | ∞ |
| 001 | 5 | 002 | 6 | 040 | 4 |
| 002 | 6 | 00c | 7 | 001 | 5 |
| 003 | 12 | 00e | 13 | 041 | 11 |
| 004 | 127=0 | 008 | 1 | 006 | 126 |
| 005 | 54 | 00a | 55 | 046 | 53 |
| 006 | 126 | 004 | 127=0 | 007 | 125 |
| 007 | 125 | 006 | 126 | 047 | 124 |
| 008 | 1 | 010 | 2 | 004 | 0=127 |
| 009 | 29 | 012 | 30 | 044 | 28 |
| 00a | 55 | 01c | 56 | 005 | 54 |
| 00b | 88 | 01e | 89 | 045 | 87 |

TABLE II-continued

TRUTH TABLE FOR C WORD MODIFIER

| hex | $\log_\gamma$ | hex | $\log_\gamma$ | hex | $\log_\gamma$ |
|---|---|---|---|---|---|
| 00c | 7 | 018 | 8 | 002 | 6 |
| 00d | 19 | 01a | 20 | 042 | 18 |
| 00e | 13 | 014 | 14 | 003 | 12 |
| 00f | 61 | 016 | 62 | 043 | 60 |
| 010 | 2 | 020 | 3 | 008 | 1 |
| 011 | 65 | 022 | 66 | 048 | 64 |
| 012 | 30 | 02c | 31 | 009 | 29 |
| 013 | 110 | 02e | 111 | 049 | 109 |
| 014 | 14 | 028 | 15 | 00e | 13 |
| 015 | 95 | 02a | 96 | 04e | 94 |
| 016 | 62 | 024 | 63 | 00f | 61 |
| 017 | 26 | 026 | 27 | 04f | 25 |
| 018 | 8 | 030 | 9 | 00c | 7 |
| 019 | 68 | 032 | 69 | 04c | 67 |
| 01a | 20 | 03c | 21 | 00d | 19 |
| 01b | 36 | 03e | 37 | 04d | 35 |
| 01c | 56 | 038 | 57 | 00a | 55 |
| 01d | 45 | 03a | 46 | 04a | 44 |
| 01e | 89 | 034 | 90 | 00b | 88 |
| 01f | 106 | 036 | 107 | 04b | 105 |
| 020 | 3 | 040 | 4 | 010 | 2 |
| 021 | 17 | 042 | 18 | 050 | 16 |
| 022 | 66 | 04c | 67 | 011 | 65 |
| 023 | 93 | 04e | 94 | 051 | 92 |
| 024 | 63 | 048 | 64 | 016 | 62 |
| 025 | 43 | 04a | 44 | 056 | 42 |
| 026 | 27 | 044 | 28 | 017 | 26 |
| 027 | 52 | 046 | 53 | 057 | 51 |
| 028 | 15 | 050 | 16 | 014 | 14 |
| 029 | 113 | 052 | 114 | 054 | 112 |
| 02a | 96 | 05c | 97 | 015 | 95 |
| 02b | 75 | 02a | 76 | 04e | 74 |
| 02c | 31 | 058 | 32 | 012 | 30 |
| 02d | 115 | 05a | 116 | 052 | 114 |
| 02e | 111 | 054 | 112 | 013 | 110 |
| 02f | 41 | 056 | 42 | 053 | 40 |
| 030 | 9 | 060 | 10 | 018 | 8 |
| 031 | 33 | 062 | 34 | 058 | 32 |
| 032 | 69 | 06c | 70 | 019 | 68 |
| 033 | 72 | 06e | 73 | 059 | 71 |
| 034 | 90 | 068 | 91 | 01e | 89 |
| 035 | 77 | 06a | 78 | 05e | 76 |
| 036 | 107 | 064 | 108 | 01f | 106 |
| 037 | 85 | 066 | 86 | 05f | 84 |
| 038 | 57 | 070 | 58 | 01c | 56 |
| 039 | 98 | 072 | 99 | 05c | 97 |
| 03a | 46 | 07c | 47 | 01d | 45 |
| 03b | 80 | 07e | 81 | 05d | 79 |
| 03c | 21 | 078 | 22 | 01a | 20 |
| 03d | 117 | 07a | 118 | 05a | 116 |
| 03e | 37 | 074 | 38 | 01b | 36 |
| 03f | 102 | 076 | 103 | 05b | 101 |
| 040 | 4 | 001 | 5 | 020 | 3 |
| 041 | 11 | 003 | 12 | 060 | 10 |
| 042 | 18 | 00d | 19 | 021 | 17 |
| 043 | 60 | 00f | 61 | 061 | 59 |
| 044 | 28 | 009 | 29 | 026 | 27 |
| 045 | 87 | 00b | 88 | 066 | 86 |
| 046 | 53 | 005 | 54 | 027 | 52 |
| 047 | 124 | 007 | 125 | 067 | 123 |
| 048 | 64 | 011 | 65 | 024 | 63 |
| 049 | 109 | 013 | 110 | 064 | 108 |
| 04a | 44 | 01d | 45 | 025 | 43 |
| 04b | 105 | 01f | 106 | 065 | 104 |
| 04c | 67 | 019 | 68 | 022 | 66 |
| 04d | 35 | 01b | 36 | 062 | 34 |
| 04e | 94 | 015 | 95 | 023 | 93 |
| 04f | 25 | 017 | 26 | 063 | 24 |
| 050 | 16 | 021 | 17 | 028 | 15 |
| 051 | 92 | 023 | 93 | 068 | 91 |
| 052 | 114 | 02d | 115 | 029 | 113 |
| 053 | 40 | 02f | 41 | 069 | 39 |
| 054 | 112 | 029 | 113 | 02e | 111 |
| 055 | 74 | 02b | 75 | 06e | 73 |
| 056 | 42 | 025 | 43 | 02f | 41 |
| 057 | 51 | 027 | 52 | 06f | 50 |
| 058 | 32 | 031 | 33 | 02c | 31 |
| 059 | 71 | 033 | 72 | 06c | 70 |
| 05a | 116 | 03d | 117 | 02d | 115 |

TABLE II-continued

TRUTH TABLE FOR C WORD MODIFIER

| | | | | | |
|---|---|---|---|---|---|
| 05b | 101 | 03f | 102 | 06d | 100 |
| 05c | 97 | 039 | 98 | 02a | 96 |
| 05d | 79 | 03b | 80 | 06a | 78 |
| 05e | 76 | 035 | 77 | 02b | 75 |
| 05f | 84 | 037 | 85 | 06b | 83 |
| 060 | 10 | 041 | 11 | 030 | 9 |
| 061 | 59 | 043 | 60 | 070 | 58 |
| 062 | 34 | 04d | 35 | 031 | 33 |
| 063 | 24 | 04f | 25 | 071 | 23 |
| 064 | 108 | 049 | 109 | 036 | 107 |
| 065 | 104 | 04b | 105 | 076 | 103 |
| 066 | 86 | 045 | 87 | 037 | 85 |
| 067 | 123 | 047 | 124 | 077 | 122 |
| 068 | 91 | 051 | 92 | 034 | 90 |
| 069 | 39 | 053 | 40 | 074 | 38 |
| 06a | 78 | 05d | 79 | 035 | 77 |
| 06b | 83 | 05f | 84 | 075 | 82 |
| 06c | 70 | 059 | 71 | 032 | 69 |
| 06d | 100 | 05b | 101 | 072 | 99 |
| 06e | 73 | 055 | 74 | 033 | 72 |
| 06f | 50 | 057 | 51 | 073 | 49 |
| 070 | 58 | 061 | 59 | 038 | 57 |
| 071 | 23 | 063 | 24 | 078 | 22 |
| 072 | 99 | 06d | 100 | 039 | 98 |
| 073 | 49 | 06f | 50 | 079 | 48 |
| 074 | 38 | 069 | 39 | 03e | 37 |
| 075 | 82 | 06b | 83 | 07e | 81 |
| 076 | 103 | 065 | 104 | 03f | 102 |
| 077 | 122 | 067 | 123 | 07f | 121 |
| 078 | 22 | 071 | 23 | 03c | 21 |
| 079 | 48 | 073 | 49 | 07c | 47 |
| 07a | 118 | 07d | 119 | 03d | 117 |
| 07b | 120 | 07f | 121 | 07d | 119 |
| 07c | 47 | 079 | 48 | 03a | 46 |
| 07d | 119 | 07b | 120 | 07a | 118 |
| 07e | 81 | 075 | 82 | 03b | 80 |
| 07f | 121 | 077 | 122 | 07b | 120 |

TABLE III

| ENABLE BITS OF ESK CONTROL WORD | |
|---|---|
| EX | Enables local clock input to X register. If EX=0, X retains its previous value; If EX=1, X will be reset to a new value determined by the SX select character. |
| EY | Enables local clock to Y register |
| EZ | Enables local clock to Z register |
| EO | Enables local clock to Output register |
| EV | Enables local clock to V register |
| EM | Enables writing of data memory M |
| ET | Enables local clock to T register |
| EC | Enables writing of address generator memory C |
| EA | Allows A register to retain its previous value; actually enable D latch and also called ED |

TABLE IV

| SELECTION CODES OF ESK CONTROL WORD | |
|---|---|
| SR | One bit (of this two-bit character) determines whether R=X*Y or R=X*Y+Z. The second bit permits this determination to become data dependent as described |
| SX | Two bits (of this three-bit character) control the multiplexor which selects the potential next X value from among Z, Y, $X^2$, and alpha *X. |
| SY | One bit character selects the potential next Y value from among R or M[A]. |
| SV | One bit character selects the potential next V value from among R or input bus N. |
| SC | Five bit character addresses one of 32 C registers |
| SA | Two bit character selects the input path to the A register from four possibilities: C, C incremented, C decremented, K. |
| SG | Four bit character controls branching logic whose 1 bit output is the value of G. |

At this point it is useful to consider the command structure for each of the control unit, address generator and arithmetic unit. Because the invention here described is almost completely synchronous, commands for the 3 major substructures are executed concurrently, thereby resulting in very high speed operation.

Control unit commands are tabulated together with a brief explanation in Table V. With respect to the notation here employed, the exclamation point (!) to the right of the symbol connotes negation, as for example, G=A!=T states the assertion of G upon the condition of non quality between the content of A and the content of T. The exclamation point to the left of a symbol connotes the non-assertion condition or logical 0: The symbol !NS has the meaning that the signal NS is in the "off" condition. The double equality sign is the equality relation, unlike the single equality, which is an assignment rather than a relation. Thus G=A==T is a command which sets G to 1 if and only if (iff) the contents of A and T are equal. Failure of the relation A==T sets G to 0. In like manner, the double ampersand, && denotes the AND relation. For example, G=A!=T&&NS sets G to the logical conjunction of A not equal to T and NS asserted.

It will be observed that the control unit instructions focus upon logical conditions which determine the value of G, the "GOTO" bit, which controls branching of the execution of the instructions contained in control memory 40. Thus, control unit commands are branching instructions: G=1 is an absolute jump to the instruction whose address is contained in the K subfield of the next word fetched from control memory 40; G=0, the jump inhibit, insures that instructions continue to execute in sequence. The remaining branching instructions are conditional jump instructions wherein a jump or transfer is conditioned upon specified values of the various logical variables.

The instructions G=TV() and G=!TV() permit the branching logic to sense a specific V register bit (V4).

TABLE V

| CONTROL UNIT COMMANDS | | |
|---|---|---|
| COMMAND | SG Bits | EXPLANATION |
| G=1 | 0000 | Absolute control transfer to ROM address contained in K field |
| G=Z5() | 1010 | Sets G to the highest bit of Z. This is the sixth bit, through which erased characters are detected.* |
| G=!Z5() | 1010 | Sets G to the complement of Z5 |
| G=Y==0 | 1000 | Sets G to 1 iff the Y register contains 0 (YZR true) |
| G=Y!=0 | 1100 | Sets G to 1 iff Y is nonzero (YZR not true) |
| G=A==T | 1011 | Sets G to 1 iff A and T are equal (only the lower 8 bits of A enter the comparator; A8 is ignored |
| G=A!T | 1111 | Sets G to 1 iff A differs from T |
| G=!0S&&!NS | 0001 | Set G to 1 iff the outputs status bits OS and the input status bit NS are both off |
| G=0SλNS | 0011 | Sets G to 1 iff either OS or NS is one. This detects that some i/o channel wants service |
| G=A!=T&&0S | 0100 | Sets G to 1 iff OS==1 and A!=T |
| G=A!=T&&NS | 0101 | Sets G to 1 iff NS==1 and A!=T |
| G=A!=T&&G | 0111 | Sets G to 1 only if previous G==1 and A!=T |
| G=A!=T&&G | 0110 | Sets G to 1 only if previous G==0 and A!=T |
| G=TV() | 1001 | Sets G to the value of the bit V4 |
| G=!TV() | 1101 | Sets G to the complement of the bit V4 |

*Parenthesis indicate functional relationship of the indicated quantity

The commands executed within the address generator are summarized in Table VI. These instructions are directed to manipulation of contents of A register 50, T register 51 and address generator memory 52. Basically, there are four options for the content of the A register as previously described. These options are controlled by two Select A (SA) bits of the Select subfield of the ESk register. It will be recalled that incrementation in the address generator is distinctly non-arithmetic in the conventional sense, being merely the incremental step in a shift register sequence, characteristic of the field GF $(2^7)$ through which $2^7-1$ locations of data memory are addressed. This modification to the content of A may be written back to C memory 52, or not so stored, in accord with the appropriate command. Locations within C memory 52 are addressed by the 5 bit Select C (SC) subfield of the ESK register.

In the notation of Table VI, the incrementation of A register 50 together with the storage of the incremented word into the jth location, $C_j$, of C memory 52 is denoted by the double plus symbol, ++ or double minus symbols, −−. A register incrementation (decrementation) not coupled with re-storing of the non-incremented (non-decremented) value back into the appropriate C memory location is denoted by the single plus (minus) symbol +1(−1)

TABLE VI:

| | ADDRESS GENERATOR COMMANDS | | | |
|---|---|---|---|---|
| | Code bits | | | |
| COMMAND | SA | !EA | !EC | EXPLANATION |
| A=K | 11 | 0 | 1 | Sets A to 9 bit Konstant taken from K-field of the instruction |
| A=Cj=K | 11 | 0 | 0 | Sets both A and the $j^{th}$ C register to KO-7. (the 9th bit of Cj does not exist.) The instruction must specify j explicitly in hexadecimal. |
| A=Cj | 01 | 0 | 1 | Sets A0...A7 to Cj; A8 becomes 0 |
| A=Cj+1 | 10 | 0 | 1 | Sets A0...A7 to Cj incremented once; A8 becomes 0 |
| A=Cj−1 | 00 | 0 | 1 | Sets A0...A7 to Cj decremented once; A8 |

TABLE VI:-continued

| ADDRESS GENERATOR COMMANDS | | | | |
|---|---|---|---|---|
| | Code bits | | | |
| COMMAND | SA | !EA | !EC | EXPLANATION |
| | | | | becomes 0 |
| A=++Cj | 10 | 0 | 0 | Increments Cj and then sets A to the incremented value. Equivalent to Cj=Cj+1 followed by A=Cj. |
| A=--C | 00 | 0 | 0 | Decrements Cj and then sets A to the decremented value. Equivalent to Cj=Cj−1 followed by A=Cj. |
| A=Cj=A | * | 1 | 0 | Equivalent to A8=0 followed by Cj=A |
| A=A | * | 1 | 1 | Default option. Contents of A0-7 unchanged; A8=0. |
| T=A | | ET=1 | | Sets T to A |

*Same as SA code of command immediately prior in time.

Arithmetic unit commands are summarized in Table VII. These instructions involve a variety of inter-register transfers, e.g. Y=R, and four specialized arithmetic operations defined on the field GF ($2^5$). By the symbolic instruction SQ(), the content of X register 63 is replaced by its square. This operation is facilitated in a Galois field of characteristic two because in such a field, the squaring operation is effectively linear. The symbolic instruction AL() replaces the content of X register 63 with the product of the previous content of X with alpha, the primitive element of GF($2^5$), where alpha is a solution of the equation, $\text{alpha}^5+\text{alpha}^2+1=0$. Thus AL() is operationally similar to SQ(). These products are part of the Galois field logic which are wired to a multiplexer 63' for loading X in response to the 2 bit SX character of the ESK control word. The remaining X register loading options are the content of Y register 64 (or Z register 65) gated through the instruction X=Y (or X=Z). In contrast LF(), FF() and RF() operate upon arguments supplied from registers indicated in Table VII, placig the result on the R bus.

TABLE VII

| ARITHMETIC UNIT COMMANDS | | |
|---|---|---|
| Command* | Code Bits | Explanation |
| V=N() | EV=1:SV=1 | Input is read into V. Input Status bit NS is turned off. |
| V=R | EV=1;SV=O | VO-5 are set to RO-5. |
| M[A]=V | EM=1 | Contents of V are written into Memory at location A. Only bits 0-7 of A are used: A8 must be 0. |
| φ=M[A] | E=1 | Memory at A is read to output register φ. If A8=O, one of the 256 RAM words is read. If A8=1, 00-05 are set to A0-A5. |
| Z=M[A] | EZ=1 | Similar to 0=M[A] |
| Y=M[A] | EY=1;SY=1 | Similar to 0=M[A]. M5 is ignored because Y has only bits YO-Y4 |
| Y=R | EY=1;SY=0 | YO-Y4 are set to R0-R4. R5 is ignored. |
| X=Y | EX=1;SX=001 | X is set to Y. |
| X=Z | EX=1;SX=010 | X is set to Z. |
| SQ() | EX=1;SX=011 | Replaces X by its square. The value of $X^2$ is ($2^5$) is obtained from the GF logic and loaded into X. |
| AL() | EX=1;SX=011 | Multiplies X by alpha. The value of alpha*X in GF($2^5$) is obtained from the GF logic and loaded into X. Not required for error correction of RS (.31,15) code |
| LF() | SR=00 | Select Linear Function in arithmetic unit so that RΔX*Y, the Galois field product of X and Y, appear on Result bus. R5 assumes the value 0. |
| FF() | SR=01 | Select aFFine function in arithmetic unit so that R=X*Y+Z. |
| RF() | SR=10 | Select LF() or FF() respectively as RO=0 or 1. Not required for (31,15) RS error correction. |

*The letter φ is employed to denote the letter O to avoid confusion with the numeral zero in this table.

Referring again to FIG. 2, input and output status of the invention are recorded in two status bits realized by two J-K flipflops. One status bit 45, called NS, indicates the status of the input; The other status bit 46, called OS, indicates the status of the output. The J inputs to the flipflops are controlled by the invention; the K inputs are controlled by the device supplying input or the device accepting output. Both the present invention and the external devices have access to the contents of each of these two J K status flipflops. When the input flipflop is in one state, it means that the external device has data ready, waiting for the invention to read it. When the invention reads this in via the wires N0,N1,. . . ,N5. it simultaneously switches the input status flipflop NS to the other state. Similarly, the output status indicator reveals whether or not the output device is prepared to accept another word of output. Before emitting output, the invention interrogtes this flipflop to ensure that the output device is prepared to accept the output. When this is the case, the invention may reload the O register 67, and simultaneously reset the status of the OS output flipflop.

All of the input and output is under the control of the invention. Data input is thus accomplished by an instruction V=N() and output is initiated by $\phi$=M[A]. Interrupts are not possible, although the external devices with which the invention communicates need never be kept waiting very long, because the invention can interrogate the input and output flipflops frequently under program control. Hence, the invention will honor any I/O request quickly unless there are good reasons for failing to do so. This can occur, for example, only if an output word is requested before the first input block has been read in and decoded, or if the device supplying inputs tries to feed more data into the invention than its memory buffer will hold.

Summarizing the meaning of NS and OS;

NS=1 External input waiting for the invention
NS=0 The invention waiting for external input
OS=1 Output device waiting for the invention
OS=0 The invention waiting for output device Since the input and output status bits may be changed by external devices, they may be in transition at the instant they are sampled. If such an ambiguous signal reached the progrm counter select input, it might cause some bits of the program counter to count while others reset, thereby causing a fatal branch to a meaningless address. To prevent this disaster, it is necessary to allow sufficient time for any such ambiguities due to the asynchronous interface of the external signals to be resolved before the signal reaches the program counter. This resolution is accomplished in two stages: First, in the additional prior flipflops (not shown) which set NS and OS. Then, additional resolution time is provided by the flipflop which holds bit G. Even though signals G and −G may be fed back into the branching logic, unresolved asynchronization ambiguities can not propogate along that path because the program follows every I/O status test by a command setting G=0 before any subsequent command that sets G to some value depending on G.

There is provided a master clock signal called CLK which synchronizes operation of the present invention. This signal may be generated externally of the invention or provided by an internal clock. During each instruction cycle of the master clock 47, the invention will execute several of the above described subinstructions in parallel. A typical value for the time period defined by the master clock is 120 nanoseconds. Derived from the phase of the master clock are the several "local clocks" which are merely gated clock signals. All clock signal names in the invention begin with the letters CLK to which is added a suffic indicating the identifying letter of the register of destination, e.g. CLKM, CLKV, etc.

The invention is a synchronous machine with essentially all significant changes occurring at the end of every cycle of the positive transition of the master clock. The clocking scheme for controlling clocked registers and memories simply jams a clock into its inactive state during the first half of the cycle (Clk high), and allows the clock to become ready at the beginning of the second phase if the enable bit for that particular clock is active. With no inhibiting, during the CLK cycle a clock will be activated and then make a transition, usually low to high, at the end of a cycle. When clocking memories, e.g. M or C, the clock is actually a write enable to the memory during all of the second phase of the cycle.

Since the preferred embodiment uses commercially available memory components which have zero minimum address hold time, the rising edge of the write enables signals (alias CLKM, CLKC) is nominally allowed to coincide with the rising edge of the CLK inputs to flipflops which hold addresses for these memories. However, a potential implementation problem may arise if the CLKM or CLKC signal rings and the flipflops containing the address register operate at much faster then typical speeds. The defense against this potential hazard has been found to be careful layout of the components, especially the C memory and its environs, and by resistor terminations to reduce ringing of the A and CLKM signals. Additional measures to further enhance the reliability of operation of memory M include the use of a delay-line for advancing the rising edge of CLKM several manoseconds with respect to the rising edge of CLK, and a software prohibition against any sequence of instructions which would allow CLKM and CLKV to be active simultaneously. This prohibition insures that the data hold requirements for writing memory M are trivially satisfied.

Gate delay times are known to vary widely among individual integrated circuit chips. Allowing for the most extreme specifications guaranteed by most manufacturers, Schottky gates can have delays ranging from 2 nsecs to 5 nsec. Thus, in the worst case, there might be up to a 3 nsec difference between the rising edges of the several clocks and this difference might be in either direction. This may be exacerbated by layout of the invention plural circuit boards. The preferred embodiment of the invention minimizes sensitivity to this possible skew of clocks. Except for CLKM all clocks originate on the same circuit board on which said clocks are to be used. For the M memory 60, CLKM, a read-write strobe is located on the same board as the memory's address register. (A software prohibition against simultaneously setting M and V circumvents the need to specify data hold requirements when writing M.) Since all gates on the same chip have the same delays to within a small fraction of a nanosecond, clock skew is effectively minimized within each board by generating all clock signals on the same chip(s). Excepting CLKD, every clock signal on the control unit board follows CLKP by exactly one inverter and one NAND gate, and in each case, these two delays are located on the same chips.

The only exception to the generally synchronous clocking scheme is the D latch 55. This latch breaks the loop from C through multiplexers back to C, and thereby allows data to be rewritten back into C on the same clock cycle without racing around the address generator loop comprising C and the C modifier.

All of the aforementioned registers, namely, X, Y, Z, V, O, A, T, P, ESK, and G, operate synchronously. All are able to change states only within a few nanoseconds of the rising edge of the master clock. Furthermore, data memory 60 and/or counter memory 52 also operate in this same phase.

B. DECODING PROGRAM FOR REED-SOLOMON (31,15) CODE

The symbolic language is useful to remind the programmer of the concurrent operations which may be realized by this invention in contrast to sequentially executing computers. The symbolic language will therefore be elucidated by description and example and then used to state a preferred program executed by the invention for correcting errata in the Reed-Solomon (31,15) code. The identical program will then be restated in a language more specific to the structure of the invention, while descriptive of the state of the components at the conclusion of each clock cycle contemporary with the instructions. Finally, the hexadecimal content of the control memory corresponding to the preferred program will be given.

It is understood that a special purpose digital computer, such as the present invention, cannot be economically employed to compile and assemble its own executable code (firmware) from a higher level language. It is outside the scope of the present invention to describe the syntactical detail and complier code of a crosscomplier which has been constructed to run on a commercially available general purpose digital computer to compile and assemble executable code for the control memory of the present invention. With the aid of flow charts (FIGS. 6, 7A, 7B, and 7C), and code, the symbolic source language (Table VIII), the semi-symbolic ROM code (Table IX) and the actual hexadecimal ROM-stored contents (Table X,) one skilled in the programming art will be able to discern the programming steps and manually trace the program without resort to an execution simulator.

The symbolic source language consists of lines of micro-programmable-code and optional explanatory comments. A line of such code specifies all sub-instructions to be concurrently executed by the invention. A line of such code comprises fields, here delimited by colons and semi-colons. Non executable comments are enclosed by asterisks and slashes. An executable line specifies sub-instructions to be executed by the invention's Galois field manipulative circuits, a sub-instruction specifying the content of the G bit of the control unit, sub-instructions loading and transferring content of the registers of the arithmetic unit, sub-instruction manipulating addresses (ultimately for addressing the data memory) by means of operations in the address generator.

The symbolic language employs several conventions which are here described in order to aid in understanding the specific symbolic code presented below. These conventions are now briefly described. One skilled in the art of programming will recognize the efficacy of those conventions in the design of a cross-compiler and simulator for operations wherein a conventional computer is employed to debug programs for the invention.

At the option of the programmer, each line of code may be symbolically labeled in conventional fashion with a symbolic address. These symbolic addresses for executable code appear at the extreme left of the line of code, delimited by colons from the next adjacent symbolic sub-instruction field. By convention the symbolic addresses are distinguished from named variables by commencing the symbolic address with the letter "W". These locations in control memory are mnemonically the "WHERE TO" addresses which are ordinarily the addresses to which control transfers as a result of the status of the G, or "GOTO" bit The conventions and techniques of branching instructions will be described below.

The symbolic sub-instruction fields commence with one of the three operations LF(), FF() or RF(). This field principally indicates the content of the R bus, which content results from the operation LF() or FF() as previously defined. The pseudo instruction UF() stands for "undefined function" and is a default option emphasizing the loss of the current content of the R bus when no other reference to the R bus is made in the same line of symbolic source language microcode. The hardware execution of UF() is identical to LF(). The G bit of the control unit is specified in the next subfield. The default option is G=0 whereby the next sequential instruction will be the next instruction executed from control memory.

Statements encountered in the program herein disclosed, such as "printf (...)", are not relevant to the operation of this invention, being merely instructions to a cross-compiler or execution simulator.

Before continuing with a detailed discussion of these fine points it is helpful to present an example which shows the power of the invention, and how the symbolic language corresponds to the hardware implementation. The example below presents a sequence of six instructions which invert a data word in GF($2^5$). This data word initially resides in the Y register. The value of the data word is taken to be beta. After the following software sub-instruction have been executed, the value $beta^{-1}$ will be present in the Y register, unless beta=0, in which case the Y register will also contain 0. The mathematical explanation for this software is the fact, in GF($2^5$), $beta^{-1}$ $beta^{30}$, and $beta^{30}$ may be computed via the following aggregate of individual arithmetic unit sub-instruction.

Y=beta
X=beta
Y=$beta^2$
X=$beta^2$
X=$beta^4$
Y=$beta^6$
X=$beta^8$
Y=$beta^{14}$
X=$beta^{16}$
Y=$beta^{30}$ In the symbolic language used to express this microcode, this program reads as follows.

```
          X=Y              /* X=Beta        Y=Beta
LF( );    SQ( ); Y=R       /* X=Beta^2      Y=Beta^2 */
UF( );    SQ( );           /* X=Beta^4      /*
LF( );    SQ( ); Y=R;      /* X=Beta^8      Y=Beta^6 */
LF( );    SQ( ); Y=R;      /* X=Beta^16     Y=Beta^14 */
LF( );    Y=R;             /*               Y=Beta^30 */
```

In the above example the first line of micronode initializes the X and Y registers to the quantity beta which has been previously taken from the data memory. The second line of microcode produces $beta^2$ in two ways; first the R bus will contain $beta^2$ due to the function LF() which causes a GF($2^5$) multiplication and places the product on the R bus. The micro-instruction Y=R reloads the Y register from the R bus. Thus, Y contains $beta^2$. The X register is reset to its square at the conclusion of the clock cycle as a result of the SQ() function. The third line of microcode places $beta^4$ on the R bus, but this result is not required for the same purpose. The function UF() is here merely written as a convention of the language to emphasize the volatility of R. The SQ() operation resets X to the square of its current content thus producing $beta^4$ in the X register. The 4th line of microcode is identical to the first line: the content of Y retained from two cycles previous now gives, together with the X register, a product $beta^2*beta^4=beta^6$ on the R bus, via the LF(); Y is reset to the R bus thereby acquiring $beta^6$ and X is reset to its square, thereby producing $beta^8$. The 5th line of microcode will be seen to produce $beta^{16}$ in X and $beta^8*beta^6=beta^{14}$ in the Y register. In the final line of code, $beta^{16}*beta^{14}=beta^{30}$ is formed on the R bus and the Y register set thereto. Thus, an inversion has been completed which consumes only 6 clock cycles.

One will also observe that no memory references have been expended in the above example. In regard to this point, it is clear that inasmuch as all of these operations occur in the arthimetic unit without requiring addressing activity from the address generator, the address generator is available during this time for independent manipulation.

We now add a second example to the first example, wherein the concurrent operations in the address register effect an exchange of information contained in two counter memory words of the C memory. This might be accomplished via the following sequence of operations.

A=C5
C13=A
A=C7
C5=A
A=C13
C7=A

This program has the effect of interchanging the values of C5 and C7 while using C13 as a temporary storage location. In practice, it is easier to use symbolic names for the values of C registers. Hence, if C5 refers to the top register of some array, that address could be given the symbol TOP. If C7 refers to the bottom register of that array, that address could be given the symbol BOT. Since C13 is temporary, it can be referenced by the symbolic name TEM. In order to emphasize the distinction between symbolic names which refer to constants entering the system through the K field of a sub-instruction and symbolic names representing content of elements of the C memory, the convention is adopted that symbolic names beginning with K can represent only konstants; symbolic names beginning with any other letter refer to an element or word of C memory. Furthermore, in order to distinguish those subinstructions which affect the address generator, all such subinstructions begin with the two characters "A=." Thus, instead of TEM=A, one writes A=TEM=A. Since chains of equalities are executed from right to left in this language, this instruction has the same effect as the simpler instruction TEM=A.

Hence, the example interchange program, when run in parallel with the inversion program, appears as follows:

| | |
|---|---|
| UF( ); G=0; X=Y; | A=TOP; |
| LF( ); G=0; SQ( ); Y=R | A=TEM=A; |
| UF( ); G=0; SQ( ); | A=BOT; |
| LF( ); G=0; SQ( ); Y=R; | A=TOP=A; |
| LF( ); G=0; SQ( ); Y=R; | A=TEM; |
| LF( ); G=0; Y=R; | A=BOT=A; |

The control unit instruction G=0 emphasizes that the sequential addresses of control memory are executed.

Turning now to an exposition of control transfer, it is emphasized that the present invention features pipelined branching. This means that every jump instruction is spread out over three microinstructions, as discussed previously. During the first instruction, the G bit is set to 1. During the next (second) microinstruction, the program counter (P register) is reloaded with the label found in the K part of the then current ESK control word. For symbolic language purposes this label has a 3-character symbolic name beginning with W (e.g., WXX), as below described. During the next (third) microinstruction, the microinstruction at location WXX is loaded into the ESK control register. Finally, on the next (fourth) microinstruction, the machine executes the microinstruction at location WXX of control memory.

The preferred symbolic programming technique includes the use of a hypothetical, that is non-hardware, bit to ensure an orderly progression in symbolic programming without undue complication arising from the pipelined branching feature. One skilled in the arts of compiler structure and simulation will perceive the utility of these conventions for compiler language purposes. In order for the programmer (or an execution simulating program) to properly anticipate the effects of the hardware registers G, P, and ESK, the preferred software technique includes defining two additional bits, called GH and H. These bits may be regarded as artifacts of the symbolic language and are to be interpreted as delayed versions of the G bit. The LF(), FF(), and UF(), subroutines always have the effect of setting these bits as follows: H=GH; GH=G. These two pseudo sub-instructions are symbolically executed before the new value of G is assigned. Therefore H and GH always contain delayed values of what was formerly in the G bit. The GH bit corresponds to the state of the P register. The condition GH=0 defines a relative incrementation of the hardware P register such that P now contains one more than it did at the previous instruction cycle. The condition GH=1 signals the state wherein the hardware P register now contains a new value which was just obtained from the K field of the ESK register. Similarly, the H bit is defined to reveal whether or not the current contents of the ESK register correspond to an instruction which sequentially followed its predecessor (H=0), or to an instruction which was arrived at via a jumnp (H=1). Since the programmer contemplates execution of an instruction immediately after it appears in the ESK register, in symbolic language conditional jumps are based on the value of H, and a conditional jump is executed as the final subinstruction of each line. Thus, following the subinstruction which sets a new value of A, this technique requires that each line of subinstructions conclude with a symbolic language statement of the form:

If (H) GOTO . . . (destination address)

This pseudo instruction is interpreted as transferring control of the destination address if H=1, otherwise control gong to the next sequential instruction. The address to which this conditional jump occurs is either a legitimate location (which by convention begins with the letter W, for WHERETO), or a special default location, called HL. Control going to HL is a representation of a serious bug. This corresponds to an attempt of the hardware to branch into data rather than into a control memory address. Alternatively, it may correspond to a jump to an unspecified address. In either case, a jump to HL occurs only in the event of a serious software defect.

As a particular example of how branching is implemented, consider the following lines of instructions, which might occur in a program which is prepared to service requests for input or output.

| | | |
|---|---|---|
| UF( ); | G=!NS&&!OS; | |
| UF( ); | G=0 ; | |
| UF( ); | G=0 ; | IF(H)GOTO WMN: |

If there are no I/0 requests, the program jumps to WMN (a continuation of the main program); otherwise it falls through to an I/0 macro. This symbolic code may be expressed by the following values of the control signals (the coding is assume to begin at control memory location 300):

| ROM location | SG | K |
|---|---|---|
| 300 | !NS&&!OS | — |
| 301 | 0 | 400 |
| 302 | 0 | — |

Notice that the numerical value of the symbolic WHERETO label has been placed in the K field of the microinstruction preceding the line in which it occurs in the symbolic language. This facilitates a correspondence between firmware and the proper symbolic language simulation of the jumps. The contents of the various relevant hardware registers and pseudo registers as the above microcode is executed are sequentially indicated as follows (in obvious notation):

| Time | original ROM loc | G | P | E - S - K SG... | ...K |
|---|---|---|---|---|---|
| 0 | 300 | — | 301 | !NS&&!OS | — |
| 1 | 301 | 1 | 302 | 0 | 400 |
| 2 | 302 | 0 | 400 | 0 | — |
| 3 | 400 | 0 | | | |

Figure 6:
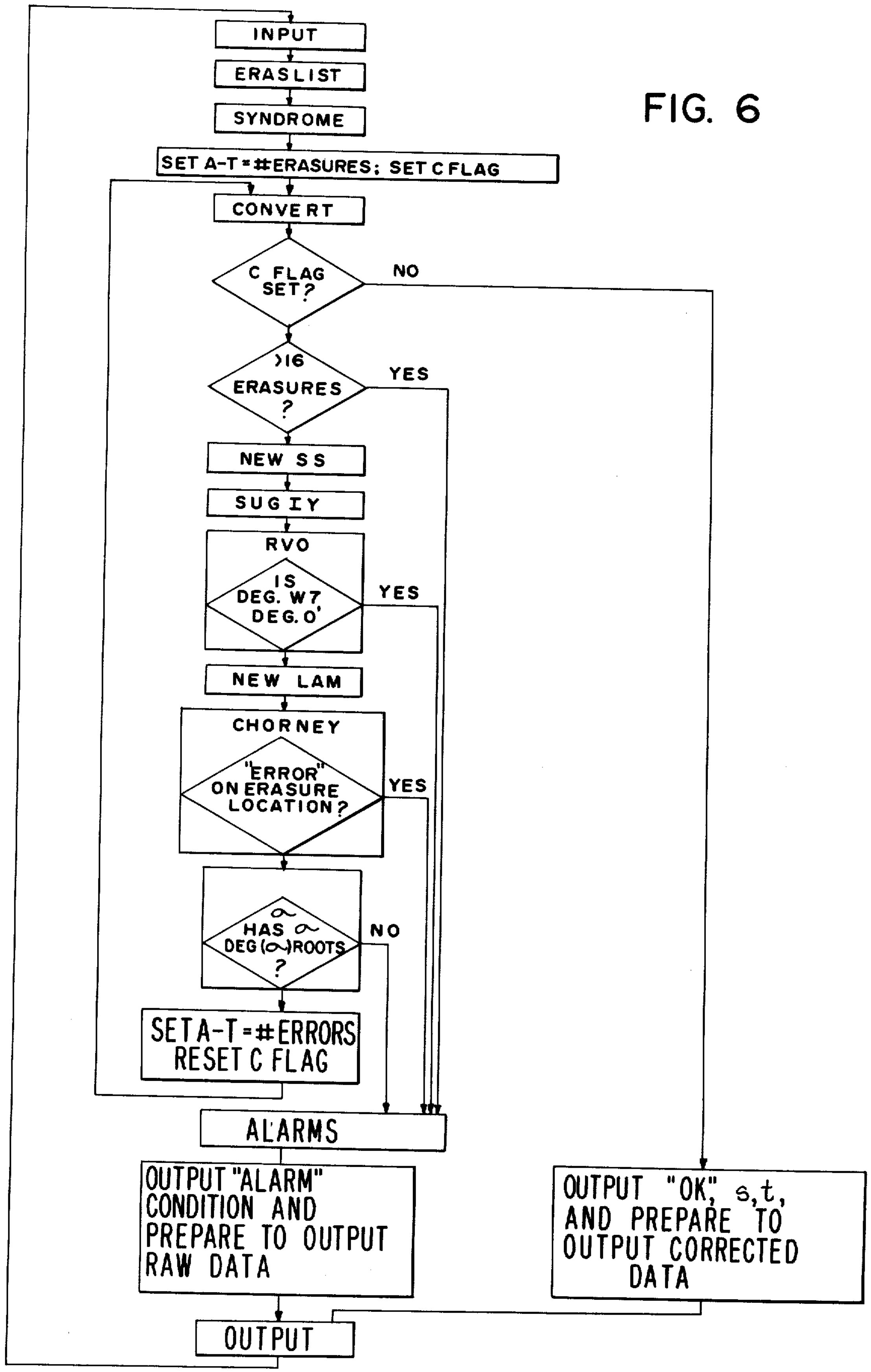
FIG. 6 is an overview of the preferred RS decoding program.
Figure 7A:
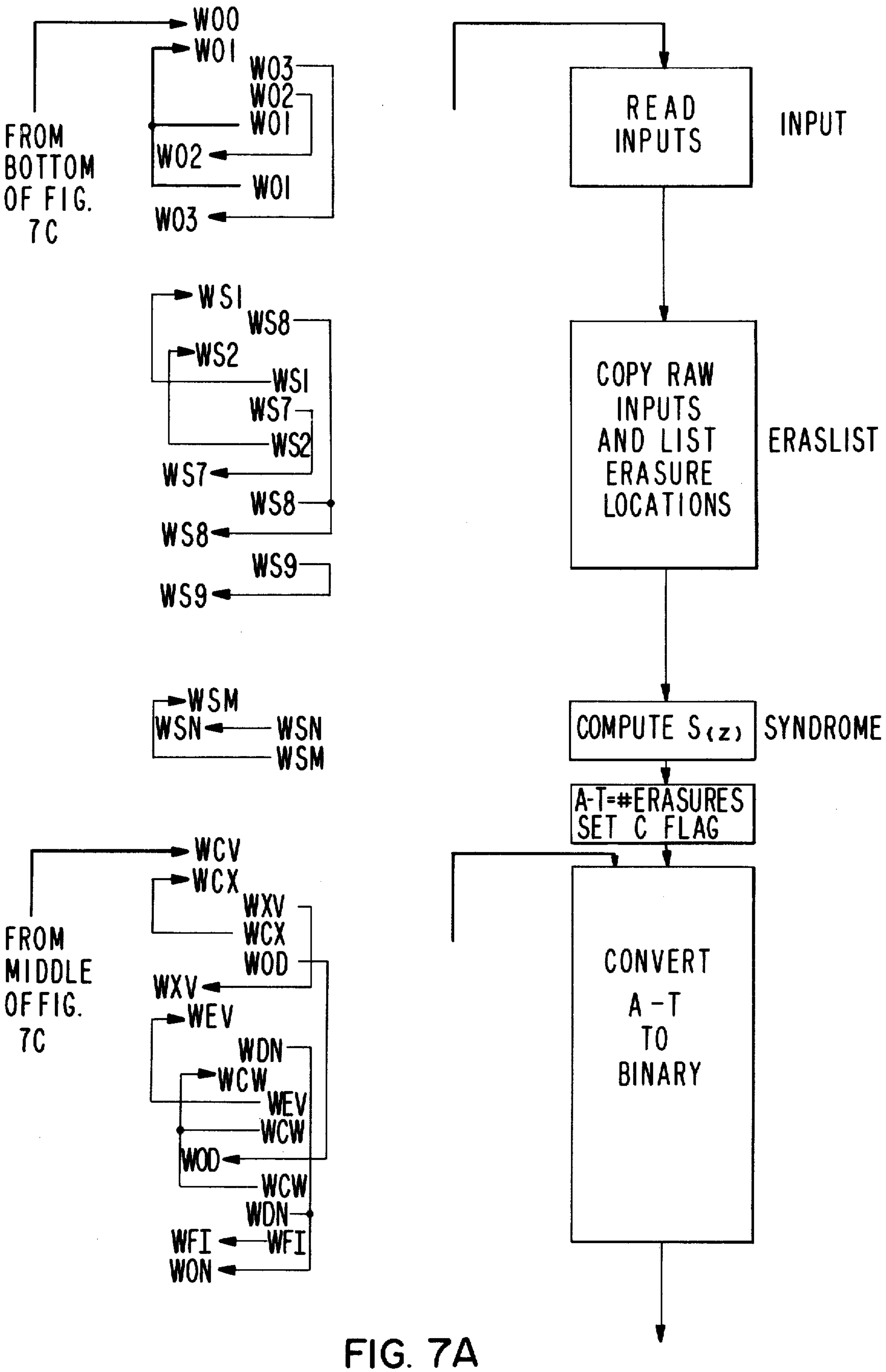
FIG. 7A, 7B and 7C show more detailed flow charts for the preferred error correction program of FIG. 6.
Figure 7B:
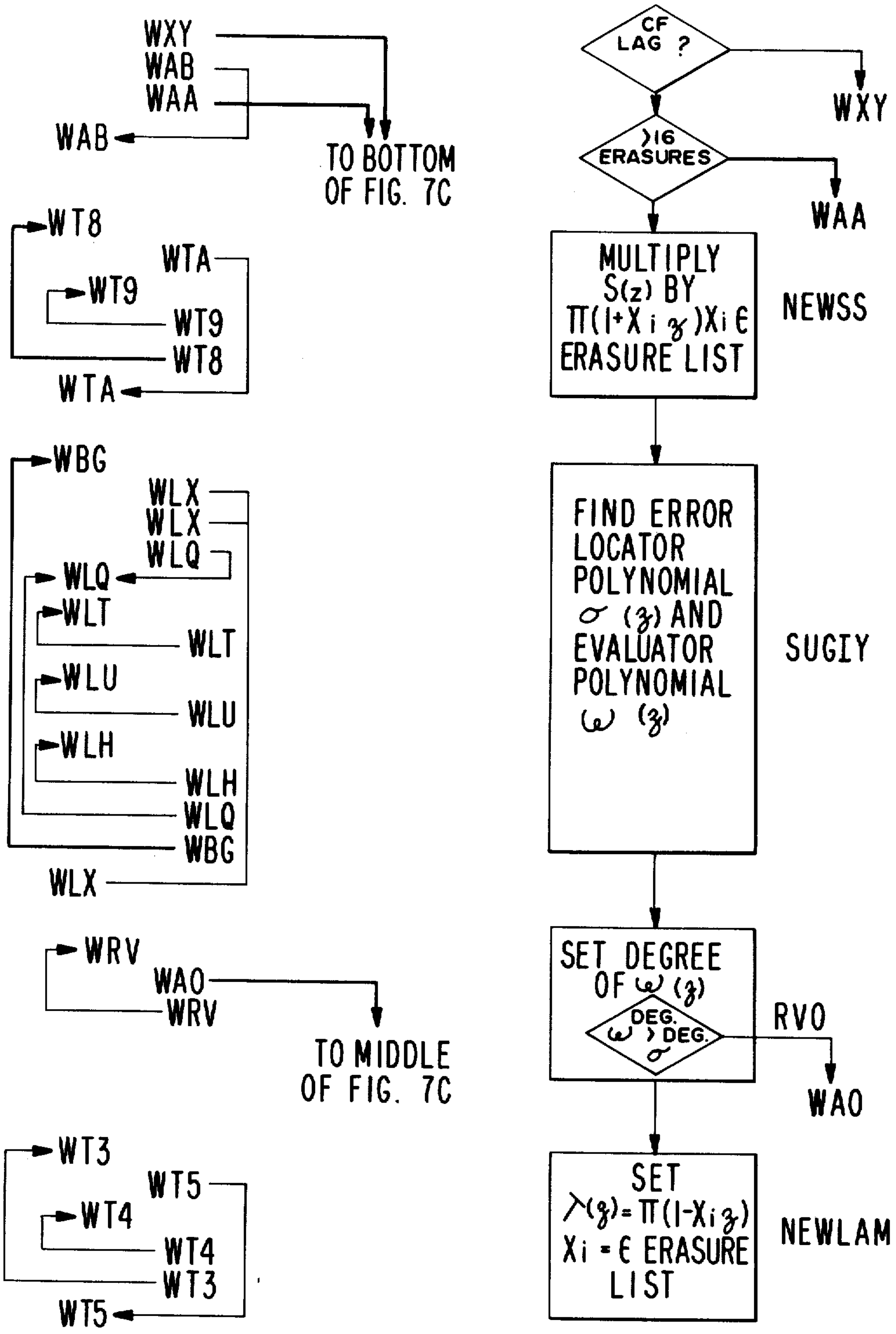
Figure 7C:
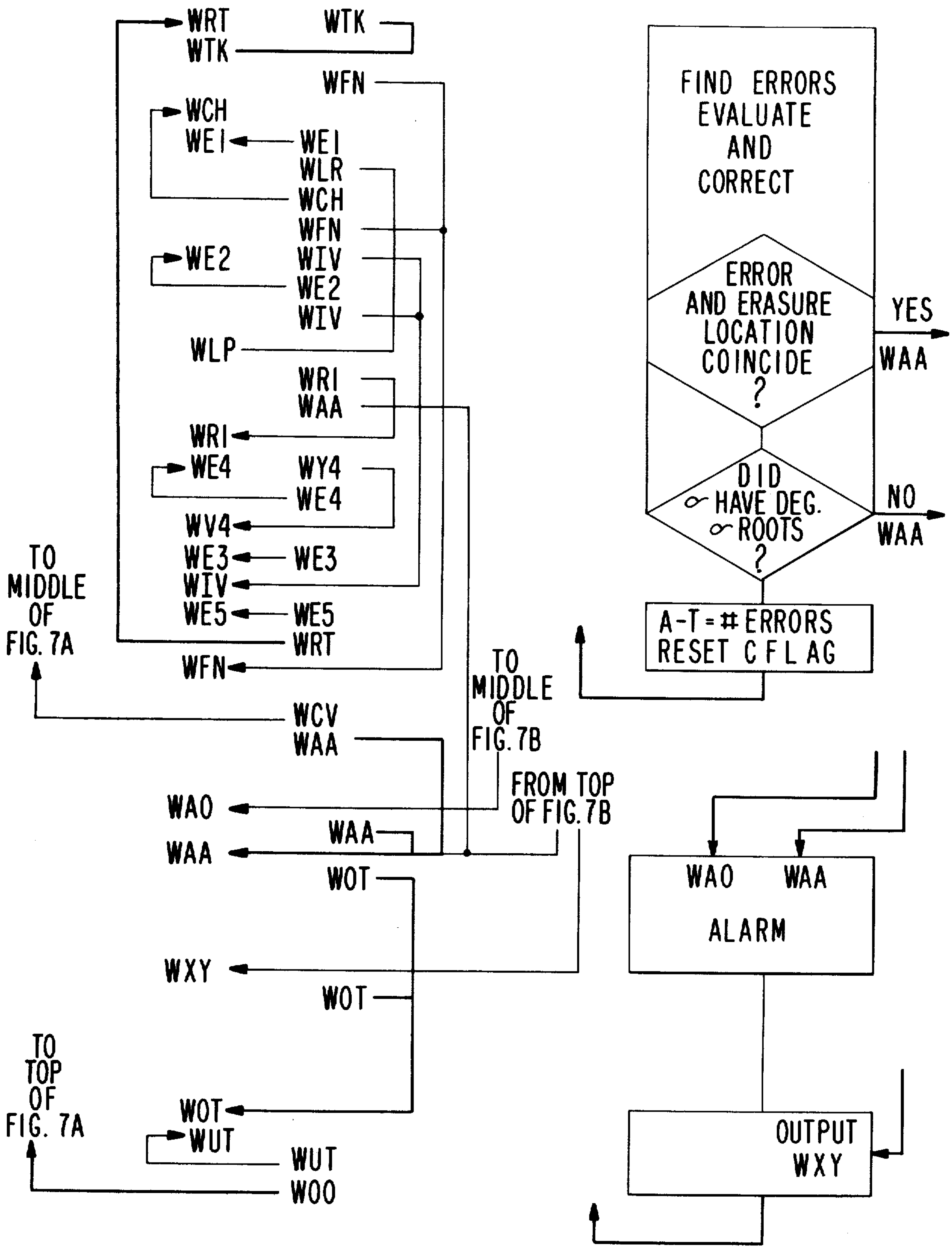

Turning now to FIGS. 6, 7A, 7B, and 7C, the preferred RS decoding program is further described. FIG. 6 is an overview flow chart of the program, indicating the major segmentation and alarm exits. FIGS. 7A, 7B, and 7C provide additional detail and correlation with the actual program coding. The format of the several FIGS. 7 is that of parallel flow charts.

The right hand block diagram concisely indicates the functional segmentation of the firmware while the parallel left hand flow chart details the transfer of control with respect to the significant symbolic addresses comprising each program segment. Unconditional branches are distinguished from conditional branches by the heavy lined arrows for the former and light lined arrows for the latter.

The symbolic source language program implementing the flow charts of FIGS. 6, 7A, 7B, and 7C is presented in Tables VIII and IX. One skilled in the art of programming will detect several features of the listing of these Tables which are artifacts of the process of program assembly for assisting the programmer. For example, the executable instructions comprising the program (Table IX) are preceded by a list, (Table VIIIA) describing the use of many of the individual locations (counter words) of the C memory 52 and another list (Table VIIIB) numerically defining symbolic konstants (in decimal). Of course, the symbolic addresses of FIGS. 7A, 7B, and 7C correlate with the symbolic addresses of the preferred program.

TABLE VIIIA

| DESCRIPTION OF SYMBOLIC NAMES | |
|---|---|
| bend | End point of bz. |
| bit | An index which keeps track of the number of bits converted within program segment CONVERT. |
| bl | Bottom left. |
| br | Bottom right. |
| bz | Bottom zero. |
| cflag | Flag to record whether erasure count or error count is being converted. |
| c1 | Volatile pointer used only in local context. |
| c2 | Another volatile pointer used only in local context. |
| c3 | Another volatile pointer used only in local context. |
| del | Used by SUGIY to maintain record of relationship between tz and bz. |
| errcount | Keeps a record of the number of roots of SIG(z) which have been found by CHORNEY. |
| firstin | Location in I/O buffer memory of the first input character. |
| fixed | An index used by CHORNEY to keep track of which received digits have been corrected. |
| gam | Used together with del by SUGIY. |
| lambot | Bottom location of the polynomial LAM. |
| lamj | Index to the coefficients of polynomial LAM. |
| lamtop | Top location of the array holding coefficients of polynomial LAM. |
| lastin | The location in I/O buffer memory which holds the last received character. |
| rvobot | Bottom location of the array holding coefficients of the polynomial reverse omega (RVO). |
| rvobotml | Rvobot - 1. |
| rvoj | Index pointing to the coefficients of the polynomial reverse omega (RVO). |
| rvotop | Location at the top of the array holding the coefficients of polynomial reverse omega (RVO). |
| sigbot | Bottom of the array holding coefficients of polynomial SIG. |
| sigtoppl | Sigtop + 1. |
| tend | Endpoint of tz. |
| tl | Top left. |
| tr | Top right. |
| trvobo | Used by CONVERT to record the parity of the number being converted; later needed at end of SUGIY to determine proper endpoints of polynomial reverse omega (RVO). |
| tz | Top zero. |
| xi | Index which runs through erasure list. |
| xtoppl | Pointer to location one past the top of the erasure list. |

TABLE VIII b DECIMAL VALUES OF KONSTANTS

```
#define kalarm0   305
#define kalarm9   306
#define kalarm17  308
#define kalarme   312
#define kok       288
#define kai       274
#define kal16     283
#define kal5      261
#define kal       258
#define kblm1      26
#define kblp2      29
#define kblp7      34
#define kblp8      35
#define kblp1      28
#define kbl        27
#define kbrm3      42
#define kbrm1      44
#define kbrm2      43
#define kbr        45
#define kerrloc   125
#define kfirstin  200
#define klam      123
#define klastin   230
```

```
#define klvp1     123
#define klv       122
#define knerase   121
#define knerr     120
#define kone      257
#define krbotp14   63
#define krbot      49
#define krtopm19   60
#define krtopm3    76
#define krtopp1    80
#define krtop      79
#define ktlp7      10
#define ktl         3
#define ktrm1      20
#define ktr        21
#define kxbotm1    79
#define kxbot      80
#define kzr       256
```

TABLE IX SYMBOLIC SOURCE LANGUAGE

```
w00:ub();g=0       ;                                a=krtop     ;if(h)goto hl;
/*  */ printf(" input= \n");
/*  emit last input (finally) */
    ub();g=0       ;             o=m[a];            a=lastin=klastin;if(h)goto hl;
    ub();g=0       ;                                a=kzr       ;if(h)goto hl;
    ub();g=0       ;     y=m[a];o=m[a];             a=lastin=klastin;if(h)goto hl;
    lb();g=0       ;                   v=r   ;      a=firstin=kfirstin;if(h)goto hl
/*  slow input of received word  */
    ub();g=0       ;                                a=lastin    ;if(h)goto hl;
    ub();g=0       ;                           t=a;a=firstin-1 ;if(h)goto hl;
    ub();g=0       ;                   m[a]=v;      a=c1=a      ;if(h)goto hl;
/* cosmetic output only */
w01:ub();g=a==t    ;                                             if(h)goto hl;
    ub();g=0       ;                                a=c1        ;if(h)goto hl;
    ub();g=a!=t&&ns;             o=m[a];                         if(h)goto  w03;
    ub();g=0       ;                                             if(h)goto hl;
    ub();g=1       ;                                             if(h)goto  w02;
    ub();g=0       ;                                             if(h)goto hl;
    ub();g=0       ;                                             if(h)goto  w01;
w02:ub();g=0       ;                   v=n() ;      a=++c1      ;if(h)goto hl;
    ub();g=0       ;                   m[a]=v;      a=c1        ;if(h)goto  w01;
/*                                                               */  goto hl;
w03:ub();g=0       ;                                a=c2=krtopp1;if(h)goto hl;
/* */ printf("\nxyz ");
/* */nc=0;
    uf();g=0       ;                                a=firstin   ;if(h)goto hl;
    uf();g=0       ;                           t=a;a=xtopp1=kxbotm1;if(h)goto hl;
    uf();g=0       ;                                a=kai       ;if(h)goto hl;
    uf();g=0       ;     y=m[a];                    a=kzr       ;if(h)goto hl;
    uf();g=0       ;             z=m[a];            a=lastin    ;if(h)goto hl;
    uf();g=0       ;                                a=c1=a      ;if(h)goto hl;
    uf();g=0       ;x=z ;        z=m[a];            a=kal       ;if(h)goto hl;
ws1:ff();g=0       ;x=y ;y=m[a];       v=r   ;      a=--c2      ;if(h)goto hl;
    uf();g=!z5()   ;                   m[a]=v;      a=kzr       ;if(h)goto  ws8;
ws2:lf();g=0       ;     y=r    ;z=m[a];v=r   ;     a=--c1      ;if(h)goto hl;
    uf();g=a==t    ;x=z ;        z=m[a];            a=kal       ;if(h)goto  ws1;
    uf();g=0       ;                                a=++xtopp1  ;if(h)goto hl;
    uf();g=1       ;                   m[a]=v;      a=kal       ;if(h)goto  ws7;
    ff();g=0       ;x=y ;y=m[a];       v=r   ;      a=--c2      ;if(h)goto hl;
    uf();g=!z5()   ;                   m[a]=v;      a=kzr       ;if(h)goto  ws2;
/*                                                               */  goto hl;
ws7:ff();g=0       ;x=y ;y=m[a];       v=r   ;      a=--c2      ;if(h)goto hl;
    uf();g=!z5()   ;                   m[a]=v;      a=kzr       ;if(h)goto  ws8;
ws8:lf();g=0       ;     y=m[a];       v=r   ;                   if(h)goto hl;
    uf();g=0       ;                                a=tz=ktl    ;if(h)goto  ws9;
    uf();g=0       ;                                a=++xtopp1  ;if(h)goto hl;
    uf();g=0       ;                   m[a]=v;                   if(h)goto hl;
ws9:uf();g=0       ;                                a=c2=krtopm19;if(h)goto hl;
/* */printf("\nreceived word =");
/* */lo(krbot,krtop);
/* */eo(krbot,krtop);
```

```
/* */printf("\nerasure list =");
/* */if(xtopp1>=kxbot) lo(kxbot,xtopp1);
/*begin syndrome calculations*/
    uf();g=0        ;                                  a=bz=kblm1  ;if(h)goto hl;
    uf();g=0        ;                                  a=kal16     ;if(h)goto hl;
    uf();g=0        ;          z=m[a];                 a=krtopm3   ;if(h)goto hl;
    uf();g=0        ;x=z ;                         t=a;a=c1=krbot  ;if(h)goto hl;
wsm:lf();g=1        ;          z=m[a];v=r    ;     a=++tz      ;if(h)goto hl;
    uf();g=1        ;                 m[a]=v;      a=++c1      ;if(h)goto hl;
wsn:ff();g=a!=t&&g ;     y=r   ;z=m[a];            a=++c1      ;if(h)goto   wsn;
    ff();g=0        ;     y=r   ;z=m[a];            a=kai       ;if(h)goto hl;
    ff();g=0        ;     y=m[a];     v=r    ;     a=++c2      ;if(h)goto hl;
    lf();g=a!=t;          y=r   ;                  a=kzr       ;if(h)goto hl;
    uf();g=0        ;x=y ;y=m[a];                  a=++bz      ;if(h)goto hl;
    uf();g=0        ;                 m[a]=v;      a=c1=krbot  ;if(h)goto   wsm;
    lf();g=0        ;     y=r   ;z=m[a];v=r    ;   a=++bz      ;if(h)goto hl;
/*end syndrome calculations*/
/* now have v==0,  y==0  */
    uf();g=0        ;                 m[a]=v;      a=++xtopp1  ;if(h)goto hl;
    uf();g=0        ;                 m[a]=v;      a=cflag=kblp8;if(h)goto hl;
    uf();g=0        ;                              a=kxbot     ;if(h)goto hl;
/*  */po();
/* */printf(" syndromes=");
/*  */lo(kbl,kbr-3);
    uf();g=0        ;                          t=a;a=xtopp1    ;if(h)goto hl;
/* begin conversion of a-t to binary value in v */
/* side effect will set bend = kblp8 +  (a-t)/2, rounded down */
/* side effect will set tend = ktlp8 +  (a-t)/2, rounded down */
/* side effect will also set trvobo = klv+1 if (a-t) even */
/* side effect will also set trvobo = klv+2 if (a-t) odd */
    uf();g=0        ;                              a=c1=a      ;if(h)goto hl;
/*  need y==0 on entry */
wcv:lf();g=0        ;                 v=r    ;     a=tend=ktlp7;if(h)goto hl;
    uf();g=0        ;                              a=bend=kblp7;if(h)goto hl;
    uf();g=0        ;                              a=kai       ;if(h)goto hl;
    uf();g=0        ;          z=m[a];             a=kal5      ;if(h)goto hl;
    uf();g=0        ;x=z ;     z=m[a];             a=bit=kblp2 ;if(h)goto hl;
    uf();g=0        ;                              a=c1        ;if(h)goto hl;
    uf();g=a==t     ;                              a=trvobo=klvp1;if(h)goto hl;
wcx:uf();g=0        ;                              a=--c1      ;if(h)goto hl;
    uf();g=a!=t;                                   a=++tend    ;if(h)goto   wxv;
    uf();g=0        ;                              a=--c1      ;if(h)goto hl;
    uf();g=a==t     ;                              a=++bend    ;if(h)goto   wcx;
    uf();g=0        ;                              a=++trvobo  ;if(h)goto hl;
    uf();g=1        ;                              a=kblp8     ;if(h)goto   wwx;
wwx:uf();g=0        ;                          t=a;a=u         ;if(h)goto hl;
    uf();g=0        ;                              a=bend      ;if(h)goto   wod;
/*                                                              */ goto hl;
wxv:uf();g=0        ;                              a=u         ;if(h)goto hl;
    uf();g=0        ;                              a=kblp8     ;if(h)goto   wwy;
wwy:uf();g=0        ;                          t=a;a=++bend    ;if(h)goto hl;
/*even*/
wev:lf();g=a==t     ;     y=r   ;                  a=c1=a      ;if(h)goto hl;
    uf();g=0        ;                              a=++bit     ;if(h)goto   wwb;
wwb:uf();g=0        ;                              a=c2=kblp7  ;if(h)goto   wdn;
wcw:uf();g=0        ;                              a=--c1      ;if(h)goto hl;
    uf();g=a!=t;                                   a=++c2      ;if(h)goto   wev;
    uf();g=0        ;                              a=--c1      ;if(h)goto hl;
    uf();g=a==t     ;                              a=c2        ;if(h)goto   wcw;
/*odd*/
wod:ff();g=a!=t;          y=r   ;     v=r    ;     a=c1=a      ;if(h)goto hl;
    uf();g=0        ;                              a=++bit     ;if(h)goto   wwv;
wwv:uf();g=0        ;                              a=c2=kblp7  ;if(h)goto   wcw;
/*ending*/
    uf();g=0        ;                              a=bit-1     ;if(h)goto hl;
    uf();g=a==t     ;                              a=++bit     ;if(h)goto hl;
    uf();g=a!=t&&!g;                               a=++bit     ;if(h)goto hl;
    uf();g=a!=t&&g ;                               a=++bit     ;if(h)goto   wdn;
/*finis*/
wfi:lf();g=a!=t&&g ;     y=r   ;     v=r    ;     a=++bit     ;if(h)goto   wfi;
/* end converter.  v now contains (a-t) in binary */
wdn:uf();g=0        ;                              a=cflag     ;if(h)goto hl;
    uf();g=a!=t;                                                if(h)goto hl;
    uf();g=0        ;                                           if(h)goto hl;
```

```
    uf();g=0        ;                                                if(h)goto   wxy;
    uf();g=!tv()    ;                                     a=kal      ;if(h)goto hl;
/* */ printf("\nerasure count = %d  ",v);
    uf();g=0        ;x=y ;y=m[a];                         a=a        ;if(h)goto hl;
    ff();g=0        ;     y=r   ;                         a=knerase  ;if(h)goto   wab;
    uf();g=y!=0     ;                     m[a]=v;         a=a        ;if(h)goto hl;
    uf();g=0        ;                                                 if(h)goto hl;
    uf();g=0        ;                                     a=kalarm17 ;if(h)goto   waa;
    uf();g=0        ;                                     a=knerase  ;if(h)goto hl;
wab:uf();g=0        ;                     m[a]=v;         a=kzr      ;if(h)goto hl;
    uf();g=0        ;     y=m[a];                         a=kone     ;if(h)goto hl;
/* next v=0 */
    lf();g=0        ;           z=m[a];v=r   ;                        if(h)goto hl;
    uf();g=0        ;                                     a=bl=kbl   ;if(h)goto hl;
    uf();g=0        ;                                     a=br=kbr   ;if(h)goto hl;
    uf();g=0        ;                     m[a]=v;         a=tz=ktrm1 ;if(h)goto hl;
    uf();g=0        ;                     m[a]=v;         a=bz=kbrm1 ;if(h)goto hl;
    uf();g=0        ;                     m[a]=v;         a=--bz     ;if(h)goto hl;
    uf();g=0        ;                     m[a]=v;         a=xtopp1   ;if(h)goto hl;
    uf();g=0        ;                     m[a]=v;         a=knerr    ;if(h)goto hl;
    uf();g=0        ;                     m[a]=v;                     if(h)goto hl;
/* next v=1 */
    ff();g=0        ;                     v=r   ;         a=tr=ktr   ;if(h)goto hl;
    uf();g=0        ;                     m[a]=v;         a=tl=ktl   ;if(h)goto hl;
    uf();g=0        ;                     m[a]=v;         a=klv      ;if(h)goto hl;
    uf();g=0        ;                     m[a]=v;                     if(h)goto hl;
/* */po();no=0;printf(" between firstpart and newss");
/* begin newss */
/*for (i=kxbot;i<=xtop;i++){y=m[i]; */
    uf();g=0        ;                                     a=c3=kxbotm1;if(h)goto hl;
    uf();g=0        ;                                     a=xtopp1   ;if(h)goto hl;
/* recall that m[xtopp1] is 0   */
wt8:uf();g=0        ;     y=m[a];                 t=a;a=++c3     ;if(h)goto hl;
    uf();g=a==t     ;x=y ;y=m[a];                         a=kblp1    ;if(h)goto hl;
    uf();g=0        ;                             t=a;a=u        ;if(h)goto hl;
    uf();g=0        ;                                     a=c2=kbrm3 ;if(h)goto   wta;
/* replace ssma by (1-x[i]z)ssma, where y holds x[i]  */
    uf();g=0        ;           z=m[a];                   a=c1=kbrm2 ;if(h)goto hl;
    uf();g=a!=t;                                          a=--c2     ;if(h)goto hl;
wt9:ff();g=0        ;x=z ;      z=m[a];v=r   ;            a=--c1     ;if(h)goto hl;
    uf();g=a!=t;                          m[a]=v;         a=--c2     ;if(h)goto   wt9;
    lf();g=0        ;                     v=r   ;         a=--c1     ;if(h)goto hl;
    uf();g=0        ;                     m[a]=v;         a=xtopp1   ;if(h)goto   wt8;
/*                                                                   */   goto hl;
wta:uf();g=0        ;                                     a=gam=klvp1 ;if(h)goto hl;
/* end newss and begin sugiy */
/* */printf("\nmodified syndromes =");
/* */lo(kbl,kbr-3);
    uf();g=0        ;                                     a=del=klv  ;if(h)goto hl;
/* gam-klv = tz - effective bz if positive, 0 otherwise */
/* del-klv = bz - effective tz if pos, 0 otherwise.  */
    uf();g=0        ;                                     a=tr       ;if(h)goto hl;
    uf();g=0        ;           z=m[a];                   a=c3=a     ;if(h)goto hl;
    uf();g=0        ;                                     a=bz       ;if(h)goto hl;
    uf();g=0        ;                             t=a;a=bend     ;if(h)goto hl;
wbg:uf();g=a==t     ;                                     a=++del    ;if(h)goto hl;
    uf();g=0        ;                                     a=bl       ;if(h)goto hl;
    uf();g=0        ;     y=m[a];                         a=tend     ;if(h)goto   wlx;
    uf();g=a==t     ;                                     a=bz       ;if(h)goto hl;
    uf();g=0        ;                                     a=c1=a     ;if(h)goto hl;
    uf();g=0        ;                                     a=kone     ;if(h)goto   wlx;
    uf();g=y==0     ;x=y ;y=m[a];                         a=br       ;if(h)goto hl;
    lf();g=0        ;     y=r   ;                         a=c2=a     ;if(h)goto hl;
    uf();g=0        ;x=y ;y=m[a];                         a=++gam    ;if(h)goto   wlq;
    uf();g=0        ;                                     a=del=a    ;if(h)goto hl;
    uf();g=0        ;                                     a=gam=klvp1 ;if(h)goto hl;
/* begin sub and invert1 */
    uf();g=0        ;                                     a=bl       ;if(h)goto hl;
    uf();g=0        ;     y=m[a];                         a=c2=a     ;if(h)goto hl;
/* begin invert1 */
    uf();g=0        ;x=y ;                                a=tz       ;if(h)goto hl;
    lf();g=0        ;sq();y=r   ;                         a=bz=a     ;if(h)goto hl;
    lf();g=0        ;sq();                        t=a;a=c1       ;if(h)goto hl;
    lf();g=0        ;sq();y=r   ;                         a=tz=a     ;if(h)goto hl;
```

```
    lf();g=0        ;sq();y=r   ;                     a=tl        ;if(h)goto hl;
    lf();g=0        ;     y=r   ;       v=r    ;      a=bl=a      ;if(h)goto hl;
/* end invert1 with y=v= inverse */
    uf();g=0        ;x=y ;y=m[a];                     a=c2        ;if(h)goto hl;
    lf();g=0        ;     y=r   ;                     a=tl=a      ;if(h)goto hl;
    uf();g=0        ;                                 a=klv       ;if(h)goto hl;
    uf();g=0        ;x=y ;              m[a]=v;       a=tr        ;if(h)goto hl;
    uf();g=0        ;                                 a=c2=a      ;if(h)goto hl;
    uf();g=0        ;                                 a=br        ;if(h)goto hl;
    uf();g=0        ;                                 a=tr=a      ;if(h)goto hl;
    uf();g=0        ;          z=m[a];                a=c3=a      ;if(h)goto hl;
    uf();g=0        ;                                 a=c2        ;if(h)goto hl;
    uf();g=0        ;     y=m[a];                     a=br=a      ;if(h)goto hl;
/* end sub */
wlq:uf();g=0        ;                                 a=tr+1      ;if(h)goto hl;
    uf();g=0        ;                                 a=c1=a      ;if(h)goto hl;
    uf();g=0        ;                                 a=--c2      ;if(h)goto hl;
/* affine works with c2>=t+1. fails with c2=t. */
/*  while (c2>=t)  m[--c1] = x*m[--c2]+ m[--c3];  */
/* begin loop of  affined */
wlt:ff();g=a!=t;          y=m[a];       v=r    ;      a=--c3      ;if(h)goto hl;
    ff();g=0        ;          z=m[a];                a=--c1      ;if(h)goto hl;
    ff();g=0        ;                   m[a]=v;       a=--c2      ;if(h)goto   wlt;
    ff();g=0        ;                   v=r    ;      a=--c1      ;if(h)goto hl;
    ff();g=0        ;                   m[a]=v;       a=tz        ;if(h)goto hl;
/* end affined */
/* */if(y!=0){ printf("\n affined bugged y. \n");lo(tl,tr);lo(bl,br);return;}
/*  since affineu fails with c=t, we cannot use the shortcut start */
/*  consisting of c=tl+1; b=bl; d=bl+1;  spare memory loc m[bl-1] is */
/*  therefore needed. it is zeroed but never referenced. */
/*  because of bl,tl swaps, m[tl-1] is likewise wasted. */
    uf();g=0        ;                           t=a;a=bl-1        ;if(h)goto hl;
    uf();g=0        ;                                 a=c3=a      ;if(h)goto hl;
    uf();g=0        ;                                 a=c3-1      ;if(h)goto hl;
    uf();g=0        ;                                 a=c1=a      ;if(h)goto hl;
    uf();g=0        ;                                 a=tl        ;if(h)goto hl;
    uf();g=0        ;                                 a=c2=a      ;if(h)goto hl;
/* begin affineu */
/* affineu works with c2<=t+1. fails with c2=t. */
/*  while (c2<=t)  m[++c1] = x*m[++c2]+ m[++c3];  */
    ff();g=0        ;     y=m[a];                     a=++c3      ;if(h)goto hl;
    ff();g=0        ;          z=m[a];                a=++c2      ;if(h)goto hl;
wlu:ff();g=a!=t;          y=m[a];       v=r    ;      a=++c3      ;if(h)goto hl;
    ff();g=0        ;          z=m[a];                a=++c1      ;if(h)goto hl;
    ff();g=0        ;                   m[a]=v;       a=++c2      ;if(h)goto   wlu;
    ff();g=0        ;                   v=r    ;      a=++c1      ;if(h)goto hl;
    ff();g=0        ;                   m[a]=v;       a=br+1      ;if(h)goto hl;
/* end affineu */
/* */if(y!=0){ printf("\n affineu bugged y. \n");lo(tl,tr);lo(bl,br);return;}
/* */if((m[bl-1]!=0)&&(m[bl-1]!=32))
/* */{printf("\nbugged m[bl-1]!=0. \n");lo(tl,tr);lo(bl,br);return;}
    uf();g=0        ;                           t=a;a=++c3        ;if(h)goto hl;
/* begin shift */
    ff();g=0        ;          z=m[a];                a=++c3      ;if(h)goto hl;
    ff();g=a!=t;               z=m[a];v=r    ;        a=++c1      ;if(h)goto hl;
wlh:ff();g=0        ;                   m[a]=v;       a=++c3      ;if(h)goto hl;
    ff();g=a!=t;               z=m[a];v=r    ;        a=++c1      ;if(h)goto   wlh;
/* next line sets v=0 */
    lf();g=0        ;                   v=r    ;      a=c1        ;if(h)goto hl;
    uf();g=0        ;                   m[a]=v;       a=klv       ;if(h)goto   wws;
/* end shift */
wws:uf();g=0        ;     y=m[a];               t=a;a=bl          ;if(h)goto hl;
    uf();g=0        ;x=y ;y=m[a];                     a=br        ;if(h)goto hl;
    lf();g=0        ;     y=r   ;                     a=c2=a      ;if(h)goto hl;
    uf();g=0        ;x=y ;y=m[a];                     a=--del     ;if(h)goto hl;
    uf();g=a!=t;                                      a=--bz      ;if(h)goto hl;
/* nc=0;printf("\nbz=%d,c3=%d,g=%d,del=%d,gam=%d\n",bz,c3,g,del,gam);*/
    uf();g=0        ;                           t=a;a=tr          ;if(h)goto hl;
    uf();g=0        ;          z=m[a];                a=c3=a      ;if(h)goto   wlq;
    uf();g=1        ;                                  if(h)goto hl;
    uf();g=0        ;                                  if(h)goto hl;
    uf();g=0        ;                                 a=bend      ;if(h)goto   wtg;
/*lo(tl,tr);lo(bl,br);  before goto prints all shifts of all new r's   */
wlx:uf();g=0        ;                                 a=trvobo-1  ;if(h)goto hl;
```

```
/*  end sugiy */
/* */nc=0;printf("\nhere are top and bot regs immediately after sugiy");
/* */lo(tl,tr);
/* */lo(bl,br);
/* */po();nc=0;printf(" between sugiy and rvo ");
/*  trvobo was set to klv+2 if odd erasures or klv+1 if even erasures */
    uf();g=0       ;                    t=a;a=bl-1       ;if(h)goto hl;
    uf();g=0       ;                        a=rvobot=a   ;if(h)goto hl;
/*begin singularity tests while setting degree of rvo*/
wrv:uf();g=0       ;                        a=--gam      ;if(h)goto hl;
    uf();g=a!=t;                            a=++rvobot   ;if(h)goto   wa0;
    uf();g=0       ;    y=m[a];                           if(h)goto hl;
    uf();g=y!=0    ;                                      if(h)goto   wrv;
    uf();g=0       ;                                      if(h)goto hl;
    uf();g=0       ;                                      if(h)goto   wwo;
wwo:uf();g=0       ;                        a=u          ;if(h)goto hl;
    uf();g=0       ;                        a=rvobot-1   ;if(h)goto hl;
    uf();g=0       ;                        a=rvobotm1=a;if(h)goto hl;
    uf();g=0       ;                        a=kone       ;if(h)goto hl;
/* notice that we assemble lambda onto no longer needed bot */
/* begin newlam */
    uf();g=0       ;    y=m[a];             a=c3=kxbotm1;if(h)goto hl;
    uf();g=0       ;x=y ;                   a=tl-1       ;if(h)goto hl;
    lf();g=0       ;            v=r    ;    a=lambot=a   ;if(h)goto hl;
/* now v=1 */
    uf();g=0       ;                        a=--lambot   ;if(h)goto hl;
/* must keep lamtop+2 != sigbot-1 in worst case */
    uf();g=0       ;            m[a]=v;     a=lamtop=a   ;if(h)goto hl;
    uf();g=0       ;                        a=--lamtop   ;if(h)goto hl;
    uf();g=0       ;                        a=--lamtop   ;if(h)goto hl;
    uf();g=0       ;                        a=xtopp1     ;if(h)goto hl;
/* recall that m[xtopp1] is 0   */
wt3:uf();g=0       ;    y=m[a];         t=a;a=++c3       ;if(h)goto hl;
    uf();g=a==t    ;x=y ;y=m[a];            a=++lamtop   ;if(h)goto hl;
    uf();g=0       ;                    t=a;a=lambot     ;if(h)goto hl;
    uf();g=0       ;                        a=c2=a       ;if(h)goto   wt5;
/* replace lambda by (1+x[i]z)lambda,  where y holds x[i]  */
    uf();g=0       ;        z=m[a];         a=lambot-1   ;if(h)goto hl;
    uf();g=0       ;                        a=c1=a       ;if(h)goto hl;
    uf();g=a!=t;                            a=++c2       ;if(h)goto hl;
wt4:ff();g=0       ;x=z ;   z=m[a];v=r   ;  a=++c1       ;if(h)goto hl;
    uf();g=a!=t;                m[a]=v;     a=++c2       ;if(h)goto   wt4;
    lf();g=0       ;            v=r    ;    a=++c1       ;if(h)goto hl;
    uf();g=0       ;            m[a]=v;     a=xtopp1     ;if(h)goto   wt3;
/* */ printf("a=%d,c1=%d,c2=%d,t=%d",a,c1,c2,t);              goto hl;
wt5:uf();g=0       ;                        a=++lamtop   ;if(h)goto hl;
    uf();g=0       ;                        a=kzr        ;if(h)goto hl;
    uf();g=0       ;    y=m[a];             a=kai        ;if(h)goto hl;
    lf();g=0       ;        z=m[a];v=r   ;  a=xtopp1+1   ;if(h)goto hl;
    uf();g=0       ;            m[a]=v;     a=lambot-1   ;if(h)goto hl;
    uf();g=0       ;            m[a]=v;     a=lamj=a     ;if(h)goto hl;
    ff();g=0       ;    y=r    ;v=r    ;    a=xtopp1     ;if(h)goto hl;
    uf();g=0       ;x=y ;       m[a]=v;     a=kerrloc    ;if(h)goto hl;
    uf();g=0       ;            m[a]=v;     a=xi=kxbot   ;if(h)goto hl;
/* end newlam and some of the initialization preparing for chorney */
/* */nc=0;printf("\nlambda =");
/* */lo(lambot,lamtop);
    uf();g=0       ;                        a=lastin+1   ;if(h)goto hl;
    uf();g=0       ;                        a=fixed=a    ;if(h)goto hl;
    uf();g=0       ;                        a=bz-1       ;if(h)goto hl;
    uf();g=0       ;                        a=rvotop=a   ;if(h)goto hl;
    uf();g=0       ;                        a=rvotop+1   ;if(h)goto hl;
    uf();g=0       ;                        a=rvoj=a     ;if(h)goto hl;
    uf();g=0       ;                        a=tr         ;if(h)goto hl;
    uf();g=0       ;                        a=sigtop=a   ;if(h)goto hl;
    uf();g=0       ;                        a=sigtop+1   ;if(h)goto hl;
    uf();g=0       ;                        a=sigtopp1=a;if(h)goto hl;
    uf();g=0       ;                        a=tz+1       ;if(h)goto hl;
    uf();g=0       ;                        a=sigbot=a   ;if(h)goto hl;
    uf();g=1       ;                                      if(h)goto hl;
    uf();g=0       ;                        a=sigtop-1   ;if(h)goto hl;
/* */po();nc=0;printf(" between newlam and chorney");
    uf();g=0       ;                    t=a;a=errcount=a;if(h)goto   wtk;
/* */ goto hl;
```

```
/* some initiallization is available via wrt to wtk.  if entered with*/
/* x or y == 0, then lamj, rvoj, and x are initiallized for free */
/*  */
/* since y,like x, still contains ai, this route into wtk will set g=0 */
/* begin chorney */
wrt;lf();g=0        ;      y=r    ;                   t=a;a=lambot-1   ;if(h)goto hl;
    uf();g=0        ;x=y ;                                 a=lamj=a     ;if(h)goto hl;
/* begin invert2 */
    lf();g=0        ;sq();y=r    ;                         a=rvotop+1   ;if(h)goto hl;
    lf();g=0        ;sq();                                 a=rvoj=a     ;if(h)goto hl;
    lf();g=0        ;sq();y=r    ;                         a=fixed      ;if(h)goto hl;
    lf();g=0        ;sq();y=r    ;z=m[a];                  a=u          ;if(h)goto hl;
    lf();g=0        ;      y=r    ;        v=r    ;        a=rvobotm1-1;if(h)goto hl;
/*    ends with y=v=r = 1/x    */
    uf();g=0        ;x=y ;y=m[a];                          a=kerrloc    ;if(h)goto hl;
    lf();g=0        ;                      v=r    ;        a=kerrloc    ;if(h)goto hl;
/* diagnostic interupt here will show error value in v */
/* */printf("\nsig,lam,rvo,errloc,errval,-,=");putlet(m[sigtop+2]);
/* */putlet(m[lamtop+2]);
/* */putlet(m[rvobot-2]);putlet(m[kerrloc]);putlet(v);printf("-=\n");
    ff();g=0        ;      y=m[a];         v=r    ;        a=kone       ;if(h)goto hl;
    uf();g=0        ;x=y ;y=m[a];                          a=kai        ;if(h)goto hl;
    uf();g=0        ;              z=m[a];                 a=fixed      ;if(h)goto hl;
    ff();g=0        ;      y=r    ;        m[a]=v;                       if(h)goto hl;
wtk:uf();g=y==0     ;                                      a=kal        ;if(h)goto hl;
    uf();g=0        ;      y=m[a];                         a=sigbot-1   ;if(h)goto hl;
    lf();g=0        ;      y=r    ;                        a=sigj=a     ;if(h)goto   wfn;
wch:uf();g=a!=t;     x=y ;y=m[a];                          a=++sigj     ;if(h)goto hl;
    uf();g=a!=t&&g ;               z=m[a];                 a=++sigj     ;if(h)goto hl;
we1:ff();g=a!=t&&g ;      y=r    ;z=m[a];v=r    ;          a=++sigj     ;if(h)goto   we1;
/* fallthru with v=y=poly(x)      */
/* save sig(x) for use at erasure evaluation */
/*revise to g= ns.or.os */
    uf();g=0        ;                      m[a]=v;         a=kone       ;if(h)goto hl;
    uf();g=y==0     ;      y=m[a];                         a=xi         ;if(h)goto hl;
/* revise to wio */
    lf();g=0        ;              z=m[a];v=r    ;         a=--fixed    ;if(h)goto hl;
    ff();g=0        ;      y=r    ;                        a=kerrloc    ;if(h)goto   wlr;
    uf();g=y!=0     ;                      m[a]=v;         a=kal        ;if(h)goto hl;
    uf();g=0        ;      y=m[a];                         a=sigbot-1   ;if(h)goto hl;
    lf();g=0        ;      y=r    ;                        a=sigj=a     ;if(h)goto   wch;
/* erasure evaluation  */
    uf();g=0        ;                                      a=++xi       ;if(h)goto hl;
    uf();g=0        ;      y=m[a];                         a=lamtop-1   ;if(h)goto hl;
    uf();g=y==0     ;                              t=a;a=lamj          ;if(h)goto hl;
/* this is test for end of everything with final digit correct*/
/* begin evalev2 */
    uf();g=0        ;      y=m[a];                         a=++lamj     ;if(h)goto hl;
    lf();g=a!=t;                   z=m[a];                 a=++lamj     ;if(h)goto   wfn;
we2:ff();g=a==t    ;      y=r    ;        v=r    ;         a=++lamj     ;if(h)goto   wiv;
    lf();g=a!=t&&!g;      y=r    ;z=m[a];v=r    ;          a=++lamj     ;if(h)goto   we2;
/* fallthrough with value in y and v   */
    uf();g=0        ;                                                    if(h)goto hl;
    uf();g=0        ;                                                    if(h)goto   wiv;
/* */                                                                         goto hl;
wlr:uf();g=y!=0     ;                      m[a]=v;         a=sigbot-1   ;if(h)goto hl;
/*  error evaluation */
/* begin evalev4 */
/*  start with a=polybot-1;  t=polytop-1; m[a]=0; assume deg poly >=1   */
    uf();g=0        ;      y=m[a];                         a=sigj=a     ;if(h)goto hl;
    uf();g=0        ;                                      a=--errcount;if(h)goto   wr1;
    uf();g=0        ;                                      a=++xi       ;if(h)goto hl;
    uf();g=0        ;      y=m[a];                                       if(h)goto hl;
    uf();g=y!=0     ;                                                    if(h)goto hl;
    uf();g=0        ;                                      a=sigbot-1   ;if(h)goto hl;
    uf();g=0        ;      y=m[a];                         a=kalarme    ;if(h)goto   waa;
wr1:uf();g=0        ;                                      a=++sigj     ;if(h)goto hl;
    lf();g=a!=t;                   z=m[a];                 a=++sigj     ;if(h)goto hl;
we4:ff();g=a==t    ;      y=r    ;        v=r    ;         a=++sigj     ;if(h)goto   wv4;
    lf();g=a!=t&&!g;      y=r    ;z=m[a];v=r    ;          a=++sigj     ;if(h)goto   we4;
/* fallthrough with value in y and v. after jump to here, also have g=1.  */
wv4:uf();g=0        ;                      m[a]=v;         a=lamtop-1   ;if(h)goto hl;
    uf();g=0        ;                              t=a;a=lamj          ;if(h)goto   ww4;
/* begin eval3 */
```

```
ww4:uf();g=a!=t;          y=m[a];                       a=++lamj    ;if(h)goto hl;
    uf();g=a!=t&&g ;               z=m[a];              a=++lamj    ;if(h)goto hl;
we3:ff();g=a!=t&&g ;      y=r    ;z=m[a];v=r    ;       a=++lamj    ;if(h)goto   we3;
/* fallthru with v=y=poly(x)        */
wiv:uf();g=0       ;                                    a=klam      ;if(h)goto hl;
    uf();g=0       ;                       m[a]=v;      a=rvobot+1  ;if(h)goto hl;
    uf();g=0       ;                             t=a;a=rvoj         ;if(h)goto hl;
/* begin reveval5 */
    uf();g=a!=t;          y=m[a];                       a=--rvoj    ;if(h)goto hl;
    uf();g=a!=t&&g ;               z=m[a];              a=--rvoj    ;if(h)goto hl;
we5:ff();g=a!=t&&g ;      y=r    ;z=m[a];v=r    ;       a=--rvoj    ;if(h)goto   we5;
/* fallthru with v=y=poly(x)        */
/* diagnostic storage */
    uf();g=1       ;                       m[a]=v;      a=klam      ;if(h)goto hl;
/* end reveval5 */
    uf();g=0       ;      y=m[a];                       a=sigtopp1+1;if(h)goto hl;
    uf();g=0       ;x=y ;y=m[a];                        a=sigtop-1  ;if(h)goto   wrt;
/* end chorney */
/*  */
/* */hl:g=h=gh=0;
/* */printf("help.  the controls on g are bugged.\n");return;
wfn:uf();g=0       ;                                    a=sigbot-1  ;if(h)goto hl;
/* */po();printf(" after chorney  ");
    uf();g=0       ;                             t=a;a=cflag=kbl ;if(h)goto   wwf;
wwf:uf();g=0       ;                                    a=errcount  ;if(h)goto hl;
    uf();g=a==t    ;                                    a=kzr       ;if(h)goto hl;
    uf();g=0       ;      y=m[a];                       a=sigtop-1  ;if(h)goto hl;
    uf();g=0       ;                                    a=c1=a      ;if(h)goto   wcv;
    uf();g=1       ;                                                 if(h)goto hl;
    uf();g=0       ;                                                 if(h)goto hl;
    uf();g=0       ;                                    a=kalarm9   ;if(h)goto   waa;
/*                                                               */     goto hl;
wxy:uf();g=0       ;                                    a=knerr     ;if(h)goto hl;
/*  */ printf("\n error count = %d ",v);
    uf();g=0       ;                       m[a]=v;      a=kok       ;if(h)  to hl;
    uf();g=1       ;      y=m[a];o=m[a];                a=firstin   ;if(h)goto hl;
    uf();g=0       ;                                    a=c1=a      ;if(h)goto hl;
    uf();g=0       ;                                    a=krbotp14  ;if(h)goto   wot;
wa0:uf();g=0       ;                                                 if(h)goto hl;
    uf();g=0       ;                                    a=kalarm0   ;if(h)goto   waa;
waa:uf();g=1       ;      y=m[a];o=m[a];                a=c1=krbot  ;if(h)goto hl;
    uf();g=0       ;                                    a=u         ;if(h)goto hl;
    uf();g=0       ;                                    a=krbotp14  ;if(h)goto   wot;
wot:uf();g=0       ;                             t=a;a=knerase      ;if(h)goto hl;
/* */po();printf(" o=%d ",o);
    ub();g=0       ;               o=m[a];              a=c2=krbot  ;if(h)goto hl;
/* */printf("s=%d ",o);
    ub();g=0       ;                                    a=knerr     ;if(h)goto hl;
    ub();g=0       ;               o=m[a];              a=c1        ;if(h)goto hl;
    ub();g=1       ;                                    a=c1        ;if(h)goto hl;
/* */printf("t=%d ",o);
wut:ub();g=0       ;               o=m[a];              a=++c2      ;if(h)goto hl;
/*ub()=uf()without printing*/
/*  */  if((o<=9)||((o>31)&&(o<42))) printf(" ");
/*  */  if(o<32) printf(" %d",o);
/*  */  if(o>31) printf(" %d",o-32);
    ub();g=a!=t;                                        a=++c1      ;if(h)goto   wut;
/*  */printf(" alldone\n");
/* */ printf("\nxyz ");
/* */lo(0,69);
/* */lo(70,139);
/* */lo(140,209);
/* */lo(210,279);
/* */lo(280,349);
/* */if(tl>tend){c3=tend;tend=bend;bend=c3;}
/* */printf("\n kxbot=%d xtopp1=%d xi=%d ",kxbot,xtopp1,xi);
/* */printf(" bz=%d,c3=%d,g=%d,del=%d,gam=%d",bz,c3,g,del,gam);
/* */printf("\n lambot=%d lamtop=%d ",lambot,lamtop);
/* */printf(" sigbot=%d sigtop=%d rvobot=%d rvotop=%d",sigbot,sigtop,rvobot,rvotop
/* */printf("\n tl=%d tz=%d tr=%d bl=%d bz=%d br=%d",tl,tz,tr,bl,bz,br);
/* */printf("\n xtopp1-kxbot=%d gam-del=%d ",xtopp1-kxbot,gam-del);
/* */printf(" rvobot-bl=%d rvotop-rvobot=%d ",rvobot-bl,rvotop-rvobot);
/* */printf(" bz-rvobot=%d\n bend-bz=%d ",bz-rvobot,bend-bz);
/* */printf(" lambot-tl=%d lamtop-lambot=%d ",lambot-tl,lamtop-lambot);
```

```
/* */printf(" tz-tend=%d sigbot-tz=%d ",tz-tend,sigbot-tz);
/* */printf("\n");
/* */printf(" sigtop-sigbot=%d tr-sigtop=%d ",sigtop-sigbot,tr-sigtop);
/* */printf(" bend-(bl+br)/2=%d ",bend-(bl+br)/2);
/* */printf("\n");
/* */printf("\n");
/* */ if(getchar()!='\n') {printf("bugged phase on input file\n");return;}
/* */ else printf(" input phase ok");
    uf();g=0        ;                                       if(h)goto hl;
    uf();g=0        ;                                       if(h)goto   w00;
/*                                                           */  goto hl;
/*  final lines serve only to flush ctom.c */
    uf();g=0        ;                                       if(h)goto   w00;
/* */ }
```

In the RS decoding program of FIGS. 6 and 7, the initial segement, INPUT, responds to the handshake signal NS and accepts each new input character as soon as it is declared ready. After 31 characters have been accepted, the program exits from the loop in INPUT and proceeds to the next segment.

The next segment, ERASLIST, copies the received word from one array in memory to another, and accumulates a count of the number of erased characters while doing so. This counter resides in the difference between a pair of words in the C memory, and is expressed in the GF($2^7$) arithmetic used by the address generator.

The next segment, SYNDROME, treats the received word as a polynominal and evaluates it at each of the points alpha, alpha$^2$, alpha$^3$, . . . alpha$^{15}$. The results of these evaluations are the syndrome characters of Equation 4, which are stored in scratch memory.

The program then sets a counter called CFLAG and loads the two C registers whose difference gives the erasure count into registers T and A.

The next segment of the program, called CONVERT, converts the difference between the GF($2^7$) expressions in the A and T registers into a 5-bit natural binary number which is accumulated in the arithmetic unit. BEND and TEND, the stopping points needed by SUGIY, are initialized as a by-product of this conversion. When the program exits from this segment, the result is in the V register.

The CFLAG is then examined to determine whether the program has just converted the erasure count or the error count. The first time CONVERT is executed, it converts the erasure count and the program then continues processing software segments sequentially.

The top bit of the V register is inspected to decide whether or not the erasure count is $\geqq 16$. If it is less, the program continues. Otherwise, a test is made to decide whether or not the erasure count is equal to 16. If it is not, the program jumps to an ALARM mode indicative of 17 or more erasures; otherwise the program continues.

The next segment of the program, called NEWSS, calculates the coefficients of the generating function for the modified syndrones, according to Equation 10.

Figure 8:
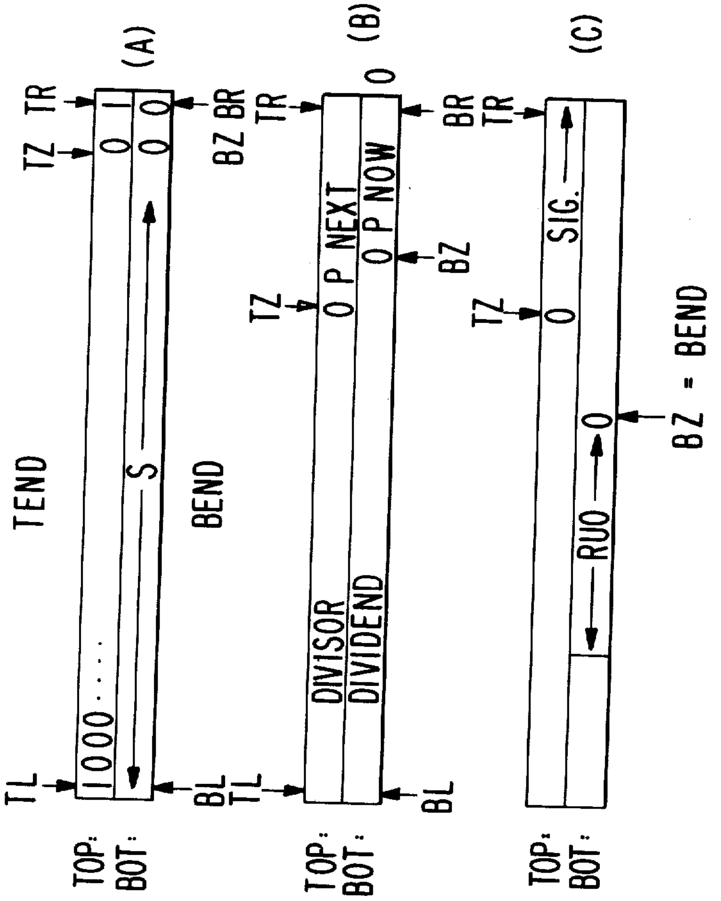
FIG. 8A, 8B and 8C illustrate the progression of content of arrays wherein polynomials sigma and reverse omega are developed by program segment SUGIY

The next program segment, called SUGIY, solves the key equation (Equation number 11 above). This is accomplished by careful iterations on a top and bottom "register" each of which is an array containing two polynomials separated by a comma as explained in Chapter 2 of my text (See FIG. 8.) However, in the present program commas are not placed between elements of the array as is done in the book, but instead the commas are on locations in the memory, in which are stored zeros. The pointer to the comma/zero in the bottom array is called BZ. Similarly, the pointer to the left endpoint of the bottom register is called BL and the bottom right endpoint is called BR. The initial format of these registers is shown in FIG. 8A. The software in the section of the program called SUGIY manipulates the top and bottom registers according to the Euclidean Algorithm for finding continued fractions. At a typical intermediate state during execution of SUGIY the conditions of the pointers and delimiters are as shown in FIG. 8B. As explained in Chapter 2 of my text, this algorithm terminates when the commas reach the endpoint conditions TEND or BEND. This condition is illustrated in FIG. 8C. When this termination occurs, the top register contains the coefficients of the error locator polynomial SIG between the top comma TZ and the top right endpoint TR. The bottom register then contains the coefficients of the polynomial omega between the bottom left endpoint BL and the bottom comma BZ. However, the omega polynomial is stored in reverse order, and is therefore called reverse omega or RVO.

The next program segment, RVO, sets the degree of Reverse Omega (the error evaluator polynomial which is formed by SUGIY), and also tests to see whether the key equation actually had a solution of valid degree. If it did not, then the program jumps to the ALARM mode.

Otherwise, the program continues to the next segment, NEWLAM, which constructs the erasure-locator polynomial according to Equation 7.

The next portion of the software is called CHORNEY (a contraction of the names Chien and Forney, who first presented the original theoretical pioneering work on decoding after sigma and omega are known). However, the version here implemented contains a number of recent innovations. Altogether, CHORNEY contains portions of code for evaluating five different polynomials. In practice, at most four of these polynomials will be evaluated at any particular point. However, it is instructive to consider all five evaluations. They are called EVAL1, EVAL3, and EVAL5, and EVALEV2 and EVALEV4. EVAL1 evaluates the polynomial SIG(X). EVAL3 evaluates the polynomial LAM(X). EVAL5 evaluates the polynomial RVO(X). EVALEV2 evaluates the even part of the polynomial SIG(X), and EVALEV4 evaluates the even part of the polynomial LAM(X). The even parts of SIG and LAM are useful because they correspond to the derivatives of SIG and LAM respectively. This arises from the fact that X times the derivative of a polynomial in a field of characteristic 2 is simply equal to its odd part. However, if derivatives are evaluated only at points at which the original polynomial vanishes, the only relevant cases are those in which the odd part and the even part are identical; thus it is sufficient to evaluate the even part of the polynomial instead of the odd part of the polynomial.

The overall structure of CHORNEY is a single main loop which processes each of the thirty-one non-zero characters in $GF(2^5)$ corresponding to the thirty-one locations of the (31,15) Reed-Solomon code. The location being processed resides in register X. First, CHORNEY evaluates the polynomial SIG(X) according to Equation 12. If it is zero, the control branches to location WLR, which is prepared to deal with an error which has been found. If SIG(X) is not zero, its value is stored and the program compares X with the next item on the erasure list to see whether X is an erased location. If it is not, then the program returns to the beginning of its major loop and considers the next value of X.

If the current value of X has been found to be in the location of an error, the program then evaluates the even part of SIG(X) as well as LAM(X) and RVO(X) and determines the value of the error via the following formula, which is a refinement of Equation 13.

$$errval = \frac{\omega(X)}{X \cdot (\sigma(X) \cdot \lambda(X))'} = \frac{\omega(X)}{X \cdot \sigma'(X)'\lambda(X)}$$

On the other hand, if the program deduces that the current value of X corresponds to an erasure location, then the program determines the value of this erased character via the formula $$errval = \frac{\omega(X)}{X \cdot (\sigma(X) \cdot \lambda(X))'} = \frac{\omega(X)}{X \cdot \sigma(X) \cdot \lambda'(X)}$$

Part of the very high speed of the present invention is due to the fact that it is able to evaluate all of these relevant polynomials so quickly. The evaluations of EVAL1 consist of a one-cycle inner loop, during which most of the components of the invention are active. The evaluation of the even part of a polynomial uses a two-cycle inner loop. CHORNEY exits after all 31 locations have been "corrected" in the copy of the received word which is stored in buffer memory. A count of the number of roots of SIG which CHORNEY actually found is also stored in the C memory. After exiting from CHORNEY, the number of roots of SIG in $GF(2^5)$ is compared with the degree of SIG, and the ALARM mode is entered if there is a discrepancy.

If there is no discrepancy, then CFLAG is reset, T and A registers are loaded with the two elements of $GF(2^7)$ whose value is the number of errors, and the program jumps to CONVERT.

CONVERT obtains the number of errors as a natural binary number in the V register. Upon exit, a test of CFLAG causes the program to jump to the OK output segment, where the program prepares to emit the corrected codeword residing in buffer memory.

If any of the tests for correctness fail, the program enters the ALARMS segment. Since this can occur when some incorrect "corrections" have been made on the copy of the received word in buffer memory, the ALARMS segment turns on the ALARM output and then prepares to emit the original unchanged copy of the received word residing in scratch memory as its output.

Both ALARMS and Output=OK segments are followed by OUTPUT, which emits a header of three characters (one ALARM word, then the erasure count as a natural binary number, then the error count as a natural binary member), then the first 15 characters of the corrected codeword (if the decoding was successful) or the first 15 characters of the original received word (if the ALARM condition is one, signifying detection of an errata pattern more severe than the code is capable of correcting).

After finishing OUTPUT, the program returns to INPUT to await the next word.

From the program set out in Table IX, it will be noticed that the address generator 5 may be utilized for certain purposes quite apart from furnishing addresses for the data memory. It will be recalled that shift register incrementation and decrementation, modulo $2^7-1$, can be performed in the address generator and equality may be tested and furnished as output together with the content of any counter word of C memory. As these operations may be executed concurrently and independently of operations in the arithmetic unit, the address generator may be employed for certain scratch pad and logic functions auxiliary to the operation of the arithmetic unit. An example of such use appears in the symbolic source code at location "WIN" where an element of C memory called "ERRCOUNT" is incremented to totalize the number of errors corrected; after processing a codeword, control passes to location "WIN" where the Test or T register is initialized to the degree of SIG(z) and the content of "ERRCOUNT" is tested for equality therewith. Non-equality indicates an alarm condition.

This invention features inner loops of length one. Thus all of the Chien search performed by the decoder is done in a single physical instruction, namely:

```
WE1:FF();G=A!=T&&G; Y=R; Z=M[A];

V=R; A=++C2; IF(H)GOTO WE1;
```

The hardware may execute this line of code many times consecutively. G remains 1 until A attains the same value as T. Then G becomes 0 because the logical condition A!=T is no longer true. Thereafter, G remains zero, because G=(A'=T) && G=1 && 0=0. Hence control falls out of this one-instruction loop after the third execution following the instruction at which A becomes equal to T.

There also occur in the program at Table IX some loops of length 2, as for example:

```
WE4:ff(); G=A==T     ; Y=R;          V=R ;      A=++C2        ;IF(H)GOTO     WV4;
    LF(); G=A!=T&&!G ; Y=R;  Z=M[A];V=R;       A=++C2        ;IF(H)GOTO     WE4;
WV4-UF(); G=O        ;                          A=LAMTOP-1    ;IF(H)GOTO HL:
    UF(); G=0        ;                    T=A;  A=KFACT       ;IF(H)GOTO     WW4;
```

This loop evaluates the even part of a polynomial. Control circulates around te loop of length two located at WE4 and the instruction following it, until the A register attains the value equal to T. On the third instruction following the occurrence of that equality, the program exits from the loop, either by falling out or by jumping to WV4, depending on the parity of T and the initial parity of C2 (an element of C memory).

Following the prescribed software technique outlined above, execution of the instruction at the line following WE4 sets H=1 and a branch back to WE4 will therefore occur due to the logical conditions determining G. On the final execution of the line at WE4, H=1 due to the condition A==T and a branch occurs outside the loop to WV4. When the initial contents of C2 and T have the other phase of parity, the final execution within the loop occurs on the line following WE4. Notice, however, that as the fallout occurs, H=0 and GH=0, but G=1. This G=1 condition creates another jump on the second instruction after the fallout due to the pipelined branching of the invention. When that line, beginning UF(), is executed, a jump is initiated. Since in fact this jump is not desired by the post-loop software, it is nullified by making its Whereto address (WW4) equal to the address of the next sequential instruction. This tactic of nullifying the effect of a previous execution of G=1 by executing a (harmless) jump to the next sequential instruction is used only rarely at several points in the program of Table IX. All next instruction Whereto addresses conventionally begin with two W's in order to distinguish these pseudo jumps from all real jump addresses which conventionally begin with only one W.

The semisymbolic listing appears in Table X below. The extreme left field contains the symbolic address of the symbolic source language text of Table IX. The next field, under the heading "PC=" contains the absolute address in control memory in the form "rom[pqr]= which is interpreted as "read only memory address pqr contains" where pqr is the absolute hexadecimal address in control memory. The content of the particular address (that is the ESK word) is then displayed in segments under headings here briefly indicated. The select X (sx) character may be y, respectively, z, q or –, for selecting the indicated register words Y, Z, $X^2$ or don't-care. The binary character !ix determines the content of the enable bit EX which places the result of any cycle in register 63 unless inhibited, at the end of that cycle.

The select R (sr) bit is next displayed: the value 0 selects R=X*Y and the value 1 selects R=X*Y+Z while – indicates a default condition. (Note that this is the SR0 bit; SR1 is not used by the preferred (31,15) Reed-Solomon decoding program.) The select Y character is next displayed: the source of data for Y from data memory is indicated by m, and from the R bus, by r. The binary enable Y (ey) character follows: 0 inhibits, and 1 enables the writing onto Y register 64. The bits select V, (lsv), enable V (ev), enable 0, (not inhibit 0, symbolically !io) and enable Z (!iz) occupy the next four columns. (See Table III and IV for definitions.) The select G hexadecimal character (sg) is next given. The select A character follows in the notation below:

k A loaded from k
P A loaded from content of $C_i$ incremented
m A loaded from content of $C_i$ decremented
O A loaded from content of $C_i$.

The enable C bit (ec) and enable M bit (em) follow in an obvious notation. The 5 bit C memory address (sc) is next given in symbolic notation. The next column, headed ed, contains the enable D bit (ed). (This bit is identical with the function of enabling the A register and is elsewhere called "EA" for notational convenience. The 1 state for ed enables new data to A register 50. The next column displays the T enable bit et=1 enables new data to T register 51. The final column displays the content of the konstant field in symbolic form.

TABLE X SEMI-SYMBOLIC PROGRAM

| ll: | pc = | sx!ix | srsyey | !svev!io!iz | sg | saecem | sc | sc4ed!itkp8 | kons |
|---|---|---|---|---|---|---|---|---|---|
| | rom[000]= | - 0 | - - 0 | 0 0 0 0 | 2 | - 0 0 | | 0 0 | |
| | rom[001]= | - 0 | - - 0 | 0 0 0 0 | 2 | - 0 0 | | 0 0 | |
| w00 | rom[002]= | - 0 | - - 0 | 0 0 0 0 | 2 | k 0 0 | | 1 0 | krtop |
| | rom[003]= | - 0 | - - 0 | 0 0 1 0 | 2 | k 1 0 | lastin | 1 0 | klastin |
| | rom[004]= | - 0 | - - 0 | 0 0 0 0 | 2 | k 0 0 | | 1 0 | kzr |
| | rom[005]= | - 0 | - m 1 | 0 0 1 0 | 2 | k 1 0 | lastin | 1 0 | klastin |
| | rom[006]= | - 0 | 0 - 0 | 0 1 0 0 | 2 | k 1 0 | firstin | 1 0 | kfirstin |
| | rom[007]= | - 0 | - - 0 | 0 0 0 0 | 2 | 0 0 0 | lastin | 1 0 | |
| | rom[008]= | - 0 | - - 0 | 0 0 0 0 | 2 | m 0 0 | firstin | 1 1 | |
| | rom[009]= | - 0 | - - 0 | 0 0 0 0 | 2 | m 1 1 | c1 | 0 0 | |
| w01 | rom[00a]= | - 0 | - - 0 | 0 0 0 0 | b | m 0 0 | | 0 0 | |
| | rom[00b]= | - 0 | - - 0 | 0 0 0 0 | 2 | 0 0 0 | c1 | 1 0 | w03 |
| | rom[00c]= | - 0 | - - 0 | 0 0 1 0 | 5 | 0 0 0 | | 0 0 | |
| | rom[00d]= | - 0 | - - 0 | 0 0 0 0 | 2 | 0 0 0 | | 0 0 | w02 |
| | rom[00e]= | - 0 | - - 0 | 0 0 0 0 | 0 | 0 0 0 | | 0 0 | |
| | rom[00f]= | - 0 | - - 0 | 0 0 0 0 | 2 | 0 0 0 | | 0 0 | w01 |
| | rom[010]= | - 0 | - - 0 | 0 0 0 0 | 2 | 0 0 0 | | 0 0 | |
| w02 | rom[011]= | - 0 | - - 0 | 1 1 0 0 | 2 | p 1 0 | c1 | 1 0 | w01 |
| | rom[012]= | - 0 | - - 0 | 0 0 0 0 | 2 | 0 0 1 | c1 | 1 0 | |
| w03 | rom[013]= | - 0 | - - 0 | 0 0 0 0 | 2 | k 1 0 | c2 | 1 0 | krtopp1 |
| | rom[014]= | - 0 | - - 0 | 0 0 0 0 | 2 | 0 0 0 | firstin | 1 0 | |
| | rom[015]= | - 0 | - - 0 | 0 0 0 0 | 2 | k 1 0 | xtopp1 | 1 1 | kxbotm1 |
| | rom[016]= | - 0 | - - 0 | 0 0 0 0 | 2 | k 0 0 | | 1 0 | kai |
| | rom[017]= | - 0 | - m 1 | 0 0 0 0 | 2 | k 0 0 | | 1 0 | kzr |
| | rom[018]= | - 0 | - - 0 | 0 0 0 1 | 2 | 0 0 0 | lastin | 1 0 | |
| | rom[019]= | - 0 | - - 0 | 0 0 0 0 | 2 | 0 1 0 | c1 | 0 0 | |
| | rom[01a]= | z 1 | - - 0 | 0 0 0 1 | 2 | k 0 0 | | 1 0 | kal |
| ws1 | rom[01b]= | y 1 | 1 m 1 | 0 1 0 0 | 2 | m 1 0 | c2 | 1 0 | ws8 |
| | rom[01c]= | - 0 | - - 0 | 0 0 0 0 | e | k 0 1 | | 1 0 | kzr |
| ws2 | rom[01d]= | - 0 | 0 r 1 | 0 1 0 1 | 2 | m 1 0 | c1 | 1 0 | ws1 |
| | rom[01e]= | z 1 | - - 0 | 0 0 0 1 | b | k 0 0 | | 1 0 | kal |

```
     rom[01f]=  -  0   - - 0   0 0  0  0   2   p 1 0   xtopp1    1  0 ws7
     rom[020]=  -  0   - - 0   0 0  0  0   0   k 0 1             1  0 kal
     rom[021]=  y  1   1 m 1   0 1  0  0   2   m 1 0   c2        1  0 ws2
     rom[022]=  -  0   - - 0   0 0  0  0   e   k 0 1             1  0 kzr
ws7  rom[023]=  y  1   1 m 1   0 1  0  0   2   m 1 0   c2        1  0 ws8
     rom[024]=  -  0   - - 0   0 0  0  0   e   k 0 1             1  0 kzr
ws8  rom[025]=  -  0   0 m 1   0 1  0  0   2   k 0 0             0  0 ws9
     rom[026]=  -  0   - - 0   0 0  0  0   2   k 1 0   tz        1  0 ktl
     rom[027]=  -  0   - - 0   0 0  0  0   2   p 1 0   xtopp1    1  0
     rom[028]=  -  0   - - 0   0 0  0  0   2   p 0 1             0  0
ws9  rom[029]=  -  0   - - 0   0 0  0  0   2   k 1 0   c2        1  0 krtopm19
     rom[02a]=  -  0   - - 0   0 0  0  0   2   k 1 0   bz        1  0 kblm1
     rom[02b]=  -  0   - - 0   0 0  0  0   2   k 0 0             1  0 kal16
     rom[02c]=  -  0   - - 0   0 0  0  1   2   k 0 0             1  0 krtopm3
     rom[02d]=  z  1   - - 0   0 0  0  0   2   k 1 0   c1        1  1 krbot
wsm  rom[02e]=  -  0   0 - 0   0 1  0  1   0   p 1 0   tz        1  0
     rom[02f]=  -  0   - - 0   0 0  0  0   0   p 1 1   c1        1  0 wsn
wsn  rom[030]=  -  0   1 r 1   0 0  0  1   7   p 1 0   c1        1  0
     rom[031]=  -  0   1 r 1   0 0  0  1   2   k 0 0             1  0 kai
     rom[032]=  -  0   1 m 1   0 1  0  0   2   p 1 0   c2        1  0
     rom[033]=  -  0   0 r 1   0 0  0  0   f   k 0 0             1  0 kzr
     rom[034]=  y  1   - m 1   0 0  0  0   2   p 1 0   bz        1  0 wsm
     rom[035]=  -  0   - - 0   0 0  0  0   2   k 1 1   c1        1  0 krbot
     rom[036]=  -  0   0 r 1   0 1  0  1   2   p 1 0   bz        1  0
     rom[037]=  -  0   - - 0   0 0  0  0   2   p 1 1   xtopp1    1  0
     rom[038]=  -  0   - - 0   0 0  0  0   2   k 1 1   cflag     1  0 kblp8
     rom[039]=  -  0   - - 0   0 0  0  0   2   k 0 0             1  0 kxbot
     rom[03a]=  -  0   - - 0   0 0  0  0   2   0 0 0   xtopp1    1  1
     rom[03b]=  -  0   - - 0   0 0  0  0   2   0 1 0   c1        0  0
wcv  rom[03c]=  -  0   0 - 0   0 1  0  0   2   k 1 0   tend      1  0 ktlp7
     rom[03d]=  -  0   - - 0   0 0  0  0   2   k 1 0   bend      1  0 kblp7
     rom[03e]=  -  0   - - 0   0 0  0  0   2   k 0 0             1  0 kai
     rom[03f]=  -  0   - - 0   0 0  0  1   2   k 0 0             1  0 kal5
     rom[040]=  z  1   - - 0   0 0  0  1   2   k 1 0   bit       1  0 kblp2
     rom[041]=  -  0   - - 0   0 0  0  0   2   0 0 0   c1        1  0
     rom[042]=  -  0   - - 0   0 0  0  0   b   k 1 0   trvobo    1  0 klvp1
wcx  rom[043]=  -  0   - - 0   0 0  0  0   2   m 1 0   c1        1  0 wxv
     rom[044]=  -  0   - - 0   0 0  0  0   f   p 1 0   tend      1  0
     rom[045]=  -  0   - - 0   0 0  0  0   2   m 1 0   c1        1  0 wcx
     rom[046]=  -  0   - - 0   0 0  0  0   b   p 1 0   bend      1  0
     rom[047]=  -  0   - - 0   0 0  0  0   2   p 1 0   trvobo    1  0 wwx
     rom[048]=  -  0   - - 0   0 0  0  0   0   k 0 0             1  0 kblp8
wwx  rom[049]=  -  0   - - 0   0 0  0  0   2   - 0 0             0  1 wod
     rom[04a]=  -  0   - - 0   0 0  0  0   2   0 0 0   bend      1  0
wxv  rom[04b]=  -  0   - - 0   0 0  0  0   2   - 0 0             0  0 wwy
     rom[04c]=  -  0   - - 0   0 0  0  0   2   k 0 0             1  0 kblp8
wwy  rom[04d]=  -  0   - - 0   0 0  0  0   2   p 1 0   bend      1  1
wev  rom[04e]=  -  0   0 r 1   0 0  0  0   b   p 1 0   c1        0  0 wwb
     rom[04f]=  -  0   - - 0   0 0  0  0   2   p 1 0   bit       1  0 wdn
wwb  rom[050]=  -  0   - - 0   0 0  0  0   2   k 1 0   c2        1  0 kblp7
wcw  rom[051]=  -  0   - - 0   0 0  0  0   2   m 1 0   c1        1  0 wev
     rom[052]=  -  0   - - 0   0 0  0  0   f   p 1 0   c2        1  0
     rom[053]=  -  0   - - 0   0 0  0  0   2   m 1 0   c1        1  0 wcw
     rom[054]=  -  0   - - 0   0 0  0  0   b   0 0 0   c2        1  0
wod  rom[055]=  -  0   1 r 1   0 1  0  0   f   0 1 0   c1        0  0 wwv
     rom[056]=  -  0   - - 0   0 0  0  0   2   p 1 0   bit       1  0 wcw
wwv  rom[057]=  -  0   - - 0   0 0  0  0   2   k 1 0   c2        1  0 kblp7
     rom[058]=  -  0   - - 0   0 0  0  0   2   m 0 0   bit       1  0
     rom[059]=  -  0   - - 0   0 0  0  0   b   p 1 0   bit       1  0
     rom[05a]=  -  0   - - 0   0 0  0  0   6   p 1 0   bit       1  0 wdn
     rom[05b]=  -  0   - - 0   0 0  0  0   7   p 1 0   bit       1  0 wfi
wfi  rom[05c]=  -  0   0 r 1   0 1  0  0   7   p 1 0   bit       1  0
wdn  rom[05d]=  -  0   - - 0   0 0  0  0   2   0 0 0   cflag     1  0
     rom[05e]=  -  0   - - 0   0 0  0  0   f   0 0 0             0  0
     rom[05f]=  -  0   - - 0   0 0  0  0   2   0 0 0             0  0 wxy
     rom[060]=  -  0   - - 0   0 0  0  0   2   0 0 0             0  0
     rom[061]=  -  0   - - 0   0 0  0  0   9   k 0 0             1  0 kal
     rom[062]=  y  1   - m 1   0 0  0  0   2   ? 0 0             0  0 wab
     rom[063]=  -  0   1 r 1   0 0  0  0   2   k 0 0             1  0 knerase
     rom[064]=  -  0   - - 0   0 0  0  0   c   ? 0 1             0  0
     rom[065]=  -  0   - - 0   0 0  0  0   2   ? 0 0             0  0 waa
     rom[065]=  -  0   - - 0   0 0  0  0   2   k 0 0             1  0 kalarm17
     rom[067]=  -  0   - - 0   0 0  0  0   2   k 0 0             1  0 knerase
wah  rom[068]=  -  0   - - 0   0 0  0  0   2   k 0 1             1  0 kzr
```

```
     rom[069]=  -  0   - m 1   0 0  0  0   2   k 0 0            1  0 kone
     rom[06a]=  -  0   0 - 0   0 1  0  1   2   k 0 0            0  0
     rom[06b]=  -  0   - - 0   0 0  0  0   2   k 1 0   bl       1  0 kbl
     rom[06c]=  -  0   - - 0   0 0  0  0   2   k 1 0   br       1  0 kbr
     rom[06d]=  -  0   - - 0   0 0  0  0   2   k 1 1   tz       1  0 ktrm1
     rom[06e]=  -  0   - - 0   0 0  0  0   2   k 1 1   bz       1  0 kbrm1
     rom[06f]=  -  0   - - 0   0 0  0  0   2   m 1 1   bz       1  0
     rom[070]=  -  0   - - 0   0 0  0  0   2   0 0 1   xtopp1   1  0
     rom[071]=  -  0   - - 0   0 0  0  0   2   k 0 1            1  0 knerr
     rom[072]=  -  0   - - 0   0 0  0  0   2   k 0 1            0  0
     rom[073]=  -  0   1 - 0   0 1  0  0   2   k 1 0   tr       1  0 ktr
     rom[074]=  -  0   - - 0   0 0  0  0   2   k 1 1   tl       1  0 ktl
     rom[075]=  -  0   - - 0   0 0  0  0   2   k 0 1            1  0 klv
     rom[076]=  -  0   - - 0   0 0  0  0   2   k 0 1            0  0
     rom[077]=  -  0   - - 0   0 0  0  0   2   k 1 0   c3       1  0 kxbotm1
     rom[078]=  -  0   - - 0   0 0  0  0   2   0 0 0   xtopp1   1  0
wt8  rom[079]=  -  0   - m 1   0 0  0  0   2   p 1 0   c3       1  1
     rom[07a]=  y  1   - m 1   0 0  0  0   b   k 0 0            1  0 kblp1
     rom[07b]=  -  0   - - 0   0 0  0  0   2   - 0 0            0  1 wta
     rom[07c]=  -  0   - - 0   0 0  0  0   2   k 1 0   c2       1  0 kbrm3
     rom[07d]=  -  0   - - 0   0 0  0  1   2   k 1 0   c1       1  0 kbrm2
     rom[07e]=  -  0   - - 0   0 0  0  0   f   m 1 0   c2       1  0
wt9  rom[07f]=  z  1   1 - 0   0 1  0  1   2   m 1 0   c1       1  0 wt9
     rom[080]=  -  0   - - 0   0 0  0  0   f   m 1 1   c2       1  0
     rom[081]=  -  0   0 - 0   0 1  0  0   2   m 1 0   c1       1  0 wt8
     rom[082]=  -  0   - - 0   0 0  0  0   2   0 0 1   xtopp1   1  0
wta  rom[083]=  -  0   - - 0   0 0  0  0   2   k 1 0   gam      1  0 klvp1
     rom[084]=  -  0   - - 0   0 0  0  0   2   k 1 0   del      1  0 klv
     rom[085]=  -  0   - - 0   0 0  0  0   2   0 0 0   tr       1  0
     rom[086]=  -  0   - - 0   0 0  0  1   2   0 1 0   c3       0  0
     rom[087]=  -  0   - - 0   0 0  0  0   2   0 0 0   bz       1  0
     rom[088]=  -  0   - - 0   0 0  0  0   2   0 0 0   bend     1  1
wbg  rom[089]=  -  0   - - 0   0 0  0  0   b   p 1 0   del      1  0
     rom[08a]=  -  0   - - 0   0 0  0  0   2   0 0 0   bl       1  0 wlx
     rom[08b]=  -  0   - m 1   0 0  0  0   2   0 0 0   tend     1  0
     rom[08c]=  -  0   - - 0   0 0  0  0   b   0 0 0   bz       1  0
     rom[08d]=  -  0   - - 0   0 0  0  0   2   0 1 0   c1       0  0 wlx
     rom[08e]=  -  0   - - 0   0 0  0  0   2   k 0 0            1  0 kone
     rom[08f]=  y  1   - m 1   0 0  0  0   8   0 0 0   br       1  0
     rom[090]=  -  0   0 r 1   0 0  0  0   2   0 1 0   c2       0  0 wlq
     rom[091]=  y  1   - m 1   0 0  0  0   2   p 1 0   gam      1  0
     rom[092]=  -  0   - - 0   0 0  0  0   2   p 1 0   del      0  0
     rom[093]=  -  0   - - 0   0 0  0  0   2   k 1 0   gam      1  0 klvp1
     rom[094]=  -  0   - - 0   0 0  0  0   2   0 0 0   bl       1  0
     rom[095]=  -  0   - m 1   0 0  0  0   2   0 1 0   c2       0  0
     rom[096]=  y  1   - - 0   0 0  0  0   2   0 0 0   tz       1  0
     rom[097]=  q  1   0 r 1   0 0  0  0   2   0 1 0   bz       0  0
     rom[098]=  q  1   0 - 0   0 0  0  0   2   0 0 0   c1       1  1
     rom[099]=  q  1   0 r 1   0 0  0  0   2   0 1 0   tz       0  0
     rom[09a]=  q  1   0 r 1   0 0  0  0   2   0 0 0   tl       1  0
     rom[09b]=  -  0   0 r 1   0 1  0  0   2   0 1 0   bl       0  0
     rom[09c]=  y  1   - m 1   0 0  0  0   2   0 0 0   c2       1  0
     rom[09d]=  -  0   0 r 1   0 0  0  0   2   0 1 0   tl       0  0
     rom[09e]=  -  0   - - 0   0 0  0  0   2   k 0 0            1  0 klv
     rom[09f]=  y  1   - - 0   0 0  0  0   2   0 0 1   tr       1  0
     rom[0a0]=  -  0   - - 0   0 0  0  0   2   0 1 0   c2       0  0
     rom[0a1]=  -  0   - - 0   0 0  0  0   2   0 0 0   br       1  0
     rom[0a2]=  -  0   - - 0   0 0  0  0   2   0 1 0   tr       0  0
     rom[0a3]=  -  0   - - 0   0 0  0  1   2   0 1 0   c3       0  0
     rom[0a4]=  -  0   - - 0   0 0  0  0   2   0 0 0   c2       1  0
     rom[0a5]=  -  0   - m 1   0 0  0  0   2   0 1 0   br       0  0
wlq  rom[0a6]=  -  0   - - 0   0 0  0  0   2   p 0 0   tr       1  0
     rom[0a7]=  -  0   - - 0   0 0  0  0   2   p 1 0   c1       0  0
     rom[0a8]=  -  0   - - 0   0 0  0  0   2   m 1 0   c2       1  0
wlt  rom[0a9]=  -  0   1 m 1   0 1  0  0   f   m 1 0   c3       1  0
     rom[0aa]=  -  0   1 - 0   0 0  0  1   2   m 1 0   c1       1  0 wlt
     rom[0ab]=  -  0   1 - 0   0 0  0  0   2   m 1 1   c2       1  0
     rom[0ac]=  -  0   1 - 0   0 1  0  0   2   m 1 0   c1       1  0
     rom[0ad]=  -  0   1 - 0   0 0  0  0   2   0 0 1   tz       1  0
     rom[0ae]=  -  0   - - 0   0 0  0  0   2   m 0 0   bl       1  1
     rom[0af]=  -  0   - - 0   0 0  0  0   2   m 1 0   c3       0  0
     rom[0b0]=  -  0   - - 0   0 0  0  0   2   m 0 0   c3       1  0
     rom[0b1]=  -  0   - - 0   0 0  0  0   2   m 1 0   c1       0  0
     rom[0b2]=  -  0   - - 0   0 0  0  0   2   0 0 0   tl       1  0
```

| | | | | | | | | | | | | | | | | | | |
|---|---|---|---|---|---|---|---|---|---|---|---|---|---|---|---|---|---|---|
| | rom[0b3]= | - | 0 | - - 0 | 0 | 0 | 0 | 0 | 2 | 0 | 1 | 0 | c2 | 0 | 0 | |
| | rom[0b4]= | - | 0 | 1 m 1 | 0 | 0 | 0 | 0 | 2 | p | 1 | 0 | c3 | 1 | 0 | |
| | rom[0b5]= | - | 0 | 1 - 0 | 0 | 0 | 0 | 1 | 2 | p | 1 | 0 | c2 | 1 | 0 | |
| wlu | rom[0b6]= | - | 0 | 1 m 1 | 0 | 1 | 0 | 0 | f | p | 1 | 0 | c3 | 1 | 0 | |
| | rom[0b7]= | - | 0 | 1 - 0 | 0 | 0 | 0 | 1 | 2 | p | 1 | 0 | c1 | 1 | 0 | wlu |
| | rom[0b8]= | - | 0 | 1 - 0 | 0 | 0 | 0 | 0 | 2 | p | 1 | 1 | c2 | 1 | 0 | |
| | rom[0b9]= | - | 0 | 1 - 0 | 0 | 1 | 0 | 0 | 2 | p | 1 | 0 | c1 | 1 | 0 | |
| | rom[0ba]= | - | 0 | 1 - 0 | 0 | 0 | 0 | 0 | 2 | p | 0 | 1 | br | 1 | 0 | |
| | rom[0bb]= | - | 0 | - - 0 | 0 | 0 | 0 | 0 | 2 | p | 1 | 0 | c3 | 1 | 1 | |
| | rom[0bc]= | - | 0 | 1 - 0 | 0 | 0 | 0 | 1 | 2 | p | 1 | 0 | c3 | 1 | 0 | |
| | rom[0bd]= | - | 0 | 1 - 0 | 0 | 1 | 0 | 1 | f | p | 1 | 0 | c1 | 1 | 0 | |
| wlh | rom[0be]= | - | 0 | 1 - 0 | 0 | 0 | 0 | 0 | 2 | p | 1 | 1 | c3 | 1 | 0 | wlh |
| | rom[0bf]= | - | 0 | 1 - 0 | 0 | 1 | 0 | 1 | f | p | 1 | 0 | c1 | 1 | 0 | |
| | rom[0c0]= | - | 0 | 0 - 0 | 0 | 1 | 0 | 0 | 2 | 0 | 0 | 0 | c1 | 1 | 0 | wws |
| | rom[0c1]= | - | 0 | - - 0 | 0 | 0 | 0 | 0 | 2 | k | 0 | 1 | | 1 | 0 | klv |
| wws | rom[0c2]= | - | 0 | - m 1 | 0 | 0 | 0 | 0 | 2 | 0 | 0 | 0 | bl | 1 | 1 | |
| | rom[0c3]= | y | 1 | - m 1 | 0 | 0 | 0 | 0 | 2 | 0 | 0 | 0 | br | 1 | 0 | |
| | rom[0c4]= | - | 0 | 0 r 1 | 0 | 0 | 0 | 0 | 2 | 0 | 1 | 0 | c2 | 0 | 0 | |
| | rom[0c5]= | y | 1 | - m 1 | 0 | 0 | 0 | 0 | 2 | m | 1 | 0 | del | 1 | 0 | |
| | rom[0c6]= | - | 0 | - - 0 | 0 | 0 | 0 | 0 | f | m | 1 | 0 | bz | 1 | 0 | |
| | rom[0c7]= | - | 0 | - - 0 | 0 | 0 | 0 | 0 | 2 | 0 | 0 | 0 | tr | 1 | 1 | wlq |
| | rom[0c8]= | - | 0 | - - 0 | 0 | 0 | 0 | 1 | 2 | 0 | 1 | 0 | c3 | 0 | 0 | |
| | rom[0c9]= | - | 0 | - - 0 | 0 | 0 | 0 | 0 | 0 | 0 | 0 | 0 | | 0 | 0 | |
| | rom[0ca]= | - | 0 | - - 0 | 0 | 0 | 0 | 0 | 2 | 0 | 0 | 0 | | 0 | 0 | wbg |
| | rom[0cb]= | - | 0 | - - 0 | 0 | 0 | 0 | 0 | 2 | 0 | 0 | 0 | bend | 1 | 0 | |
| wlx | rom[0cc]= | - | 0 | - - 0 | 0 | 0 | 0 | 0 | 2 | m | 0 | 0 | trvobo | 1 | 0 | |
| | rom[0cd]= | - | 0 | - - 0 | 0 | 0 | 0 | 0 | 2 | m | 0 | 0 | bl | 1 | 1 | |
| | rom[0ce]= | - | 0 | - - 0 | 0 | 0 | 0 | 0 | 2 | m | 1 | 0 | rvobot | 0 | 0 | |
| wrv | rom[0cf]= | - | 0 | - - 0 | 0 | 0 | 0 | 0 | 2 | m | 1 | 0 | cam | 1 | 0 | wa0 |
| | rom[0d0]= | - | 0 | - - 0 | 0 | 0 | 0 | 0 | f | p | 1 | 0 | rvobot | 1 | 0 | |
| | rom[0d1]= | - | 0 | - m 1 | 0 | 0 | 0 | 0 | 2 | p | 0 | 0 | | 0 | 0 | wrv |
| | rom[0d2]= | - | 0 | - - 0 | 0 | 0 | 0 | 0 | c | p | 0 | 0 | | 0 | 0 | |
| | rom[0d3]= | - | 0 | - - 0 | 0 | 0 | 0 | 0 | 2 | p | 0 | 0 | | 0 | 0 | wwo |
| | rom[0d4]= | - | 0 | - - 0 | 0 | 0 | 0 | 0 | 2 | p | 0 | 0 | | 0 | 0 | |
| wwo | rom[0d5]= | - | 0 | - - 0 | 0 | 0 | 0 | 0 | 2 | - | 0 | 0 | | 0 | 0 | |
| | rom[0d6]= | - | 0 | - - 0 | 0 | 0 | 0 | 0 | 2 | m | 0 | 0 | rvobot | 1 | 0 | |
| | rom[0d7]= | - | 0 | - - 0 | 0 | 0 | 0 | 0 | 2 | m | 1 | 0 | rvobotm1 | 0 | 0 | |
| | rom[0d8]= | - | 0 | - - 0 | 0 | 0 | 0 | 0 | 2 | k | 0 | 0 | | 1 | 0 | kone |
| | rom[0d9]= | - | 0 | - m 1 | 0 | 0 | 0 | 0 | 2 | k | 1 | 0 | c3 | 1 | 0 | kxbotm1 |
| | rom[0da]= | y | 1 | - - 0 | 0 | 0 | 0 | 0 | 2 | m | 0 | 0 | tl | 1 | 0 | |
| | rom[0db]= | - | 0 | 0 - 0 | 0 | 1 | 0 | 0 | 2 | m | 1 | 0 | lambot | 0 | 0 | |
| | rom[0dc]= | - | 0 | - - 0 | 0 | 0 | 0 | 0 | 2 | m | 1 | 0 | lambot | 1 | 0 | |
| | rom[0dd]= | - | 0 | - - 0 | 0 | 0 | 0 | 0 | 2 | m | 1 | 1 | lamtop | 0 | 0 | |
| | rom[0de]= | - | 0 | - - 0 | 0 | 0 | 0 | 0 | 2 | m | 1 | 0 | lamtop | 1 | 0 | |
| | rom[0df]= | - | 0 | - - 0 | 0 | 0 | 0 | 0 | 2 | m | 1 | 0 | lamtop | 1 | 0 | |
| | rom[0e0]= | - | 0 | - - 0 | 0 | 0 | 0 | 0 | 2 | 0 | 0 | 0 | xtopp1 | 1 | 0 | |
| wt3 | rom[0e1]= | - | 0 | - m 1 | 0 | 0 | 0 | 0 | 2 | p | 1 | 0 | c3 | 1 | 1 | |
| | rom[0e2]= | y | 1 | - m 1 | 0 | 0 | 0 | 0 | b | p | 1 | 0 | lamtop | 1 | 0 | |
| | rom[0e3]= | - | 0 | - - 0 | 0 | 0 | 0 | 0 | 2 | 0 | 0 | 0 | lambot | 1 | 1 | wt5 |
| | rom[0e4]= | - | 0 | - - 0 | 0 | 0 | 0 | 0 | 2 | 0 | 1 | 0 | c2 | 0 | 0 | |
| | rom[0e5]= | - | 0 | - - 0 | 0 | 0 | 0 | 1 | 2 | m | 0 | 0 | lambot | 1 | 0 | |
| | rom[0e6]= | - | 0 | - - 0 | 0 | 0 | 0 | 0 | 2 | m | 1 | 0 | c1 | 0 | 0 | |
| | rom[0e7]= | - | 0 | - - 0 | 0 | 0 | 0 | 0 | f | p | 1 | 0 | c2 | 1 | 0 | |
| wt4 | rom[0e8]= | z | 1 | 1 - 0 | 0 | 1 | 0 | 1 | 2 | p | 1 | 0 | c1 | 1 | 0 | wt4 |
| | rom[0e9]= | - | 0 | - - 0 | 0 | 0 | 0 | 0 | f | p | 1 | 1 | c2 | 1 | 0 | |
| | rom[0ea]= | - | 0 | 0 - 0 | 0 | 1 | 0 | 0 | 2 | p | 1 | 0 | c1 | 1 | 0 | wt3 |
| | rom[0eb]= | - | 0 | - - 0 | 0 | 0 | 0 | 0 | 2 | 0 | 0 | 1 | xtopp1 | 1 | 0 | |
| wt5 | rom[0ec]= | - | 0 | - - 0 | 0 | 0 | 0 | 0 | 2 | p | 1 | 0 | lamtop | 1 | 0 | |
| | rom[0ed]= | - | 0 | - - 0 | 0 | 0 | 0 | 0 | 2 | k | 0 | 0 | | 1 | 0 | kzr |
| | rom[0ee]= | - | 0 | - m 1 | 0 | 0 | 0 | 0 | 2 | k | 0 | 0 | | 1 | 0 | kai |
| | rom[0ef]= | - | 0 | 0 - 0 | 0 | 1 | 0 | 1 | 2 | p | 0 | 0 | xtopp1 | 1 | 0 | |
| | rom[0f0]= | - | 0 | - - 0 | 0 | 0 | 0 | 0 | 2 | m | 0 | 1 | lambot | 1 | 0 | |
| | rom[0f1]= | - | 0 | - - 0 | 0 | 0 | 0 | 0 | 2 | m | 1 | 1 | lamj | 0 | 0 | |
| | rom[0f2]= | - | 0 | 1 r 1 | 0 | 1 | 0 | 0 | 2 | 0 | 0 | 0 | xtopp1 | 1 | 0 | |
| | rom[0f3]= | y | 1 | - - 0 | 0 | 0 | 0 | 0 | 2 | k | 0 | 1 | | 1 | 0 | kerrloc |
| | rom[0f4]= | - | 0 | - - 0 | 0 | 0 | 0 | 0 | 2 | k | 1 | 1 | xi | 1 | 0 | kxbot |
| | rom[0f5]= | - | 0 | - - 0 | 0 | 0 | 0 | 0 | 2 | p | 0 | 0 | lastin | 1 | 0 | |
| | rom[0f6]= | - | 0 | - - 0 | 0 | 0 | 0 | 0 | 2 | p | 1 | 0 | fixed | 0 | 0 | |
| | rom[0f7]= | - | 0 | - - 0 | 0 | 0 | 0 | 0 | 2 | m | 0 | 0 | bz | 1 | 0 | |
| | rom[0f8]= | - | 0 | - - 0 | 0 | 0 | 0 | 0 | 2 | m | 1 | 0 | rvotop | 0 | 0 | |
| | rom[0f9]= | - | 0 | - - 0 | 0 | 0 | 0 | 0 | 2 | p | 0 | 0 | rvotop | 1 | 0 | |
| | rom[0fa]= | - | 0 | - - 0 | 0 | 0 | 0 | 0 | 2 | p | 1 | 0 | rvoj | 0 | 0 | |
| | rom[0fb]= | - | 0 | - - 0 | 0 | 0 | 0 | 0 | 2 | 0 | 0 | 0 | tr | 1 | 0 | |
| | rom[0fc]= | - | 0 | - - 0 | 0 | 0 | 0 | 0 | 2 | 0 | 1 | 0 | sigtop | 0 | 0 | |

```
     rom[0fd]=  -  0   - - 0   0 0  0  0   2   p 0 0   sigtop     1  0
     rom[0fe]=  -  0   - - 0   0 0  0  0   2   p 1 0   sigtopp1   0  0
     rom[0ff]=  -  0   - - 0   0 0  0  0   2   p 0 0   tz         1  0
     rom[100]=  -  0   - - 0   0 0  0  0   2   p 1 0   sigbot     0  0
     rom[101]=  -  0   - - 0   0 0  0  0   0   p 0 0              0  0
     rom[102]=  -  0   - - 0   0 0  0  0   2   m 0 0   sigtop     1  0 wtk
     rom[103]=  -  0   - - 0   0 0  0  0   2   m 1 0   errcount   0  1
wrt  rom[104]=  -  0   0 r 1   0 0  0  0   2   m 0 0   lambot     1  1
     rom[105]=  y  1   - - 0   0 0  0  0   2   m 1 0   lamj       0  0
     rom[106]=  q  1   0 r 1   0 0  0  0   2   p 0 0   rvotop     1  0
     rom[107]=  q  1   0 - 0   0 0  0  0   2   p 1 0   rvoj       0  0
     rom[108]=  q  1   0 r 1   0 0  0  0   2   0 0 0   fixed      1  0
     rom[109]=  q  1   0 r 1   0 0  0  1   2   - 0 0              0  0
     rom[10a]=  -  0   0 r 1   0 1  0  0   2   m 0 0   rvobotm1   1  0
     rom[10b]=  y  1   - m 1   0 0  0  0   2   k 0 0              1  0 kerrloc
     rom[10c]=  -  0   0 - 0   0 1  0  0   2   k 0 0              1  0 kerrloc
     rom[10d]=  -  0   1 m 1   0 1  0  0   2   k 0 0              1  0 kone
     rom[10e]=  y  1   - m 1   0 0  0  0   2   k 0 0              1  0 kai
     rom[10f]=  -  0   - - 0   0 0  0  1   2   0 0 0   fixed      1  0
     rom[110]=  -  0   1 r 1   0 0  0  0   2   0 0 1              0  0
wtk  rom[111]=  -  0   - - 0   0 0  0  0   8   k 0 0              1  0 kal
     rom[112]=  -  0   - m 1   0 0  0  0   2   m 0 0   sigbot     1  0 wfn
     rom[113]=  -  0   0 r 1   0 0  0  0   2   m 1 0   sigj       0  0
wch  rom[114]=  y  1   - m 1   0 0  0  0   f   p 1 0   sigj       1  0
     rom[115]=  -  0   - - 0   0 0  0  1   7   p 1 0   sigj       1  0 we1
we1  rom[116]=  -  0   1 r 1   0 1  0  1   7   p 1 0   sigj       1  0
     rom[117]=  -  0   - - 0   0 0  0  0   2   k 0 1              1  0 kone
     rom[118]=  -  0   - m 1   0 0  0  0   8   0 0 0   xi         1  0
     rom[119]=  -  0   0 - 0   0 1  0  1   2   m 1 0   fixed      1  0 wlr
     rom[11a]=  -  0   1 r 1   0 0  0  0   2   k 0 0              1  0 kerrloc
     rom[11b]=  -  0   - - 0   0 0  0  0   c   k 0 1              1  0 kal
     rom[11c]=  -  0   - m 1   0 0  0  0   2   m 0 0   sigbot     1  0 wch
     rom[11d]=  -  0   0 r 1   0 0  0  0   2   m 1 0   sigj       0  0
     rom[11e]=  -  0   - - 0   0 0  0  0   2   p 1 0   xi         1  0
     rom[11f]=  -  0   - m 1   0 0  0  0   2   m 0 0   lamtop     1  0
     rom[120]=  -  0   - - 0   0 0  0  0   8   0 0 0   lamj       1  1
     rom[121]=  -  0   - m 1   0 0  0  0   2   p 1 0   lamj       1  0 wfn
     rom[122]=  -  0   0 - 0   0 0  0  1   f   p 1 0   lamj       1  0 wiv
we2  rom[123]=  -  0   1 r 1   0 1  0  0   b   p 1 0   lamj       1  0 we2
     rom[124]=  -  0   0 r 1   0 1  0  1   6   p 1 0   lamj       1  0
     rom[125]=  -  0   - - 0   0 0  0  0   2   p 0 0              0  0 wiv
     rom[126]=  -  0   - - 0   0 0  0  0   2   p 0 0              0  0
wlr  rom[127]=  -  0   - - 0   0 0  0  0   c   m 0 1   sigbot     1  0
     rom[128]=  -  0   - m 1   0 0  0  0   2   m 1 0   sigj       0  0 wr1
     rom[129]=  -  0   - - 0   0 0  0  0   2   m 1 0   errcount   1  0
     rom[12a]=  -  0   - - 0   0 0  0  0   2   p 1 0   xi         1  0
     rom[12b]=  -  0   - m 1   0 0  0  0   2   p 0 0              0  0
     rom[12c]=  -  0   - - 0   0 0  0  0   c   p 0 0              0  0
     rom[12d]=  -  0   - - 0   0 0  0  0   2   m 0 0   sigbot     1  0 waa
     rom[12e]=  -  0   - m 1   0 0  0  0   2   k 0 0              1  0 kalarme
wr1  rom[12f]=  -  0   - - 0   0 0  0  0   2   p 1 0   sigj       1  0
     rom[130]=  -  0   0 - 0   0 0  0  1   f   p 1 0   sigj       1  0 wv4
we4  rom[131]=  -  0   1 r 1   0 1  0  0   b   p 1 0   sigj       1  0 we4
     rom[132]=  -  0   0 r 1   0 1  0  1   6   p 1 0   sigj       1  0
wv4  rom[133]=  -  0   - - 0   0 0  0  0   2   m 0 1   lamtop     1  0 ww4
     rom[134]=  -  0   - - 0   0 0  0  0   2   0 0 0   lamj       1  1
ww4  rom[135]=  -  0   - m 1   0 0  0  0   f   p 1 0   lamj       1  0
     rom[136]=  -  0   - - 0   0 0  0  1   7   p 1 0   lamj       1  0 we3
we3  rom[137]=  -  0   1 r 1   0 1  0  1   7   p 1 0   lamj       1  0
wiv  rom[138]=  -  0   - - 0   0 0  0  0   2   k 0 0              1  0 klam
     rom[139]=  -  0   - - 0   0 0  0  0   2   p 0 1   rvobot     1  0
     rom[13a]=  -  0   - - 0   0 0  0  0   2   0 0 0   rvoj       1  1
     rom[13b]=  -  0   - m 1   0 0  0  0   f   m 1 0   rvoj       1  0
     rom[13c]=  -  0   - - 0   0 0  0  1   7   m 1 0   rvoj       1  0 we5
we5  rom[13d]=  -  0   1 r 1   0 1  0  1   7   m 1 0   rvoj       1  0
     rom[13e]=  -  0   - - 0   0 0  0  0   0   k 0 1              1  0 klam
     rom[13f]=  -  0   - m 1   0 0  0  0   2   p 0 0   sigtopp1   1  0 wrt
     rom[140]=  y  1   - m 1   0 0  0  0   2   m 0 0   sigtop     1  0
wfn  rom[141]=  -  0   - - 0   0 0  0  0   2   m 0 0   sigbot     1  0 wwf
     rom[142]=  -  0   - - 0   0 0  0  0   2   k 1 0   cflag      1  1 kbl
wwf  rom[143]=  -  0   - - 0   0 0  0  0   2   0 0 0   errcount   1  0
     rom[144]=  -  0   - - 0   0 0  0  0   b   k 0 0              1  0 kzr
     rom[145]=  -  0   - m 1   0 0  0  0   2   m 0 0   sigtop     1  0 wcv
     rom[146]=  -  0   - - 0   0 0  0  0   2   m 1 0   c1         0  0
```

```
     rom[147]=  -  0  - - 0  0 0  0  0  0  m 0 0           0  0
     rom[148]=  -  0  - - 0  0 0  0  0  2  m 0 0           0  0 waa
     rom[149]=  -  0  - - 0  0 0  0  0  2  k 0 0           1  0 kalarm0
wxy  rom[14a]=  -  0  - - 0  0 0  0  0  2  k 0 0           1  0 knerr
     rom[14b]=  -  0  - - 0  0 0  0  0  2  k 0 1           1  0 kok
     rom[14c]=  -  0  - m 1  0 0  1  0  0  0 0 0  firstin  1  0
     rom[14d]=  -  0  - - 0  0 0  0  0  2  0 1 0  c1       0  0 wot
     rom[14e]=  -  0  - - 0  0 0  0  0  2  k 0 0           1  0 krbotp14
wa0  rom[14f]=  -  0  - - 0  0 0  0  0  2  k 0 0           0  0 waa
     rom[150]=  -  0  - - 0  0 0  0  0  2  k 0 0           1  0 kalarm0
waa  rom[151]=  -  0  - m 1  0 0  1  0  0  k 1 0  c1       1  0 krbot
     rom[152]=  -  0  - - 0  0 0  0  0  2  - 0 0           0  0 wot
     rom[153]=  -  0  - - 0  0 0  0  0  2  k 0 0           1  0 krbotp14
wot  rom[154]=  -  0  - - 0  0 0  0  0  2  k 0 0           1  1 knerase
     rom[155]=  -  0  - - 0  0 0  1  0  2  k 1 0  c2       1  0 krbot
     rom[156]=  -  0  - - 0  0 0  0  0  2  k 0 0           1  0 knerr
     rom[157]=  -  0  - - 0  0 0  1  0  2  0 0 0  c1       1  0
     rom[158]=  -  0  - - 0  0 0  0  0  0  0 0 0  c1       1  0
wut  rom[159]=  -  0  - - 0  0 0  1  0  2  p 1 0  c2       1  0 wut
     rom[15a]=  -  0  - - 0  0 0  0  0  f  p 1 0  c1       1  0
     rom[15b]=  -  0  - - 0  0 0  0  0  2  p 0 0           0  0 w00
     rom[15c]=  -  0  - - 0  0 0  0  0  2  p 0 0           0  0 w00
```

Table XI contains the hexadecimal (hex) images of the coding given in tables IX and X. The inclusion of the hex listing is thought to better guide both the artisan skilled in computer design and the artisan skilled in programming by providing a teaching of the invention at a common level. The hexadecimal code given below is the actual content of control memory 40. The format used here lists five hexadecimal characters, then a sixth hexadecimal character expanded into four binary bits with intermediate spaces, then the seventh and eighth characters in hexadecimal. The use of binary notation for the sixth character is intended to help the reader split off the leftmost bit, which is part of the SC field, and the rightmost bit, which is part of the K-W field.

TABLE XI HEXADECIMAL CONTENT OF CONTROL MEMORY

```
     hex[000]=1 0 b 2 0    01
     hex[001]=1 0 b 2 0    01
w00  hex[002]=1 0 b 2 c    11  05d
     hex[003]=1 0 9 2 e  a011  0bf
     hex[004]=1 0 b 2 c    11  100
     hex[005]=1 1 9 2 e  a011  0bf
     hex[006]=1 0 f 2 e  6011  0b3
     hex[007]=1 0 b 2 4  a011
     hex[008]=1 0 b 2 0  6010
     hex[009]=1 0 b 2 3  1001
w01  hex[00a]=1 0 b b 0    01
     hex[00b]=1 0 b 2 4  1011  013
     hex[00c]=1 0 9 5 4    01
     hex[00d]=1 0 b 2 4    01  011
     hex[00e]=1 0 b 0 4    01
     hex[00f]=1 0 b 2 4    01  00a
     hex[010]=1 0 b 2 4    01
w02  hex[011]=1 0 7 2 a  1011  00a
     hex[012]=1 0 b 2 5  1011
w03  hex[013]=1 0 b 2 e  2011  03b
     hex[014]=1 0 b 2 4  6011
     hex[015]=1 0 b 2 e  2110  05d
     hex[016]=1 0 b 2 c    11  112
     hex[017]=1 1 b 2 c    11  100
     hex[018]=1 0 a 2 4  a011
     hex[019]=1 0 b 2 6  1001
     hex[01a]=6 0 a 2 c    11  102
ws1  hex[01b]=0 5 f 2 2  2011  025
     hex[01c]=1 0 b e d    11  100
ws2  hex[01d]=1 3 e 2 2  1011  01b
     hex[01e]=6 0 a b c    11  102
     hex[01f]=1 0 b 2 a  2111  023
     hex[020]=1 0 b 0 d    11  102
     hex[021]=0 5 f 2 2  2011  01d
     hex[022]=1 0 b e d    11  100
ws7  hex[023]=0 5 f 2 2  2011  025
     hex[024]=1 0 b e d    11  100
ws8  hex[025]=1 1 f 2 c    01  029
     hex[026]=1 0 b 2 e  e011  020
     hex[027]=1 0 b 2 a  2111
     hex[028]=1 0 b 2 9    01
ws9  hex[029]=1 0 b 2 e  2011  043
     hex[02a]=1 0 b 2 e  d011  017
     hex[02b]=1 0 b 2 c    11  11b
     hex[02c]=1 0 a 2 c    11  05e
     hex[02d]=6 0 b 2 e  1010  073
wsm  hex[02e]=1 0 e 0 a  e011
     hex[02f]=1 0 b 0 b  1011  030
wsn  hex[030]=1 7 a 7 a  1011  030
     hex[031]=1 7 a 2 c    11  112
     hex[032]=1 5 f 2 a  2011
     hex[033]=1 3 b f c    11  100
     hex[034]=0 1 b 2 a  d011  02e
     hex[035]=1 0 b 2 f  1011  073
     hex[036]=1 3 e 2 a  d011
     hex[037]=1 0 b 2 b  2111
     hex[038]=1 0 b 2 f  4011  04d
     hex[039]=1 0 b 2 c    11  03b
     hex[03a]=1 0 b 2 4  2110
     hex[03b]=1 0 b 2 6  1001
wcv  hex[03c]=1 0 f 2 e  0111  060
     hex[03d]=1 0 b 2 e  5011  062
     hex[03e]=1 0 b 2 c    11  112
     hex[03f]=1 0 a 2 c    11  105
     hex[040]=6 0 a 2 e  3011  009
     hex[041]=1 0 b 2 4  1011
     hex[042]=1 0 b b e  9011  067
wcx  hex[043]=1 0 b 2 2  1011  04b
     hex[044]=1 0 b f a  0111
     hex[045]=1 0 b 2 2  1011  043
     hex[046]=1 0 b b a  5011
     hex[047]=1 0 b 2 a  9011  049
     hex[048]=1 0 b 0 c    11  04d
wwx  hex[049]=1 0 b 2 0    00  055
     hex[04a]=1 0 b 2 4  5011
wxv  hex[04b]=1 0 b 2 0    01  04d
     hex[04c]=1 0 b 2 c    11  04d
wwy  hex[04d]=1 0 b 2 a  5010
wev  hex[04e]=1 3 b b a  1001  050
     hex[04f]=1 0 b 2 a  3011  05d
wwb  hex[050]=1 0 b 2 e  2011  062
wcw  hex[051]=1 0 b 2 2  1011  04e
     hex[052]=1 0 b f a  2011
```

```
    hex[053]=1 0 b 2 2 1011 051
    hex[054]=1 0 b b 4 2011
wod hex[055]=1 7 f f 6 1001 057
    hex[056]=1 0 b 2 a 3011 051
wwv hex[057]=1 0 b 2 e 2011 062
    hex[058]=1 0 b 2 0 3011
    hex[059]=1 0 b b a 3011
    hex[05a]=1 0 b 6 a 3011 05d
    hex[05b]=1 0 b 7 a 3011 05c
wfi hex[05c]=1 3 f 7 a 3011 05c
wdn hex[05d]=1 0 b 2 4 4011
    hex[05e]=1 0 b f 4   01
    hex[05f]=1 0 b 2 4   01 14a
    hex[060]=1 0 b 2 4   01
    hex[061]=1 0 b 9 c   11 102
    hex[062]=0 1 b 2 0   01 068
    hex[063]=1 7 b 2 c   11 07f
    hex[064]=1 0 b c 1   01
    hex[065]=1 0 b 2 0   01 151
    hex[066]=1 0 b 2 c   11 134
    hex[067]=1 0 b 2 c   11 07f
wab hex[068]=1 0 b 2 d   11 100
    hex[069]=1 1 b 2 c   11 101
    hex[06a]=1 0 e 2 c   01
    hex[06b]=1 0 b 2 e b011 026
    hex[06c]=1 0 b 2 e 7011 01d
    hex[06d]=1 0 b 2 f e011 01a
    hex[06e]=1 0 b 2 f d011 04a
    hex[06f]=1 0 b 2 3 d011
    hex[070]=1 0 b 2 5 2111
    hex[071]=1 0 b 2 d   11 07b
    hex[072]=1 0 b 2 d   01
    hex[073]=1 4 f 2 e f011 03c
    hex[074]=1 0 b 2 f 8011 020
    hex[075]=1 0 b 2 d   11 077
    hex[076]=1 0 b 2 d   01
    hex[077]=1 0 b 2 e 3011 05d
    hex[078]=1 0 b 2 4 2111
wt8 hex[079]=1 1 b 2 a 3010
    hex[07a]=0 1 b b c   11 044
    hex[07b]=1 0 b 2 0   00 083
    hex[07c]=1 0 b 2 e 2011 056
    hex[07d]=1 0 a 2 e 1011 025
    hex[07e]=1 0 b f 2 2011
wt9 hex[07f]=6 4 e 2 2 1011 07f
    hex[080]=1 0 b f 3 2011
    hex[081]=1 0 f 2 2 1011 079
    hex[082]=1 0 b 2 5 2111
wta hex[083]=1 0 b 2 e c011 067
    hex[084]=1 0 b 2 e 1111 077
    hex[085]=1 0 b 2 4 f011
    hex[086]=1 0 a 2 6 3001
    hex[087]=1 0 b 2 4 d011
    hex[088]=1 0 b 2 4 5010
wbg hex[089]=1 0 b b a 1111
    hex[08a]=1 0 b 2 4 b011 0cc
    hex[08b]=1 1 b 2 4 0111
    hex[08c]=1 0 b b 4 d011
    hex[08d]=1 0 b 2 6 1001 0cc
    hex[08e]=1 0 b 2 c   11 101
    hex[08f]=0 1 b 8 4 7011
    hex[090]=1 3 b 2 6 2001 0a6
    hex[091]=0 1 b 2 a c011
    hex[092]=1 0 b 2 a 1101
    hex[093]=1 0 b 2 e c011 067
    hex[094]=1 0 b 2 4 b011
    hex[095]=1 1 b 2 6 2001
    hex[096]=0 0 b 2 4 e011
    hex[097]=4 3 b 2 6 d001
    hex[098]=4 0 b 2 4 1010
    hex[099]=4 3 b 2 6 e001
    hex[09a]=4 3 b 2 4 8011
    hex[09b]=1 3 f 2 6 b001
    hex[09c]=0 1 b 2 4 2011
```

```
    hex[09d]=1 3 b 2 6 8001
    hex[09e]=1 0 b 2 c   11 077
    hex[09f]=0 0 b 2 5 f011
    hex[0a0]=1 0 b 2 6 2001
    hex[0a1]=1 0 b 2 4 7011
    hex[0a2]=1 0 b 2 6 f001
    hex[0a3]=1 0 a 2 6 3001
    hex[0a4]=1 0 b 2 4 2011
    hex[0a5]=1 1 b 2 6 7001
wlq hex[0a6]=1 0 b 2 8 f011
    hex[0a7]=1 0 b 2 a 1001
    hex[0a8]=1 0 b 2 2 2011
wlt hex[0a9]=1 5 f f 2 3011
    hex[0aa]=1 4 a 2 2 1011 0a9
    hex[0ab]=1 4 b 2 3 2011
    hex[0ac]=1 4 f 2 2 1011
    hex[0ad]=1 4 b 2 5 e011
    hex[0ae]=1 0 b 2 0 b010
    hex[0af]=1 0 b 2 2 3001
    hex[0b0]=1 0 b 2 0 3011
    hex[0b1]=1 0 b 2 2 1001
    hex[0b2]=1 0 b 2 4 8011
    hex[0b3]=1 0 b 2 6 2001
    hex[0b4]=1 5 b 2 a 3011
    hex[0b5]=1 4 a 2 a 2011
wlu hex[0b6]=1 5 f f a 3011
    hex[0b7]=1 4 a 2 a 1011 0b6
    hex[0b8]=1 4 b 2 b 2011
    hex[0b9]=1 4 f 2 a 1011
    hex[0ba]=1 4 b 2 9 7011
    hex[0bb]=1 0 b 2 a 3010
    hex[0bc]=1 4 a 2 a 3011
    hex[0bd]=1 4 e f a 1011
wlh hex[0be]=1 4 b 2 b 3011 0be
    hex[0bf]=1 4 e f a 1011
    hex[0c0]=1 0 f 2 4 1011 0c2
    hex[0c1]=1 0 b 2 d   11 077
wws hex[0c2]=1 1 b 2 4 b010
    hex[0c3]=0 1 b 2 4 7011
    hex[0c4]=1 3 b 2 6 2001
    hex[0c5]=0 1 b 2 2 1111
    hex[0c6]=1 0 b f 2 d011
    hex[0c7]=1 0 b 2 4 f010 0a6
    hex[0c8]=1 0 a 2 6 3001
    hex[0c9]=1 0 b 0 4   01
    hex[0ca]=1 0 b 2 4   01 089
    hex[0cb]=1 0 b 2 4 5011
wlx hex[0cc]=1 0 b 2 0 9011
    hex[0cd]=1 0 b 2 0 b010
    hex[0ce]=1 0 b 2 2 b001
wrv hex[0cf]=1 0 b 2 2 c011 14f
    hex[0d0]=1 0 b f a b011
    hex[0d1]=1 1 b 2 8   01 0cf
    hex[0d2]=1 0 b c 8   01
    hex[0d3]=1 0 b 2 8   01 0d5
    hex[0d4]=1 0 b 2 8   01
wwo hex[0d5]=1 0 b 2 0   01
    hex[0d6]=1 0 b 2 0 b011
    hex[0d7]=1 0 b 2 2 c001
    hex[0d8]=1 0 b 2 c   11 101
    hex[0d9]=1 1 b 2 e 3011 05d
    hex[0da]=0 0 b 2 0 8011
    hex[0db]=1 0 f 2 2 8001
    hex[0dc]=1 0 b 2 2 8011
    hex[0dd]=1 0 b 2 3 9001
    hex[0de]=1 0 b 2 2 9011
    hex[0df]=1 0 b 2 2 9011
    hex[0e0]=1 0 b 2 4 2111
wt3 hex[0e1]=1 1 b 2 a 3010
    hex[0e2]=0 1 b b a 9011
    hex[0e3]=1 0 b 2 4 8010 0ec
    hex[0e4]=1 0 b 2 6 2001
    hex[0e5]=1 0 a 2 0 8011
    hex[0e6]=1 0 b 2 2 1001
```

```
     hex[0e7]=1 0 b f a 2011
wt4  hex[0e8]=6 4 e 2 a 1011 0e8
     hex[0e9]=1 0 b f b 2011
     hex[0ea]=1 0 f 2 a 1011 0e1
     hex[0eb]=1 0 b 2 5 2111
wt5  hex[0ec]=1 0 b 2 a 9011
     hex[0ed]=1 0 b 2 c   11 100
     hex[0ee]=1 1 b 2 c   11 112
     hex[0ef]=1 0 e 2 8 2111
     hex[0f0]=1 0 b 2 1 8011
     hex[0f1]=1 0 b 2 3 3001
     hex[0f2]=1 7 f 2 4 2111
     hex[0f3]=0 0 b 2 d   11 007
     hex[0f4]=1 0 b 2 f 1111 03b
     hex[0f5]=1 0 b 2 8 a011
     hex[0f6]=1 0 b 2 a 7001
     hex[0f7]=1 0 b 2 0 d011
     hex[0f8]=1 0 b 2 2 d001
     hex[0f9]=1 0 b 2 8 d011
     hex[0fa]=1 0 b 2 a 2001
     hex[0fb]=1 0 b 2 4 f011
     hex[0fc]=1 0 b 2 6 f001
     hex[0fd]=1 0 b 2 8 f011
     hex[0fe]=1 0 b 2 a 0101
     hex[0ff]=1 0 b 2 8 e011
     hex[100]=1 0 b 2 a e001
     hex[101]=1 0 b 0 8   01
     hex[102]=1 0 b 2 0 f011 111
     hex[103]=1 0 b 2 2 5000
wrt  hex[104]=1 3 b 2 0 8010
     hex[105]=0 0 b 2 2 3001
     hex[106]=4 3 b 2 8 d011
     hex[107]=4 0 b 2 a 2001
     hex[108]=4 3 b 2 4 7011
     hex[109]=4 3 a 2 0   01
     hex[10a]=1 3 f 2 0 c011
     hex[10b]=0 1 b 2 c   11 007
     hex[10c]=1 0 f 2 c   11 007
     hex[10d]=1 5 f 2 c   11 101
     hex[10e]=0 1 b 2 c   11 112
     hex[10f]=1 0 a 2 4 7011
     hex[110]=1 7 b 2 5   01
wtk  hex[111]=1 0 b 8 c   11 102
     hex[112]=1 1 b 2 0 e011 141
     hex[113]=1 3 b 2 2 1001
wch  hex[114]=0 1 b f a 1011
     hex[115]=1 0 a 7 a 1011 116
we1  hex[116]=1 7 e 7 a 1011 116
     hex[117]=1 0 b 2 d   11 101
     hex[118]=1 1 b 8 4 1111
     hex[119]=1 0 e 2 2 7011 127
     hex[11a]=1 7 b 2 c   11 007
     hex[11b]=1 0 b c d   11 102
     hex[11c]=1 1 b 2 0 e011 114
     hex[11d]=1 3 b 2 2 1001
     hex[11e]=1 0 b 2 a 1111
     hex[11f]=1 1 b 2 0 9011
     hex[120]=1 0 b 8 4 3010
     hex[121]=1 1 b 2 a 3011 141
     hex[122]=1 0 a f a 3011 138
we2  hex[123]=1 7 f b a 3011 123
     hex[124]=1 3 e 6 a 3011 138
     hex[125]=1 0 b 2 8   01 138
     hex[126]=1 0 b 2 8   01
wlr  hex[127]=1 0 b c 1 e011
     hex[128]=1 1 b 2 2 1001 12f
     hex[129]=1 0 b 2 2 5011
     hex[12a]=1 0 b 2 a 1111
     hex[12b]=1 1 b 2 8   01
     hex[12c]=1 0 b c 8   01
     hex[12d]=1 0 b 2 0 e011 151
     hex[12e]=1 1 b 2 c   11 138
wr1  hex[12f]=1 0 b 2 a 1011
     hex[130]=1 0 a f a 1011 133
we4  hex[131]=1 7 f b a 1011 131
     hex[132]=1 3 e 6 a 1011 133
wv4  hex[133]=1 0 b 2 1 9011 135
     hex[134]=1 0 b 2 4 3010
ww4  hex[135]=1 1 b f a 3011
     hex[136]=1 0 a 7 a 3011 137
we3  hex[137]=1 7 e 7 a 3011 137
wiv  hex[138]=1 0 b 2 c   11 067
     hex[139]=1 0 b 2 9 b011
     hex[13a]=1 0 b 2 4 2010
     hex[13b]=1 1 b f 2 2011
     hex[13c]=1 0 a 7 2 2011 13d
we5  hex[13d]=1 7 e 7 2 2011 13d
     hex[13e]=1 0 b 0 d   11 067
     hex[13f]=1 1 b 2 8 0111 104
     hex[140]=0 1 b 2 0 f011
wfn  hex[141]=1 0 b 2 0 e011 143
     hex[142]=1 0 b 2 e 4010 026
wwf  hex[143]=1 0 b 2 4 5011
     hex[144]=1 0 b b c   11 100
     hex[145]=1 1 b 2 0 f011 03c
     hex[146]=1 0 b 2 2 1001
     hex[147]=1 0 b 0 0   01
     hex[148]=1 0 b 2 0   01 151
     hex[149]=1 0 b 2 c   11 132
wxy  hex[14a]=1 0 b 2 c   11 07b
     hex[14b]=1 0 b 2 d   11 120
     hex[14c]=1 1 9 0 4 6011
     hex[14d]=1 0 b 2 6 1001 154
     hex[14e]=1 0 b 2 c   11 024
wa0  hex[14f]=1 0 b 2 c   01 151
     hex[150]=1 0 b 2 c   11 131
waa  hex[151]=1 1 9 0 e 1011 073
     hex[152]=1 0 b 2 0   01 154
     hex[153]=1 0 b 2 c   11 024
wot  hex[154]=1 0 b 2 c   10 07f
     hex[155]=1 0 9 2 e 2011 073
     hex[156]=1 0 b 2 c   11 07b
     hex[157]=1 0 9 2 4 1011
     hex[158]=1 0 b 0 4 1011
wut  hex[159]=1 0 9 2 a 2011 159
     hex[15a]=1 0 b f a 1011
     hex[15b]=1 0 b 2 8   01 002
     hex[15c]=1 0 b 2 8   01 002
```

Operational Tests of RS Decoding Program

In operation as a decoder (error corrector) for the (31,15) Reed-Solomon code, the present invention achieves very high speed. The time required to decode any particular 31-character received word is independent of the transmitted codeword, but it does depend upon the errata pattern. The worst case is 3555 clock cycles between the end of the INPUT loop and the beginning of the output character stream. With the clock running at the designed speed of 120 nanoseconds per cycle, the total (worst case) decoding time is thus only 0.426 milliseconds.

Table XII lists some of the many errata patterns with which the decoder of the present invention has been tested. Each errata pattern is listed in two rows. The first row gives the pattern of errata in the message characters; the second row gives the patter of errata in the check characters. Each six-bit character is taken as a decimal number between 0 and 63, inclusive. The erasure indicator is the most significant bit. Following each pair of rows presenting the errata pattern, we have listed the output of the present invention. The first number gives the value of an external counter measuring the number of clock cycles between the exit from the INPUT loop and the appearance of the first output character. This first output character gives the alarm status (32 means decoding was successful; ≧48 means decoding was unsuccessful.) The second output gives the number of erasures. The third output gives the number of errors which is presented as zero when the alarm condition reveals that the precise value of the number of errors is unknown because the error-correcting capability of the minimum distance decoding algorithm is exceeded. The next 15 outputs reveal the decoded information characters.

Tables XIII and XIV summarize the running time of "typical" errata patterns as a function of the number of erased characters and the number of erroneous characters. While there are additional small data-dependent variations among the errata patterns of a particular type, no combination of such variations can exceed the worst-case maximum of 3555 cycles.

TABLE XII TESTS OF ERRATA PATTERNS AND OUTPUTS

```
      05 21 11 04 28 26 02 29 10 10 31 17 11 21 18
11 21 08 10 07 06 30 18 08 02 24 09 07 20 11 07
p=3555, o=32 s=0 t=8   5 17 11  5 28 26 26 29 10 10 30 17 18 21 16 alldone

      10 17 21 30 06 07 11 08 18 07 09 24 47 12 20
30 24 28 19 20 04 01 24 15 43 03 28 03 15 20 06
p=3464, o=32 s=2 t=7   10 16 21 30  6  7  2  8 18  7  9 24  7 12 20 alldone

      19 28 19 01 56 17 06 31 24 53 28 03 13 34 15
06 21 21 10 27 23 08 10 47 03 08 09 11 20 18 08
p=3388, o=32 s=4 t=6   19 28 19  1  5 20  6 24 24  4 28  3 13 20 15 alldone

      13 54 21 04 23 27 03 06 10 12 09 08 08 18 17
09 54 49 09 56 09 16 03 01 09 07 34 30 21 48 05
p=3309, o=32 s=6 t=5   13 21 21  1 23 27  3  6 10 12  9  8  8 18 20 alldone

      53 34 17 27 09 08 09 24 03 30 08 07 40 11 21
14 07 08 37 06 58 19 52 28 20 03 03 54 02 41 06
p=3276, o=32 s=8 t=4   24 20 17 27  9  8  9  1  3 30  8  7  7  6 21 alldone

      07 08 07 14 33 06 46 28 29 17 22 03 34 41 52
56 07 48 46 03 08 60 09 22 08 29 05 05 56 20 02
p=3276, o=32 s=10 t=3  27  8  7 14 31  6 20 28 29 17  3  3 22  9  2 alldone

      23 44 63 10 08 36 08 16 09 05 43 42 02 20 28
63 15 40 35 21 53 13 01 56 18 08 30 37 31 33 14
p=3276, o=32 s=12 t=2  23 31  7 10  8  3  8 16  9  5  5 29  2 20 28 alldone

      04 59 15 13 44 21 55 59 21 31 47 21 16 48 31
08 24 45 42 11 12 10 23 46 48 28 52 32 17 34 44
p=3296, o=32 s=14 t=1   4 19 15 13 24 21 18 11  1 31 30 21 16 24 31 alldone

      12 37 24 10 38 11 20 21 23 44 18 59 18 49 43
50 15 06 32 36 30 23 32 34 53 44 38 45 32 31 12
p=3339, o=32 s=16 t=0  12 28 24 10 12 11 20 21 23  5 18 28 18 20 17 alldone

      07 06 00 23 30 30 13 16 11 01 06 27 12 31 50
23 04 13 10 26 30 04 12 14 29 13 17 20 13 14 03
p=3459, o=32 s=1 t=7    7  6 15 23 30 30 13 16 11  1  4  8 12 31 11 alldone

      14 13 30 04 30 15 06 14 12 20 12 13 03 14 07
10 53 23 13 19 43 04 33 22 18 23 16 15 12 16 08
p=3357, o=32 s=3 t=6   10 13  4  4 30 15  6 14 12 20  3 13  3 14 13 alldone

      13 16 31 04 21 16 18 22 21 15 42 23 08 16 12
08 24 13 04 49 61 26 10 22 07 32 11 01 03 32 16
p=3294, o=32 s=5 t=5   13  0 31  4 21 16 18 22 21 15 16 23  8 16 12 alldone

      32 05 08 12 54 42 20 06 15 23 62 16 33 26 06
39 06 23 14 04 04 00 30 60 07 44 32 05 03 27 11
p=3242, o=32 s=9 t=3    5  5  8 12 18 18 27  6 15 23 29 16 28 26  6 alldone

      62 23 47 00 04 57 59 27 30 43 27 31 40 26 03
31 55 08 16 27 35 29 05 10 11 52 61 27 48 24 01
p=3233, o=32 s=11 t=2  14 23  6  0  4  4  7 21 30  5 27 31 14 26  3 alldone

      49 51 31 29 15 27 07 10 35 27 51 38 01 38 44
12 26 09 38 57 11 23 49 38 15 46 20 17 09 06 48
p=3248, o=32 s=13 t=1  16  8 31 29 15 27  7 10  5 27 29 27  1 24 29 alldone

      60 09 26 58 35 28 15 34 15 17 61 23 38 06 47
58 53 14 56 28 31 30 50 03 35 61 05 12 43 23 49
p=3270, o=32 s=15 t=0   1  9 26 23 11 28 15 13 15 17  9 23 19  6  9 alldone
```

```
        02 01 08 08 50 03 40 39 06 19 10 41 14 45 12
57 32 01 26 47 41 12 32 03 40 22 61 22 20 18 26
p=1656, o=49 s=12 t=0   2  1  8  8 18  3  8  7  6 19 10  9 14 13 12 alldone

        05 62 18 03 15 25 09 22 15 30 18 63 02 00 09
28 20 11 01 01 48 11 24 06 17 52 24 19 14 31 17
p=3073, o=50 s=4 t=0   5 30 18  3 15 25  9 22 15 30 18 31  2  0  9 alldone

        26 39 53 54 29 44 42 57 54 61 58 09 05 41 22
51 31 61 13 42 12 27 56 26 17 11 40 21 33 63 60
p=876, o=52 s=18 t=-15  26  7 21 22 29 12 10 25 22 29 26  9  5  9 22 alldone

        26 15 31 34 29 15 16 18 07 47 34 63 28 18 33
29 42 25 39 03 08 13 50 48 35 19 51 48 09 28 24
p=2242, o=56 s=12 t=0  26 15 31  2 29 15 16 18  7 15  2 31 28 18  1 alldone
```

TABLE XIII

RUNNING-TIMES FOR CORRECTABLE ERRATA PATTERNS

| | T=0 | T=1 | T=2 | T=3 | T=4 | T=5 | T=6 | T=7 | T=8 |
|---|---|---|---|---|---|---|---|---|---|
| S= 0 | | | | | | | | | 3515 |
| S= 0 | | | | | | | | | 3538 |
| S= 0 | 2068 | 2238 | 2404 | 2579 | 2761 | 2950 | 3140 | 3343 | 3555 |
| S= 1 | 2163 | 2336 | 2505 | 2683 | 2868 | 3060 | 3253 | 3459 | |
| S= 2 | 2140 | 2317 | 2490 | 2672 | 2861 | 3057 | 3254 | 3464 | |
| S= 3 | 2242 | 2422 | 2598 | 2783 | 2975 | 3174 | 3357 | | |
| S= 4 | 2232 | 2416 | 2596 | 2785 | 2981 | 3184 | 3388 | | |
| S= 5 | 2350 | 2537 | 2720 | 2912 | 3111 | 3294 | | | |
| S= 6 | 2345 | 2536 | 2723 | 2914 | 3122 | 3309 | | | |
| S= 7 | 2479 | 2673 | 2863 | 3057 | 3263 | | | | |
| S= 8 | 2488 | 2691 | 2880 | 3088 | 3276 | | | | |
| S= 9 | 2643 | 2844 | 3041 | 3242 | | | | | |
| S=10 | 2660 | 2865 | 3066 | 3276 | | | | | |
| S=11 | 2821 | 3034 | 3233 | | | | | | |
| S=12 | 2856 | 3068 | 3276 | | | | | | |
| S=13 | 3033 | 3248 | | | | | | | |
| S=14 | 3072 | 3296 | | | | | | | |
| S=15 | 3270 | | | | | | | | |
| S=16 | 3334 | | | | | | | | |
| S=16 | 3339 | | | | | | | | |

TABLE XIV

RUNNING-TIMES FOR UNCORRECTABLE ERRATA PATTERNS

| | BIGS | SINGULAR | "ERROR" =ERASE | INSUFF ROOTS |
|---|---|---|---|---|
| S= 0 | | | | 3035 |
| S=0 | | | | 3102 |
| S=0 | | | | 3150 |
| S=0 | | | | 3198 |
| S=1 | | 2526 | | |
| S=1 | | 2547 | | |
| S=2 | | 2252 | | |
| S=3 | | 2413 | | |
| S=4 | | | | 3073 |
| S=5 | | 2283 | | |
| S=6 | | | | 3010 |
| S=7 | | 2157 | | |
| S=8 | | | | 3081 |
| S=9 | | 2037 | | |
| S=10 | | 1766 | | |
| S=11 | | 1919 | | |
| S=12 | | 1656 | | |
| S=12 | | | | 3114 |
| S=12 | | | | 3119 |
| S=12 | | | | 3174 |
| S=12 | | | 2090 | |
| S=12 | | | 2226 | |
| S=12 | | | 2238 | |
| S=12 | | | 2242 | |
| S=12 | | | 2374 | |
| S=12 | | | 2874 | |
| S=12 | | | 2894 | |
| S=13 | | 1801 | | |
| S=14 | | | 2558 | |
| S=15 | | 1691 | | |
| S=17 | 871 | | | |
| S=18 | 876 | | | |
| S=31 | 949 | | | |

Many patterns of 8 errors and 0 erasures attain the worst-case time of 3555 clock cycles. However, some errata patterns are decoded slightly faster for various reasons. Some time savings accrue when the error pattern is such that accidental leading zeroes occur in the calculations in SUGIY. Shortly after symbolic ROM location WBG thee is a data-dependent branch to WLQ, and each time this branch is taken, 20 cycles are bypassed. However, if the branch is taken an odd number of times, the parity of the exit from SUGIY is changed, thereby resulting in a loss of 3 clock cycles.

Errata patterns containing erasures cause reductions both in the running time of SUGIY and in the running time of CHORNEY. This happens because the presence of erasures forces an earlier termination threshold for SUGIY, necessarily yielding a candidate error locator polynomial of smaller degree. This candidate error locator polynomial then also facilitates a faster running time for the Chien search conducted by CHORNEY, both because SIG(z) has fewer roots and because it has lower degree. Thus, the running times of SUGIY and the Chien search part of CHORNEY both decrease as the number of erasures increases. However, the running times of subprograms CONVERT, which converts the number of erasures to binary; of NEWSS, which modifies the syndrome; and of NEWLAM, which calculates the erasure polynomial lambda as well as the error evaluation part of CHORNEY: all increase as the number of erasures increases. In fact, the growth of NEWLAM, like the decline of SUGIY, both vary as the square of the number of erasures. Thus, assuming many errata (a number near to or greater than the error-correction capability of the code), the running time is a quadratic function of the number of erasures. This quadratic function assumes a minimum value within the interior of the relevant range of its argument ($0 \leqq \leqq 16$). Hence, although the worst case is 0 erasures and 8 errors, errate patterns containing 16 erasures and 0 errors run slightly longer than errata patterns containing 10 erasures and 3 errors.

The most common type of errata pattern with more than 8 errors and no erasures causes SUGIY to find a potential error-locator evaluator polynomial of degree 8, but this polynomial fails to have eight roots in $GF(2^5)$. When attempting to decode such an errata pattern, SUGIY runs for the same length of time as it would for a pattern of 8 errors. However, CHORNEY runs faster because it does not evaluate the unfound roots of the error locator polynomial. Each unfound root saves 48 cycles in CHORNEY and an additional 69 cycles are saved because the number of errors does not have to be converted to binary when this number is not known. Thus, a typical 9-error pattern, containing no erasures, yielding no accidental leading zeroes in SUGIY, and giving a candidate error-locator polynomial having degree eight but only one root in $GF(2^5)$, has a running time of $3555-7\times48-69=3150$ (cycles). If the candidate error polynomial has two roots, its running time is 3198; if the candidate error polynomial has zero roots, its running time is 3102. In either case, an additional savings of some multiple of 20 cycles (possibly minus 3) are saved if accidental leading zeroes occur in SUGIY.

When there are more than 8 errors, there are generally no constraints on the error-locator polynomial. Each value which such a polynomial assumes is an independent sample from a uniform distribution over $GF(2^5)$, so that each value is zero with probability about 1/32 and the expected number of roots is therefore about 1. If a polynomial of degree 8 has more than 6 roots, it must have 8, so the worst-case running time for any uncorrectable errata pattern is $355-2\times48-69=3390$ (cycles). Since a random polynomial of degree 8 is very unlikely to have 6 roots, this case is very rarely attained and has never occurred among the random test cases run to date.

Other alarm conditions yield faster running times. The shortest running time occurs when there are 17 erasures, in which case the program aborts and begins output after only 871 cycles. More erasures entail slightly longer running times because of the additional computation required to convert the larger erasure count to binary. Another early abortion occurs when the key equation is singular, and has no solution. This condition forces a program termination immediately after SUGIY, bypassing CHORNEY entirely. Even when conditioned upon the assumption that the errata pattern is uncorrectable, this type of alarm condition is unlikely when the number of erasures is even, although it is common when the number of erasures is odd. In fact, when the number of erasures is odd, a single nonzero resultant is sufficient to trigger this alarm, and that happens with probability about $31/32=97\%$.

Another alarm condition occurs when CHORNEY finds a root of SIG(z) which coincides with an erasure location. This phenomenon is common only when the number of erasures is large and even. In order to test out the ALARM software package, several extra noise words containing twelve erasures and many errors have been tested. Termination due to coincident "errors" and erasures is not uncommon among errata patterns of this type, and the variation in running times reflects some of the variation among the 31 possible locations in which the aborting coincidence might occur.

C. Simultaneous Linear Binary Equation Solver

Although this feature is not used in the preferred embodiment of the above described firmware for decoding the (31,15) Reed-Solomon code, special instructions to facilitate the easy and fast hardware implementation of algorithms to solve simultaneous linear binary equations are included in the existing design. This feature is particularly useful for decoding BCH and/or Reed-Solomon codes of block length n and distance d when $\log_2 n$ is relatively large compared with d. In these circumstances, a relatively large part of the decoding time of the conventinal algorithm would be devoted to finding the roots of the error-locator polynomial, SIG(z). When n is large, it may impractical to test all nonzero field elements. As explained in chapter 13 of my text, a better approach is to compute an affine multiple of SIG(z). One then has a system of simultaneous binary equations:

$$\vec{\beta}L=\vec{a}$$

where $\vec{a}$ and the rows of the square binary matrix L are words in the data memory of the present invention. The error locations are a subset of the row vectors $\vec{\beta}$ which satisfy the above equation.

If the Galois field has order $2^m$, the above matrix equation represents a system of m simultaneous linear binary equations in the m unknown binary coefficients of $\vec{\beta}$. If we annex an additional component of value 1 to $\beta$, the annex row $\vec{u}$ to the bottom of L to form the $(n+1)\times n$ binary matrix A, we have $$[\vec{\beta},1]A=\vec{0}$$

This system of equations may now be solved by column operations on the matrix A.

However, since matrix A is obtained via calculations which yield its rows (as elements in $GF(2^m)$, and therefore as words in the decoder's data memory), it is much more feasible to do row operations than column operations. Fortunately, this invention includes two special instructions, RF(); and G=TV(); which facilitate a very fast solution of these simultaneous linear binary equations.

Figure 9:
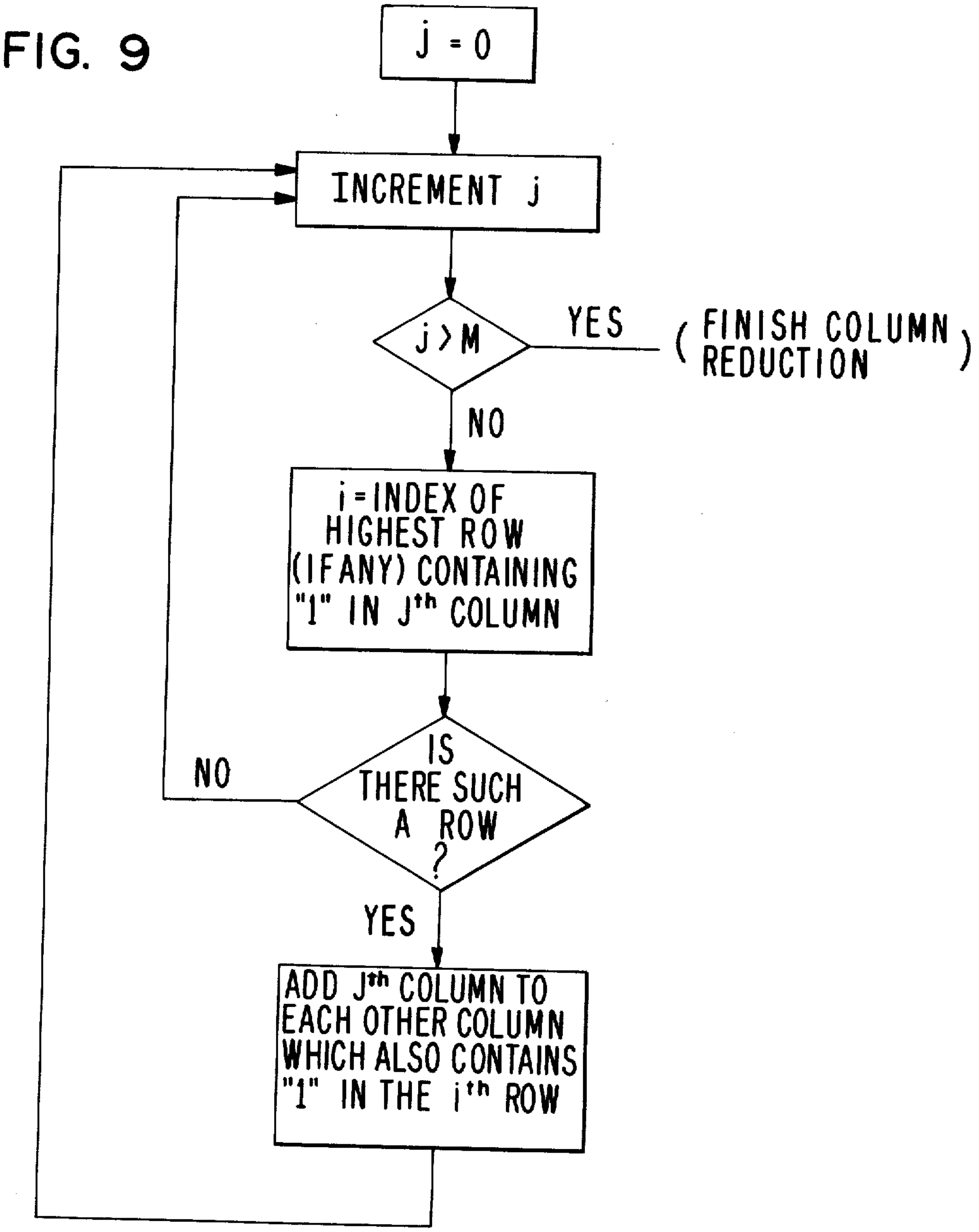
FIG. 9 illustrates part of a flow chart used by prior art linear binary equations solving apparatus.

A flow chart of the software to column-reduce the A matrix, well known in prior art, is shown in FIG. 9.

EXAMPLE

Consider the matrix equation which occurs on page 243 of *Algebraic Coding Theory:*

$$[\beta,1]\begin{bmatrix}0&1&1&0&1\\0&0&1&1&0\\0&1&1&0&0\\0&1&0&1&0\\1&0&0&0&1\\1&0&0&0&1\end{bmatrix}=[0\ 0\ 0\ 0\ 0\ 0]$$

By cycling columns leftward we may ensure that the pivot element lies in the first column and the reduction precedes as follows:

EXAMPLE $$\begin{bmatrix}0&1&1&0&1\\0&0&1&1&0\\0&1&1&0&0\\0&1&0&1&0\\1&0&0&0&1\\1&0&0&0&1\end{bmatrix}\xrightarrow{\text{add 1st col to 5th col}}\begin{bmatrix}0&1&1&0&1\\0&0&1&1&0\\0&1&1&0&0\\0&1&0&1&0\\1&0&0&0&0\\1&0&0&0&0\end{bmatrix}\xrightarrow{\text{cycle columns leftward}}$$

$$\begin{bmatrix}1&1&0&1&0\\0&1&1&0&0\\1&1&0&0&0\\1&0&1&0&0\\0&0&0&0&1\\0&0&0&0&1\end{bmatrix}\xrightarrow{\text{add 1st col to 2nd col and 4th col}}\begin{bmatrix}1&0&0&0&0\\0&1&1&0&0\\1&0&0&1&0\\1&1&1&1&0\\0&0&0&0&1\\0&0&0&0&1\end{bmatrix}\xrightarrow{\text{cycle columns leftward}}$$

$$\begin{bmatrix}0&0&0&0&1\\1&1&0&0&0\\0&0&1&0&1\\1&1&1&0&1\\0&0&0&1&0\\0&0&0&1&0\end{bmatrix}\xrightarrow{\text{add 1st col to 2nd col}}\begin{bmatrix}0&0&0&0&1\\1&0&0&0&0\\0&0&1&0&1\\1&0&1&0&1\\0&0&0&1&0\\0&0&0&1&0\end{bmatrix}\xrightarrow{\text{cycle columns leftward}}$$

$$\begin{bmatrix}0&0&0&1&0\\0&0&0&0&1\\0&1&0&1&0\\0&1&0&1&1\\0&0&1&0&0\\0&0&1&0&0\end{bmatrix}\xrightarrow{\text{cycle cols leftward}}$$

$$\begin{bmatrix} 0&0&1&0&0\\ 0&0&0&1&0\\ 1&0&1&0&0\\ 1&0&1&1&0\\ 0&1&0&0&0\\ 0&1&0&0&0 \end{bmatrix} \xrightarrow[\text{3rd col}]{\text{add 1st col to}} \begin{bmatrix} 0&0&1&0&0\\ 0&0&0&1&0\\ 1&0&0&0&0\\ 1&0&0&1&0\\ 0&1&0&0&0\\ 0&1&0&0&0 \end{bmatrix} \xrightarrow[\text{leftward}]{\text{cycle columns}}$$

$$\begin{bmatrix} 0&1&0&0&0\\ 0&0&1&0&0\\ 0&0&0&0&1\\ 0&0&1&0&1\\ 1&0&0&0&0\\ 1&0&0&0&0 \end{bmatrix}$$

At this point the matrix is column-reduced, but not yet echelon. Only permutations and addition of the identity are needed to finish the solution:

$$\begin{bmatrix} 01000\\ 00100\\ 00001\\ 00101\\ 10000\\ 10000 \end{bmatrix} \xrightarrow[\text{permute columns to bring pivot elements onto diagonal}]{} \begin{bmatrix} 10000\\ 01000\\ 00100\\ 01100\\ 00001\\ 00001 \end{bmatrix} \xrightarrow[\text{identity}]{\text{add}}$$

$$\begin{bmatrix} 00000\\ 00000\\ 00000\\ 01110\\ 00000\\ 00001 \end{bmatrix} = \text{solutions}$$

When this prior-art algorithm is implemented by one skilled in programming practice, a major part of the running time is consumed by branches deciding whether or not to add one column into another. There is also some problem of implementing column operations on hardware which stores words in rows. A conventional solution provides hardware to implement AND, XOR and OR logic on full words, and to perform shifts on the bits of a word. This solution entails additional integrated circuit components as well as additional running time costs, all of which are avoided by the present invention, which is implemented in the RF() instruction.

We will now describe the RF() feature of this invention.

The RF() instruction allows the decoder to base the selection of a choice between the affine function and the linear function of the Galois field arithmetic unit on the least significant bit of the result rather than on any specified OP code. This allows the column operations need to solve simultaneous linear binary equations to be implemented on a row by row basis, at high speed, without any branching overhead costs. The same program also uses the already existing Galois field arithmetic unit to effect the left cyclic shifts needed to bring the next column into the top bit position so that it can be tested to find the next pivot element.

To illustrate the use of the RF() instruction, we describe how our decoder could use it to perform the column reduction described in the previous example.

To initialize, the row containing the pivotal element is multiplied by alpha, a 1 is added, and the resulting quantity is stored and loaded into the Z register:

$$Z=\alpha[10001]+[00001]=[00111]+[00001]=[00110].$$

The X register is loaded with alpha. Then, each row of the matrix is pipelined from memory to the Y register, the RF() subinstruction is executed, and the result is loaded into the V register and stored back into memory. When a row containing a leading zero is loaded into Y, the result of the RF() instruction is a left shift of that row modified in the appropriate columns to account for the stage of the matrix reduction now being performed. The relevant instructions in the inner loop are these:

| | |
|---|---|
| | Y = M[A]; |
| LF( ); | |
| RF( ); | V = R |
| | M[A] = V |

A single pass through the inner loop which executes each of the above instructions as a register content points to successive rows of the matrix transforms $$\begin{bmatrix} 0&1&1&0&1\\ 0&0&1&1&0\\ 0&1&1&0&0\\ 0&1&0&1&0\\ 1&0&0&0&1\\ 1&0&0&0&1 \end{bmatrix}$$

to $$\begin{bmatrix} 1&1&0&1&0\\ 0&1&1&0&0\\ 1&1&0&0&0\\ 1&0&1&0&0\\ 0&0&0&0&1\\ 0&0&0&0&1 \end{bmatrix}$$

The value of the next pivot row could be obtained as the rows of this matrix go back into storage. It is [11010]. The outer loop must reinitialize Z to $$Z=\alpha[11010]+[00001]=[10001]+[00001]=[10000].$$

The next pass through the inner loop which executes the RF() instruction on the Y register yields $$\begin{bmatrix} 0&0&0&0&1\\ 1&1&0&0&0\\ 0&0&1&0&1\\ 1&1&1&0&0\\ 0&0&0&1&0\\ 0&0&0&1&0 \end{bmatrix}$$

after resetting Z to $\alpha[11000]+[00001]=[10100]$, the next pass yields $$\begin{bmatrix} 0&0&0&1&0\\ 0&0&0&0&1\\ 0&1&0&1&0\\ 0&1&0&1&1\\ 0&0&1&0&0\\ 0&0&1&0&0 \end{bmatrix}$$

With Z arbitrary, the next pass yields $$\begin{bmatrix} 0&0&1&0&0\\ 0&0&0&1&0\\ 1&0&1&0&0\\ 1&0&1&1&0\\ 0&1&0&0&0\\ 0&1&0&0&0 \end{bmatrix}$$

After resetting Z to $\alpha[10100]+[00001]=[01100]$, the final pass yields $$\begin{bmatrix} 0&1&0&0&0\\ 0&0&1&0&0\\ 0&0&0&0&1\\ 0&0&1&0&1\\ 1&0&0&0&0\\ 1&0&0&0&0 \end{bmatrix}$$

By providing the means to select the linear or affine function depending on the value of the bit R0, this invention also provides the means to test any single bit (or any linear combination of bits) in a very few instructions. In general, when LF() is executed, the value of R0 is

| R0 | = | Y0 X0 |
|---|---|---|
|  |  | + Y1 X4 |
|  |  | + Y2 X3 |
|  |  | + Y3 X2 |
|  |  | + Y4(X1 + X4) |

Hence, to test Y3, load [00100] into the X register, execute LF() and then RF(). To test Y4, load [00010] into X and then execute LF() and RF(). Similarly, to test Y1, load [10010] into X and then execute LF() and RF().

The RF() feature proves very useful for permuting columns. For example, to permute the first and second columns in a particular row, either add or not add into that row the word [11000], depending on whether or not the sum of the first and second components are different or alike. This decision may be made by multiplying the original row by the appropriate constant (which are [11010]). Thus, the following program permutes the first and second columns of the word located at M[C0]. Here, 5-bit constants are specified explicitly in binary, preceded by the letter K:

```
                    Z = M[A];
                                        A = K11000;
                                        A = K11010;
              Y = m[A];                 A = C0;
       X = Y  Y = M[A];                 A = K00001;
LF;    X = Y; Y = M [A];
RF ( );                    V = R;       A = C0;
                           M[A] = V;
```

One skilled in the programming art is able to expand these illustrations into a very fast program for solving simultaneous linear binary equations.

The major advantages of the RF() and TV() features are that they provide great speed and program flexibility with virtually no hardware. This is accomplished by embellishing the Galois field arithmetic unit so that it accomplishes data-dependent additions, compatible with its intrinsic shifting capability.

One skilled in the art will immediately recognize that many changes could be made in the above construction and many apparently widely differing embodiments of this invention could be made without departing from the scope thereof. For example, the choice of a cyclic code other than the Reed-Solomon (31,34) code can be easily implemented; the utilization of the apparatus for encoding of data streams may be effectuated without substantial departure from the structure described: the use of shift-register sequences for memory addressing may be applied to a wider scope of operations. Accordingly, it is intended that all matter contained in the above description or shown in the accompanying drawings shall be interpreted as illustrative only and not in a limiting sense.

What is claimed is:

1. A stored program digital computer for correcting errors in cyclic encoded streams of data elements, comprising:

(a) an arithmetic unit for performing arithmetic and logical operations upon portions of said data streams to decode said portions of data streams, said arithmetic unit comprising
data memory means having addressable elements for retaining said data elements, multiplier means to supply an operand for multiplication, multiplier register means to supply another operand for multiplication, addend register means for holding an operand for addition, data memory addressng means for retrieving selected data elements to supply a selected one of said operands, Galois field logic means selectably operable upon said multiplier and multiplicand registers to generate a finite field product, and said Galois field logic means selectably operable on said addend register to form a finite field sum with said product, said data memory means adapted to also retain the results of said Galois field logic means operation and said multiplier means adapted to supply said operand selectably from the result of a prior Galois field logic operation;

(b) an address generator for developing address information for transmittal to said arithmetic unit to address the data memory of said arithmetic unit, said address generator comprising
address generator memory means having addressable elements for retaining information from which addresses are developed for said data memory of said arithmetic unit, address register means for retaining information derived from said address generator memory means, means for transferring the information content of a selected element of said address generator memory means to said address register means, means to modify the content of address register means in accord with a shift register sequence, test register means for retaining a datum and comparator means to detect equality of the content of said address register means with the content of said test register means, and (c) a control unit for controlling the sequence of operations performed by said arithmetic unit and said address generator, said control unit comprising
control memory means for storing the instructions defining the sequence of operations required for effecting corrections in said data streams, said control memory means having addressable elements and means for addressing said control memory means, said control memory addressing means adapted to sequentially address said control memory means, said sequence referenced from a selectable base address, means for selecting said base address, control register means for retaining the content of an elememt of said control memory means, said control memory element controlling the state of said computer, and means for transferring a portion of the content of said address generator in response to a signal defined by said control register content.

2. The computer of claim 1 wherein the information transfer between said control unit and said address generator comprise a first signal forming a digital datum originating from said control unit and a second signal originating from the comparator means of said address generator.

3. The computer of claim 2 wherein said means for selecting said base address is responsive to said equality condition.

4. The computer of claim 3 wherein the information transfer between said address generator and said arithmetic unit comprises a third signal for transmitting the content of said address register means to said data memory addressing means of said arithmetic unit.

5. The computer of claim 4 wherein said data memory means and said registers of said arithmetic unit and said address generator memory means and said registers of said address generator each further comprise enabling means to enable information transfer to respective memory means and register means and wherein a first plurality of control signal paths originate in said control unit for actuating said enabling means of selected said registers and memories and wherein a second plurality of control signal paths originate in said control unit for initiating said selected operations of said Galois field logic means of said arithmetic unit and for initiating modification of the content of said address register of said address generator.

6. The computer of claim 5 wherein said arithmetic unit further comprises input means for accepting said data from an external source for storage in said data memory and output means for supplying error-corrected data to an external data sink from said data memory.

7. The computer of claim 6 wherein said input means is adapted to provide a signal indicative of the incidence of input data at said input means and said output means is adapted to provide a signal indicative of the incidence of output ata at said output means, wherein said means for altering said base address is responsive to each said logic signal.

8. The computer of claim 1 wherein said arithmetic unit further comprises means for re-setting the content of said multiplier register to the square of the previous content of said register.

9. In a method of addressing a digital memory having $2^n-1$ addressable elements and having addressing means whereby the content of a selected memory element is retrieved in response to an address provided by said addressing means, the method of memory addressing comprising the steps of initializing an address register with selected digital content modifying the content of said address register in accord with a sequence characteristic of an n bit shift register of maximum period;

transferring the content of said address register to said addressing means, whereby said selected memory element to be retrieved is characterized by an address modified in accord with said shift register sequence.

10. The method of claim 9 wherein said step of modifying includes the step of incrementing said address register wherein the content of said register is shifted in an ascending sense.

11. The method of claim 10 wherein said step of modifying includes the step of decrementing said address register wherein the content of said register is shifted in a descending sense.

12. The method of claim 11 wherein the step of incrementing and the step of decrementing are commutative, whereby the content of said address register is returned to said first value as a result of an equal number of said steps of incrementing and said steps of decrementing.

13. In an information processing system comprising $2^n-1$ elements of addressable memory and addressing means for developing consecutively incremented memory addresses, the improvement wherein said addressing means comprises a feedback shift register of period $2^n-1$, said shift register comprising n bits whereby an address sequence is developed in accord with the numeric sequence developed by said feedback shift register.

14. The apparatus of claim 13 wherein said addressing means further comprises means for consecutively decrementing addresses in accord with said numeric sequence.

15. The apparatus of claim 14 wherein said memory elements comprise independent words and said numeric sequence developed said shift register is characterized by the irreducible generator polynomial of the field GF $(2^n)$.

16. The apparatus of claim 15 wherein $n=7$.

17. A stored program digital computer for correcting errors in cyclic encoded streams of data elements, comprising:

(a) an arithmetic unit for performing arithmetic and logical operations upon portions of said data streams to decode said portions of data streams, said arithmetic unit comprising data memory means having addressable elements for retaining said data elements, multiplier means to supply an operand for multiplication, multiplier register means to supply another operand for multiplication, addend register means for holding an operand for addition, data memory addressing means for retrieving selected data elements to supply a selected one of said operands, Galois field logic means selectably operable upon said multiplier and multiplicand registers to generate a finite field product, and said Galois field logic means selectably operable on said addend register to form a finite field sum with said product, said selectable operability being responsive to a portion of the operand supplied by said multiplier means, said data memory means adapted to also retain the results of said Galois field logic means operation and said multiplier means adapted to supply said operand selectably from the result of a prior Galois field logic means operation;

(b) an address generator developing address information for transmittal to said arithmetic unit to address the data memory of said arithmetic unit, said address generator comprising address generator memory means having addressable elements for retaining information from which addresses are developed for said data memory of said arithmetic unit, address register means for retaining information derived from said address generator memory means, means for transferring the information content of a selected element of said address generator memory means to said address register means, means to modify the content of address register means in accord with a shift register sequence, test register means for retaining a datum and comparator means to detect equality of the content of said address register means with the content of said test register means, and (c) a control unit for controlling the sequence of operations performed by said arithmetic unit and said address generator, said control unit comprising control memory means for storing the instructions defining the sequence of operations required for effecting corrections in said data streams, said control memory means having addressable elements and means for addressing said control memory means, said control memory addressing means adapted to sequentially address said control memory means, said sequence referenced from a selectable base address, means for selecting said base address, control register means for retaining the content of an element of said control memory means, said control memory element controlling the state of said computer, and means for transferring a portion of the content of said address generator in response to a signal defined by said control register content.

* * * * *